(12) United States Patent
Oomori et al.

(10) Patent No.: US 7,646,209 B2
(45) Date of Patent: Jan. 12, 2010

(54) SEMICONDUCTOR INTEGRATED CIRCUIT AND METHOD OF PRODUCTION OF SAME

(75) Inventors: Mitsuhiro Oomori, Tokyo (JP); Tomofumi Arakawa, Tokyo (JP)

(73) Assignee: Sony Corporation, Tokyo (JP)

( * ) Notice: Subject to any disclaimer, the term of this patent is extended or adjusted under 35 U.S.C. 154(b) by 556 days.

(21) Appl. No.: 11/482,808

(22) Filed: Jul. 10, 2006

(65) Prior Publication Data

US 2007/0234137 A1 Oct. 4, 2007

(30) Foreign Application Priority Data

Jul. 12, 2005 (JP) .............................. 2005-202818

(51) Int. Cl.
*H03K 19/003* (2006.01)
*H03K 19/007* (2006.01)
(52) U.S. Cl. .............................. 326/10; 326/9; 326/11; 326/12; 326/13; 326/14
(58) Field of Classification Search ................ 326/9–15
See application file for complete search history.

(56) References Cited

U.S. PATENT DOCUMENTS 6,426,650 B1 * 7/2002 Dufour et al. ................. 326/47

2004/0075461 A1 * 4/2004 Nicolaidis .................... 326/10

FOREIGN PATENT DOCUMENTS

| JP | 3192220 A | 5/2001 |
|----|-----------|--------|
| JP | 3491579 A | 11/2003 |

* cited by examiner

*Primary Examiner*—Vibol Tan
*Assistant Examiner*—Matthew C Tabler
(74) *Attorney, Agent, or Firm*—Rader, Fishman & Grauer PLLC

(57) ABSTRACT

A semiconductor integrated circuit, able to repair a fault and normally operate as an overall circuit even when a fault occurs in a portion of the circuit, and able to reduce a change of signal delay along with the repair of the fault, including N (larger than 2) number of circuit modules which can replace each other's functions; circuit blocks each including R (larger than 1 but smaller than N) number of I/O units for outputting at least one signal to one circuit module, and receiving at least one signal generated in the one circuit module; and a circuit module selection unit configured to select R number of circuit modules from among the N number of circuit modules in response to a control signal, connect the selected R number of circuit modules and R number of I/O units of the circuit block in a 1:1 correspondence, and connect one circuit module selected from at least two circuit modules in response to the control signal to each of the R number of I/O units, and a method of producing the same.

27 Claims, 40 Drawing Sheets

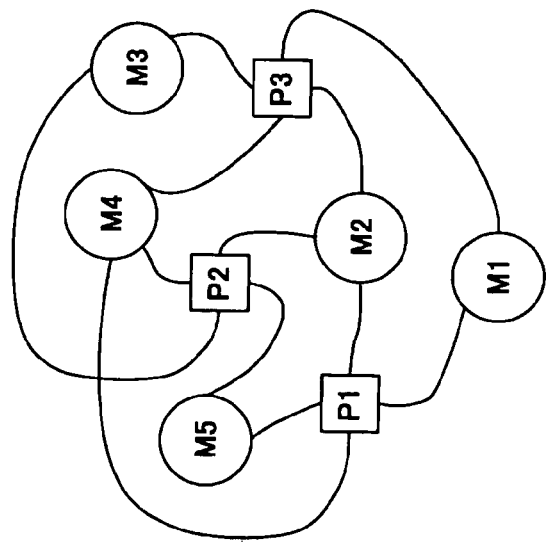
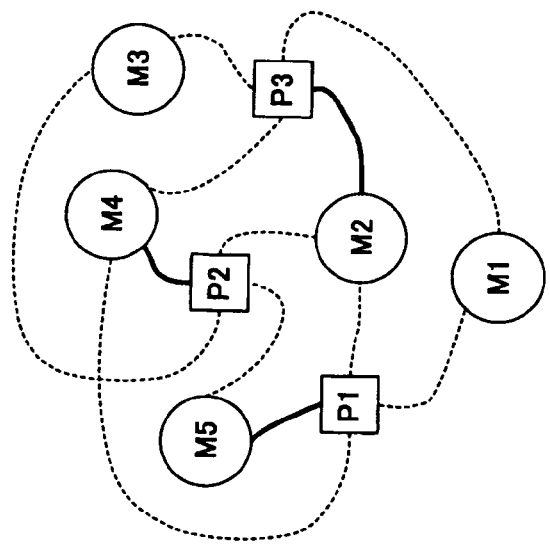
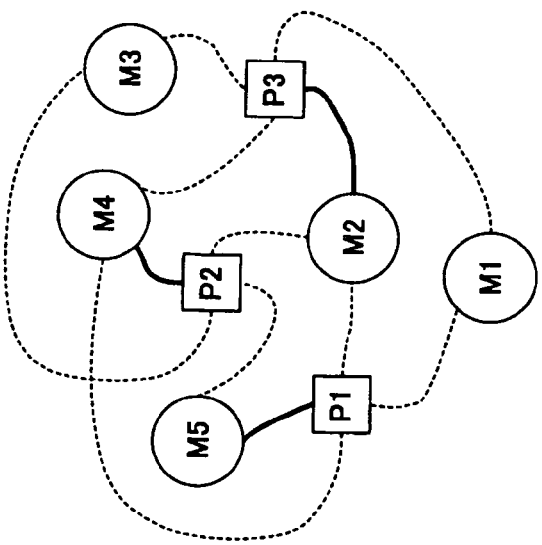
FIG. 14C
FIG. 14B
FIG. 14A

PS_i    i = 1,···,32

PS33

SEMICONDUCTOR INTEGRATED CIRCUIT AND METHOD OF PRODUCTION OF SAME

CROSS REFERENCE TO RELATED APPLICATION

The present invention contains subject matter related to Japanese Patent Application No. 2005-202818 filed in the Japan Patent Office on Jul. 12, 2006, the entire contents of which being incorporated herein by reference.

BACKGROUND OF THE INVENTION

1. Field of Invention

The present invention relates to a semiconductor integrated circuit having a plurality of circuit modules which can replace each other's functions and a method of production of the same, more particularly relates to a semiconductor integrated circuit reducing the drop in yield due to faults of circuit modules.

2. Description of the Related Art

In recent semiconductor integrated circuits, the processing dimensions are becoming increasingly finer the circuit configurations are becoming increasingly larger in scale. The drop in yield due to faults in production has become serious. Therefore, the technique of previously providing redundant circuits at parts of the overall circuit and replacing faulty portions by these redundant circuits to thereby prevent the entire semiconductor chip from being discarded as a defective product has been proposed.

In the method of generation of logical circuit data of a field programmable gate array (FPGA) disclosed in, for example, Japanese Patent No. 3491579, the need for avoiding faults is judged from fault information and logic information and, if necessary, the logic information is changed so that the function of any faulty portion is replaced by an empty portion.

In the above FPGA, where a basic unit of configuration of the logic circuit, that is, a basic cell, fails, the interconnect route is changed so as to bypass it. Detour interconnects for avoiding faults differ in accordance with the state of occurrence of the faults. It is difficult to predict in advance how the interconnect route will changed. For this reason, it is difficult to set a clear delay margin that can satisfy the desired delay conditions no matter which of the basic cells fails, so it is necessary to set a considerably large margin considering the possibility that the delay characteristic will remarkably degrade.

Further, in the semiconductor device disclosed in Japanese Patent No. 3192220, data is transferred among a plurality of circuit modules by memory map type addressing. ID codes are assigned to circuit modules. By changing the ID codes to control the destination of data, a faulty circuit module can be replaced by a redundant circuit module.

In this semiconductor device, how long the data transfer distance between circuit modules becomes may greatly vary in accordance with the state of occurrence of the faults, therefore it is necessary to prescribe the operation of each circuit module by envisioning the case where all circuit modules are separated from each other to the maximum limit. Accordingly, it is necessary to set a considerably large delay margin at the time of design and it is hard to optimize the performance of the entire system.

SUMMARY OF THE INVENTION

It is therefore desirable in present invention to provide a semiconductor integrated circuit able to make the overall circuit normally operate by repairing any fault occurring in a part of the circuit and, at the same time, able to reduce the change of the signal delay accompanying the repair of faults and a method of production of the same.

According to a first embodiment of the in invention, there is provided a semiconductor integrated circuit having N (N indicates an integer of $N \geqq 2$) number of circuit modules which can replace each other's functions; circuit blocks each having R (R indicates an integer of $1 \leqq R<N$) number of input/output units for outputting at least one signal to one circuit module and receiving as input at least one signal generated in that one circuit module; and a circuit module selection unit configured to select R number of circuit modules from among the N number of circuit modules in response to a control signal, connecting the selected R number of circuit modules and R number of input/output units of the circuit block in a one-to-one correspondence, and connect one circuit module selected in response to the control signal from at least two circuit modules to each of the R number of input/output units.

Preferably, the circuit includes a control unit comprised for generating the control signal of the circuit module selection unit so that a faulty circuit module among the N number of circuit modules is disconnected from the R number of input/output units.

According to the above configuration, it becomes possible to arrange two or more circuit modules connected to the same input/output unit so that a difference of distances from this input/output unit becomes small. When the difference of distances between the input/output unit and the circuit modules becomes small, the difference of lengths of interconnects connecting the two becomes small, therefore the change of the signal delay occurring when the connection between a circuit module and the input/output unit is switched along with repair etc. of a fault becomes small.

The semiconductor integrated circuit may include a storage unit for storing a signal designating (N−R) number of circuit modules which should be disconnected from the R number of input/output units. In this case, the control unit may generate the control signal in accordance with the signal stored in the storage unit.

Further, the semiconductor integrated circuit may include a signal input unit for receiving as input a signal designating (N−R) number of circuit modules which should be disconnected from the R number of input/output units. In this case, the control unit may generate the control signal in accordance with the signal input to the signal input unit.

When both of the storage unit and the signal input unit are provided, the control unit may generate the control signal in accordance with the signal input to the signal input unit where a signal having a predetermined initial value is stored in the storage unit and generate the control signal in accordance with the signal stored in the storage unit where a signal having a value different from the initial value is stored in the storage unit.

The R number of input/output units may include R number of input/output units from a first input/output unit to an R-th input/output unit. The N number of circuit modules may include (R+1) circuit modules from a first circuit module to an (R+1)th circuit module. The circuit module selection unit may select one of an i-th circuit module (i indicates an integer of $1 \leqq i \leqq R$) or an (i+1)th circuit module in response to the control signal and connect the selected circuit module to the i-th input/output unit. In this case, the R number of input/output units may be arranged in numerical order at equal intervals, and the i-th circuit module and the (i+1)th circuit module may be arranged at positions so that the distances from the i-th input/output unit become equal.

Combinations of at least two circuit modules which can be connected to each of the R number of input/output units via (through-hole) the circuit module selection unit may be determined so that a maximum value of delays of all signal paths connecting the R number of input/output units and the N number of circuit modules via (through-hole) the circuit module selection unit becomes the smallest. Alternatively, it may be determined so that a sum of delays of all signal paths connecting the R number of input/output units and the N number of circuit modules via (through-hole) the circuit module selection unit becomes the smallest. Alternatively, it may be determined so that a sum of delays of all of the signal paths becomes the smallest within a range where the maximum value of delays of all signal paths connecting the R number of input/output units and the N number of circuit modules via (through-hole) the circuit module selection unit does not exceed a predetermined upper limit value.

Preferably, in the circuit block and the circuit module selection unit, the interval of interconnects belonging to the same interconnect layer is wider in comparison with the N number of circuit modules. Further, preferably, in the circuit block and the circuit module selection unit, the number of vias (through-hole) used for connecting interconnects belonging to different interconnect layers is larger in comparison with the N number of circuit modules. Due to this, the probability of occurrence of faults of the circuit block and the circuit module selection unit is reduced, and the yield is improved.

The N number of circuit modules may have a higher density of circuit elements per unit area in comparison with the circuit block and the circuit module selection unit. Due to this, the area of the circuit becomes smaller.

The semiconductor integrated circuit may have N number of power supply switch circuits each of which is inserted in a power supply line of each of the N number of circuit modules and shutting off the supply of the power to (N−R) number of circuit modules not connected to the R number of input/output units in a one-to-one correspondence in response to the control signal. Due to this, wasteful consumption of power in unused circuit modules is reduced. Further, by disconnecting a faulty circuit module from the power supply system, the yield is improved.

According to a second embodiment of the present invention, there is provided a semiconductor integrated circuit including a plurality of circuit module blocks each including at least three circuit modules; circuit blocks each having a plurality of input/output units configured to output at least one signal to one circuit module and receiving as input at least one signal generated in the one circuit module; and a circuit module selection unit configured to select R (R indicates an integer of $1 \leq R < N$) number of circuit modules from among N (N indicates an integer of $N \geq 2$) number of circuit modules included in each circuit module block in response to the input control signal, connect the selected R number of circuit modules and R number of input/output units of the circuit block in a one-to-one correspondence, and connect one circuit module selected from at least two circuit modules in response to the control signal to each of a plurality of input/output units of the circuit block. Circuit modules included in the same circuit module block can replace each other's functions. Preferably, the circuit has a control unit configured to generate the control signal of the circuit module selection unit so that any faulty circuit module among the N number of circuit modules included in the circuit module block is disconnected from the R number of input/output units.

According to the above configuration, it becomes possible to arrange two or more circuit modules connected to the same input/output unit so that the difference of distances from the input/output unit becomes small. Further, it becomes possible to repair the faults of a plurality of types of circuit modules.

The entire set of circuit modules included in the plurality of circuit module blocks may include a plurality of partial sets each of which is configured by a plurality of circuit modules and has no dealings with the others. In this case, when a circuit module belonging to a partial set is disconnected from an input/output unit, the control unit may generate the control signal so as to disconnect all other circuit modules belonging to the same partial set as the disconnected circuit module from the input/output unit. Due to this, the circuit configuration becomes simpler in comparison with the case where the control signal is generated in the control unit so as to disconnect individual circuit modules from the input/output units.

The semiconductor integrated circuit may have a plurality of power supply switch circuits each of which is inserted in the power supply line of each of the plurality of partial sets and shut off the supply of the power to the partial set disconnected from the input/output units. Due to this, wasted consumption of power in the unused circuit modules is reduced. Further, by disconnecting a faulty circuit module from the power supply system, the yield is improved. The circuit configuration becomes simpler in comparison with the case where the power supply switch circuits are inserted into the power supply lines of individual circuit modules.

The semiconductor integrated circuit may have a circuit module commonly used by a plurality of circuit module blocks. This circuit module is preferably provided with a function of encompassing all or part of the functions of the other circuit modules included in the plurality of circuit module blocks. Due to this, it becomes possible to replace the redundant circuit provided for each circuit module block by the commonly used circuit module.

According to a third embodiment of the present invention, there is provided a method of producing a semiconductor integrated circuit comprising a first step, a second step, a third step, and a fourth step.

The first step comprises forming, on a semiconductor substrate, a circuit having N (N indicates an integer of $N \geq 2$) number of circuit modules which can replace each other's functions, circuit blocks each having R (R indicates an integer of $1 \leq R < N$) input/output units for outputting at least one signal to one circuit module and receiving as input at least one signal generated in the one circuit module, a circuit module selection unit configured to select R number of circuit modules from among the N number of circuit modules in response to the input control signal and connect the selected R number of circuit modules and R number of input/output units of the circuit block in a one-to-one correspondence, a storage unit for storing a signal having a predetermined initial value, a signal input unit for receiving as input a signal designating (N−R) number of circuit modules which should be disconnected from the R number of input/output units, and a control unit configured to generate the control signal in accordance with a signal input to the signal input unit when the signal having the initial value is stored in the storage unit and generate the control signal in accordance with the signal stored in the storage unit when a signal having a value different from the initial value is stored in the storage unit.

The second step comprises inputting a signal designating (N−R) number of circuit modules to the signal input unit and inspecting the R number of circuit modules connected to the R number of input/output units in accordance with the input signal.

The third step comprises inputting a signal designating a new (N−R) number of circuit modules including a faulty circuit module to the signal input unit and again performs the inspection of the second step when a faulty circuit module is detected in the inspection of the second step.

The fourth step comprises determining a signal designating the (N−R) number of circuit modules which should be disconnected from the R number of input/output units and writing it into the storage unit in accordance with a signal input to the signal input unit when a faulty circuit module is not detected in the inspection of the second step.

According to the present invention, a plurality of circuit modules connected to the same input/output unit can be arranged so that the difference of distances from the input/output unit becomes small, therefore the change of the signal delay occurring when connection between the input/output unit and a circuit module is switched along with fault repair can be made smaller.

BRIEF DESCRIPTION OF THE DRAWINGS

These and other objects and features of the present invention will become clearer from the following description of the preferred embodiments given with reference to the attached drawings, wherein:

FIGS. 14A to 14C are diagrams showing a second example of the configuration of the semiconductor integrated circuit according to the eighth embodiment of the present invention;

DESCRIPTION OF THE PREFERRED EMBODIMENTS

First Embodiment

Figure 1A:
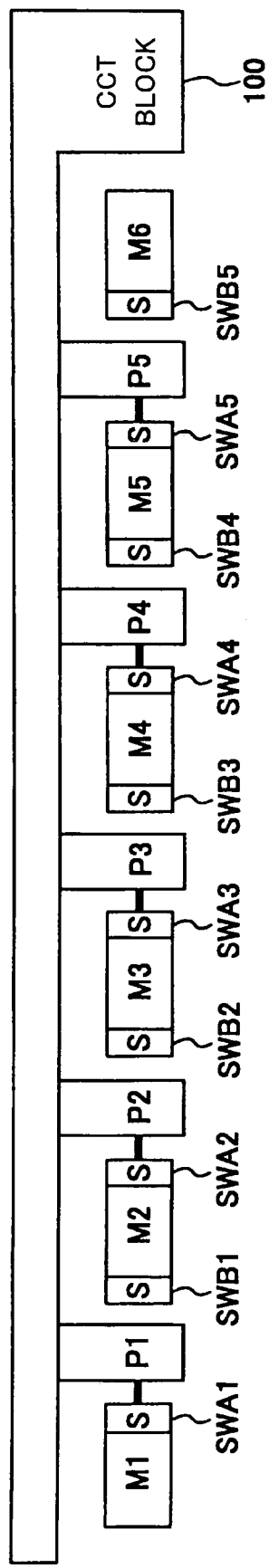
FIGS. 1A and 1B are diagrams showing an example of the configuration of a semiconductor integrated circuit according to a first embodiment of the present invention.

FIG. 1 is a diagram showing an example of the configuration of a semiconductor integrated circuit according to a first embodiment of the present invention. The semiconductor integrated circuit according to the first embodiment, for example as shown in FIG. 1A, has circuit modules M1 to M6, a general circuit block 100, switch circuits SWA1 to SWA5, and switch circuits SWB1 to SWB5.

Each of the circuit modules M1 to M6 is a circuit module. The general circuit block 100 is a circuit block. The circuit including the switch circuits SWA1 to SWA5 and SWB1 to SWB5. The switch circuits SWA1 to SWA5 are a first switch group of switches. The switch circuits SWB1 to SWB5 are a second switch group of switches.

Each of the circuit modules M1 to M6 is a group of circuits having a predetermined function. They can replace each other's functions. All of the circuit modules M1 to M6 may have the same circuit configuration or some circuit modules may have partially different circuit configurations if they can replace each other's functions.

The circuit modules M1 to M6 may have any circuit configurations and functions. For example, they may be digital signal processors (DSP) or other circuits having operation/processing functions or may be circuits performing relatively simple logic operations such as LookUp Tables. Alternatively, the plurality of circuits having equivalent functions included in the semiconductor integrated circuit may be handled as one circuit module. Further, the circuit modules M1 to M6 are not limited to digital circuits, but may be analog circuits.

The general circuit block 100 has input/output units P1 to P5 for exchanging signals with the above circuit modules M1 to M6 and executes predetermined processing in cooperation with these circuit modules. The general circuit block 100 may have any circuit configuration and function and may be for example only interconnects.

Each of the input/output units P1 to P5 outputs at least one signal to one circuit module among the above circuit modules M1 to M6 and, at the same time, receives as input at least one signal generated in one circuit module.

All of the input/output units P1 to P5 may input/output the same combinations of signals or some input/output units may be different types inputting/outputting different combinations of signals. For example, when the circuit modules M1 to M6 have three output terminals, an input/output unit for receiving as input signals from all of these three output terminals, an input/output unit for receiving as input the signal from only one output terminal, and so on may be mixed.

A switch circuit SWAi (i indicates an integer from 1 to 5, same true below in the present embodiment) is connected between an input/output unit Pi and a circuit module Mi and turns on or off in response to the input control signal (not shown). A switch circuit SWBi is connected between the input/output unit Pi and a circuit module M(i+1) and turns on or off in response to the input control signal.

The switch circuits SWA1 to SWA5 and SWB1 to SWB5 configure a circuit module selection unit. The circuit module selection unit (SWA1 to SWA5 and SWB1 to SWB5) is a circuit for selecting five circuit modules from among six circuit modules (M1 to M6) in response to a control signal and connecting the selected five circuit modules and five input/output units (P1 to P5) in a one-to-one correspondence.

The circuit module selection unit (SWA1 to SWA5 and SWB1 to SWB5) connects one circuit module selected from two circuit modules in response to a control signal to each of the five input/output units (P1 to P5). Namely, this selects one of the circuit module Mi or the circuit module M(i+1) in response to the input control signal and connects the selected circuit module to the input/output unit Pi.

The circuit module selection unit (SWA1 to SWA5 and SWB1 to SWB5) selects five circuit modules so that a faulty circuit module (when there is no fault, the circuit module previously provided for redundancy) among the six circuit modules is disconnected from all input/output units in response to a control signal supplied from for example a not shown control unit.

For example, in the case where a control signal designating the disconnection of a circuit module Mn (n indicates an integer from 1 to 6, same true below in the present embodiment) from all input/output units is input, when n is an integer from 2 to 5 (that is, a case where the circuit modules M2 to M5 are to be disconnected), the switch circuits SWA1 to SWA(n−1) are turned on and the switch circuits SWAn to SWA5 are turned off and, at the same time, the switch circuits SWB1 to SWB(n−1) are turned off and the switch circuits SWBn to SWB5 are turned on. When n is the integer 1 (that is, when the circuit module M1 is to be disconnected), all of the switch circuits SWA1 to SWA5 turn off, and all of the switch circuits SWB1 to SWB5 turn on. When n is the integer 6 (that is, when the circuit module M6 is to be disconnected), all of the switch circuits SWA1 to SWA5 turn on, and all of the switch circuits SWB1 to SWB5 turn off.

Figure 1B:
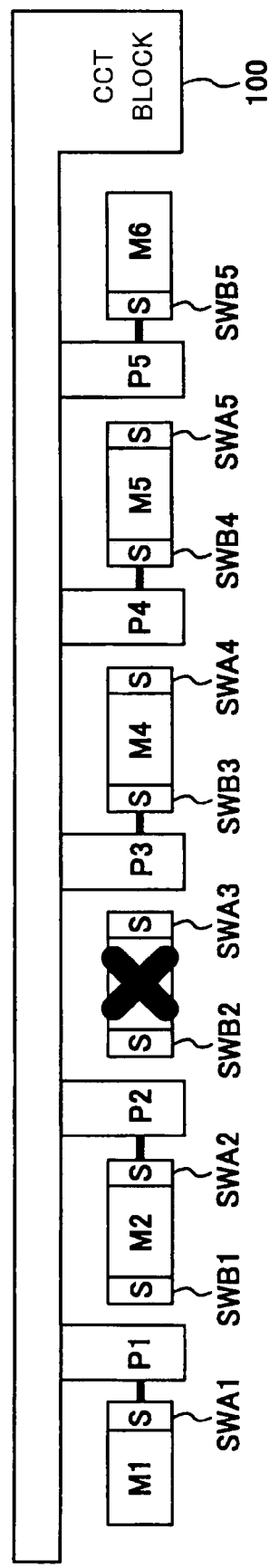

FIG. 1B shows a connection state of a case where a fault occurs in the circuit module M3. In this case, a not shown control unit generates a control signal so as to disconnect the circuit module M3 from all input/output units. In response to this control signal, the switch circuits SWA1 and SWA2 turn on, the switch circuits SWA3, SWA4, and SWA5 turn off, the switch circuits SWB1 and SWB2 turn off, and the switch circuits SWB3, SWB4, and SWB5 turn on. Due to this, the input/output unit P1 and module M1, the input/output unit P2 and module M2, the input/output unit P3 and module M4, the input/output unit P4 and module M5, the input/output unit P5 and module M6 are connected, and the module M3 is disconnected from the general circuit block 100.

According to the semiconductor integrated circuit shown in FIGS. 1A and 1B, five circuit modules selected from among six circuit modules (M1 to M6), and five input/output units (P1 to P5) provided in the general circuit block 100 are connected in a one-to-one correspondence. Further, one circuit module selected from two circuit modules is connected to each of the five input/output units (P1 to P5). Due to this, it becomes possible to arrange two circuit modules (Mi, M(i+1)) connected to the same input/output unit Pi so that the difference of distances from the input/output unit Pi becomes small. For example, as shown in FIGS. 1A and 1B, by arranging five input/output units (P1 to P5) in numerical order (that is in the order of P1, . . . , P5) at equal intervals, two circuit modules (Mi, M(i+1)) can be arranged so that the distances from the input/output unit Pi become equal to each other. By reducing the difference of distances between the input/output unit and circuit modules, the difference of lengths of interconnects connecting the two can be made small. Accordingly, the change of the signal delay occurring when switching the connection between a circuit module and an input/output unit along with fault repair can be made small.

To what degree a change of the signal delay due to fault repair become can be correctly predicted based on the positional relationships between the circuit modules Mi and M(i+1) and the input/output unit Pi, therefore, in comparison with a case where correct prediction is difficult as in for example the previously explained Japanese Patent No. 3491579, it becomes possible to estimate the delay margin as small and realize a circuit operating at a higher speed.

According to the semiconductor integrated circuit shown in FIG. 1, fault repair can be carried out according to a simple circuit configuration of selecting one of two circuit modules and connecting it to one input/output unit, therefore an increase of circuits and excess power consumption can be kept to the lowest limit. For the switch circuit and control unit used for switching the connection and the storage unit for holding fault information, use can be made of circuits which can be designed and produced according to a conventional general method, therefore an increase of cost due to the provision of the fault repair function can be kept very small.

It is not necessary to add any circuit for fault repair to the general circuit block 100, therefore it becomes possible to use conventional circuits as they are the design load due to the provision of the fault repair function can be lightened.

Note that in the semiconductor integrated circuit shown in FIG. 1, five input/output units (P1 to P5) are arranged on a straight line, but these may also be arranged on for example a curve or a meandering line or arranged in a zigzag manner. On any line, so far as the input/output units P1 to P5 are arranged in numerical order at equal intervals, it is possible to arrange two circuit modules (Mi, M(i+1)) so that the distances from the input/output unit Pi become equal to each other.

Second Embodiment

Next, a second embodiment of the present invention will be explained.

In the semiconductor integrated circuit according to the first embodiment, the portion designed for fault repair (circuit modules M1 to M6) and the portion not designed for fault repair (general circuit block 100) were separated. When a fault occurred in the portion not designed for fault repair, the entire circuit had to be discarded, therefore, in this portion, desirably the fault rate is lowered as much as possible. Therefore, in the semiconductor integrated circuit according to the second embodiment, the "design for manufacturing" (DFM) or other technique is used to ensure that the portion not designed for fault repair (general circuit block 100) becomes more resistant to faults in comparison with the portion designed for fault repair (circuit modules M1 to M6).

For example, in the general circuit block 100, the interconnect patterns are formed so that the interval between interconnects belonging to the same interconnect layer becomes greater in comparison with the circuit modules M1 to M6. Due to this, the probability of occurrence of a fault due to the short-circuiting of interconnects can be reduced.

In the general circuit block 100, the number of vias (through-hole) used for connecting the interconnects belonging to the different interconnect layers may be increased in comparison with the circuit modules M1 to M6. For example, interconnects usually connected by one via (through-hole) are connected by two vias (through-hole). Due to this, the probability of occurrence of faults due to insufficient vias (through-hole) can be reduced.

Conversely, in the circuit modules M1 to M6, the density of circuit elements per unit area may be raised in comparison with the general circuit block 100. When the density of the circuit elements becomes high, the probability of occurrence of faults becomes high, but in the circuit modules M1 to M6, effects of fault repair can be expected, therefore, if within a suitable range, there is not that great influence upon the yield even when faults occur slightly easier. Accordingly, by raising the density of circuit elements in the circuit modules M1 to M6, a reduction of area and an increase in performance of the overall circuit can be achieved without a great influence upon the yield.

The switch circuits (SWA1 to SWA5 and SWB1 to SWB5) configuring the circuit module selection unit may be included in the portion designed for fault repair or may be included in the portion not designed for fault repair. When the switch circuits (SWA1 to SWA5, SWB1 to SWB5) are included in the portion not designed for fault repair, the same countermeasure as that for the general circuit block 100 is applied to these switch circuits. Namely, a countermeasure for forming the interconnect patterns so that the interval between interconnects belonging to the same interconnect layer becomes broader in comparison with the circuit modules M1 to M6, a countermeasure for connecting interconnects by using a larger number of vias (through-hole) in comparison with circuit modules M1 to M6, etc. are applied. Due to this, the reduction of the yield due to a fault of the switch circuit can be suppressed.

On the other hand, when the switch circuits (SWA1 to SWA5 and SWB1 to SWB5) are included in the portion not designed for fault repair, the probability of occurrence of a fault becomes higher in comparison with the case where the above countermeasure is carried out. As the case where a fault of the switch circuit exerts an influence upon the overall circuit, for example, there can be explained a case where the switch circuit provided in the path for receiving as input a signal to the general circuit block 100 fails due to a short-circuit and a signal having a constant voltage is continuously input to the general circuit block 100 from this failed switch circuit. If the a fault does not occur frequently, the pitch between interconnects and number of vias (through-hole) can be reduced by including the switch circuits (SWA1 to SWA5, SWB1 to SWB5) in the portion not designed for fault repair, therefore the merit that the area of the circuit can be reduced is obtained.

When the switch circuits (SWA1 to SWA5 and SWB1 to SWB5) are included in the portion designed for fault repair, for example, as shown in FIG. 1, it can also be regarded that the switch circuits belong to the individual circuit modules. Namely, it can also be regarded that a switch circuit SWAj and a switch circuit SWB(j−1) belong to a circuit module Mj (j indicates an integer from 2 to 5, same true below in the present embodiment), a switch circuit SWA1 belongs to the circuit module M1, and a switch circuit SWB5 belongs to the circuit module M6. In this case, the layout and interconnects may be designed by regarding the circuit modules M1 to M6 to which the switch circuits belong as one unit of configuration.

Figure 2A:
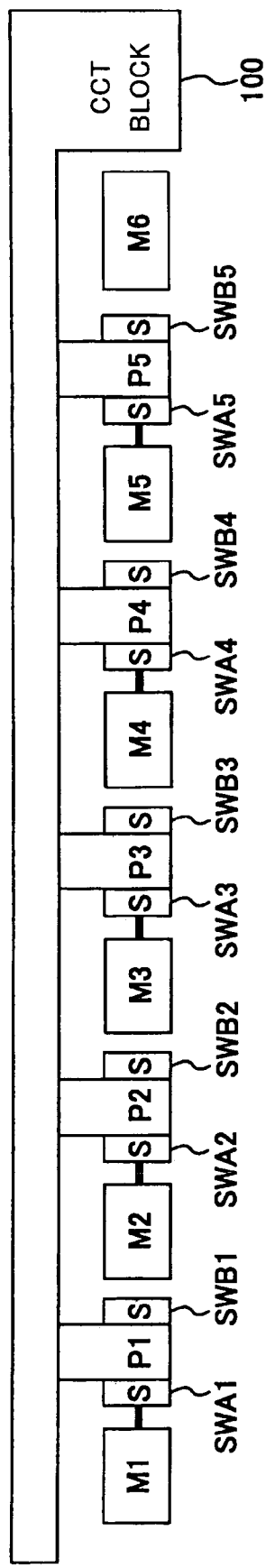
FIGS. 2A and 2B are diagrams showing an example of a case where a switch circuit is regarded as belonging to an input/output unit in the semiconductor integrated circuit shown in FIGS. 1A and 1B.
Figure 2B:
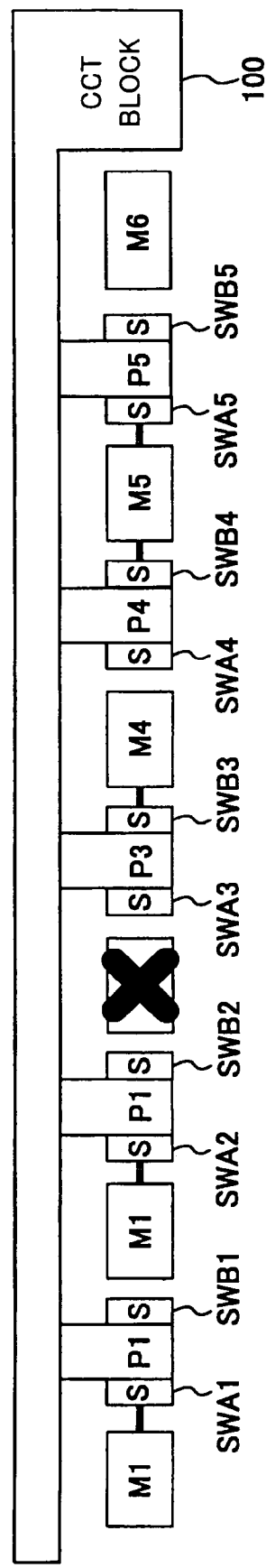

When the switch circuits (SWA1 to SWA5 and SWB1 to SWB5) are included in the portion not designed for fault repair, for example, as shown in FIGS. 2A and 2B, it may be regarded that the switch circuits belong to individual input/output units. Namely, it may be regarded that a switch circuit SWAi and a switch circuit SWBi belong to an input/output unit Pi (i indicates an integer from 1 to 5, same true below in the present embodiment). In this case, the layout and interconnects may be designed by regarding the input/output units to which the switch circuits belong as one unit of configuration.

Third Embodiment

Next, a third embodiment of the present invention will be explained.

In the semiconductor integrated circuit according to the first embodiment, the circuit modules M1 to M6 can replace each other's functions, but it is not necessary that all of these circuit modules have the same functions. Even in a case where part of the plurality of circuit modules have upward compatibility with respect to another part, replacement of functions among circuit modules is possible.

For example, assume that there are circuit modules having a first function and circuit modules having a second function encompassing this first function. In this case, the circuit modules having the second function can replace all functions of the circuit modules having the first function. On the other hand, the circuit modules having the first function cannot replace all functions of the circuit modules having the second function, but can replace part of the functions. In this way, in the present specification, when it is described that "the circuit modules can replace each other's functions", it includes not only a case where circuit modules can replace all functions of other circuit modules, but also a case where the circuit modules can replace part of the functions of other circuit modules.

Figure 3A:
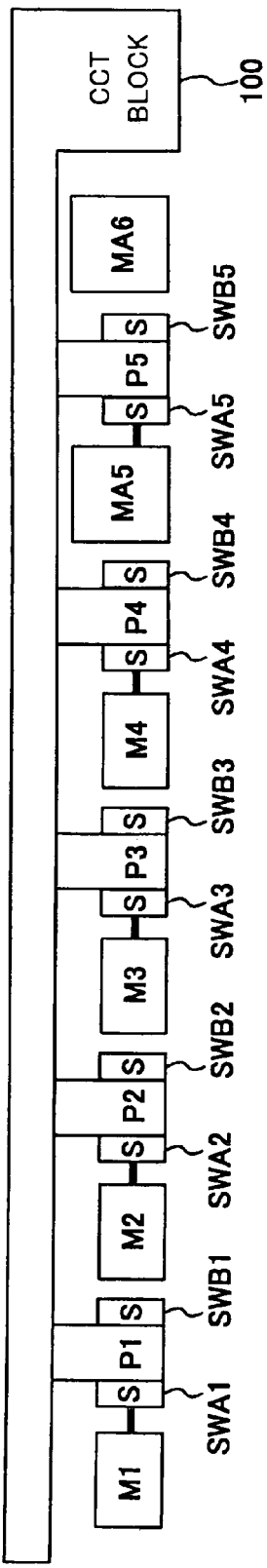
FIGS. 3A to 3C are diagrams showing an example of the configuration of a semiconductor integrated circuit according to a third embodiment of the present invention.
Figure 3B:
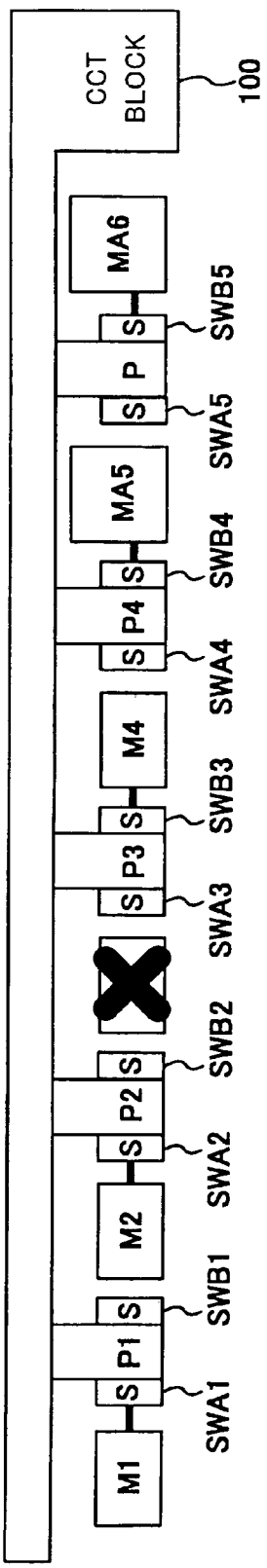
Figure 3C:
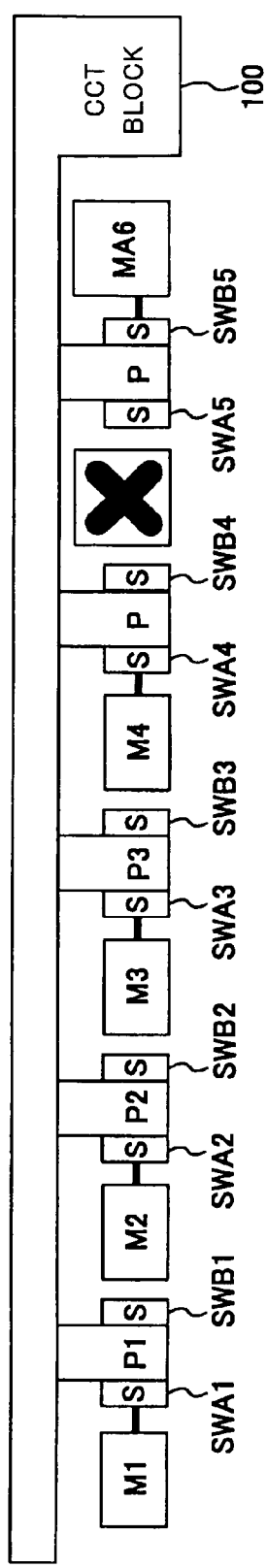

FIGS. 3A to 3C are diagrams showing an example of the configuration of the semiconductor integrated circuit according to the third embodiment. The semiconductor integrated circuit shown in FIGS. 3A to 3C is obtained by replacing the circuit modules M5 and M6 in the semiconductor integrated circuit shown in FIGS. 1A and 1B by circuit modules MA5 and MA6 having the upward compatibility with respect to the circuit modules M1 to M4.

The circuit modules MA5 and MA6 have upward compatibility with respect to the circuit modules M1 to M4, therefore if a there a fault arises in the latter circuit module, the fault can be repaired by replacing this by the former circuit module.

When all circuit modules normally operate (FIG. 3A), the circuit module M4 is connected to the input/output unit P4, and the circuit module MA5 is connected to the input/output unit P5. When there is a fault in the circuit module M3 (FIG. 3B), the circuit module MA5 is connected to the input/output unit P4, and the circuit module MA6 is connected to the input/output unit P5. The circuit module MA5 has upward compatibility with respect to the circuit module M4, therefore the circuit module MA5 connected to the input/output unit P4 can provide a function equivalent to that of the circuit module M4 to the general circuit block 100. When there is a fault in the circuit module MA5 (FIG. 3C), the circuit module MA6 having a function equivalent to that of the circuit module MA5 is connected to the input/output unit P5.

In this way, in the semiconductor integrated circuit shown in FIGS. 3A to 3C, the partial high function circuit modules (MA5, MA6) have upward compatibility with respect to the other partial low function circuit modules (M1 to M4). The number of high function circuit modules is larger than the number of input/output units connected to them, therefore a portion of the high function circuit modules becomes redundant. The faults of two types of circuit modules (high function, low function) can therefore be repaired by utilizing redundant high function circuit modules. Due to this, it becomes unnecessary to specially provide redundant low function circuit modules in order to repair low function circuit modules, therefore the increase of the circuit area can be suppressed.

Fourth Embodiment

Next, a fourth embodiment of the present invention will be explained.

Figure 4A:
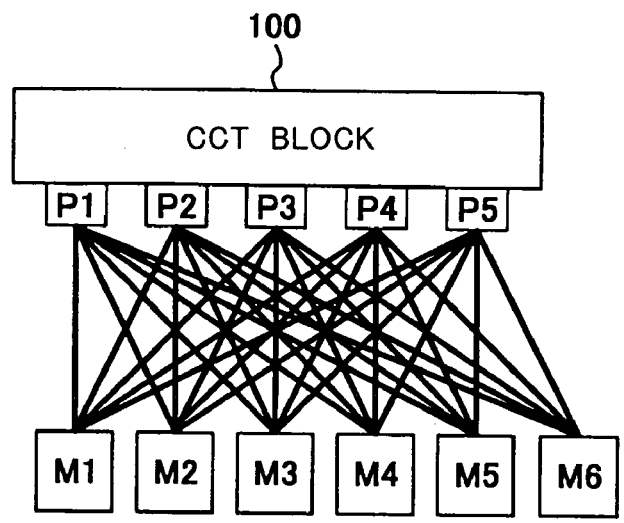
FIGS. 4A to 4C are diagrams showing an example of the configuration of a semiconductor integrated circuit according to a fourth embodiment of the present invention.
Figure 4B:
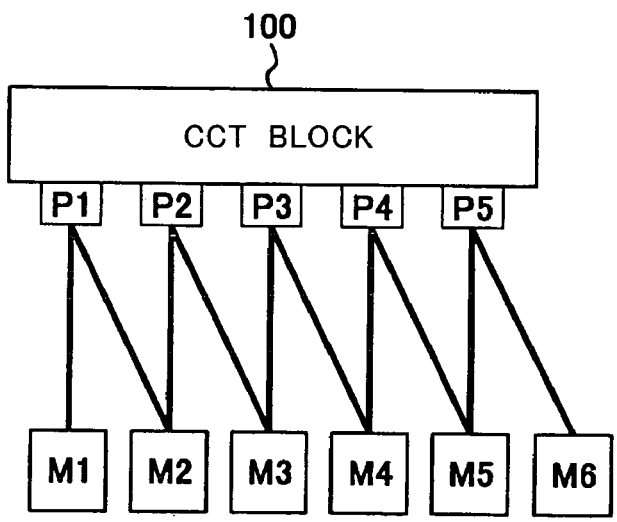
Figure 4C:
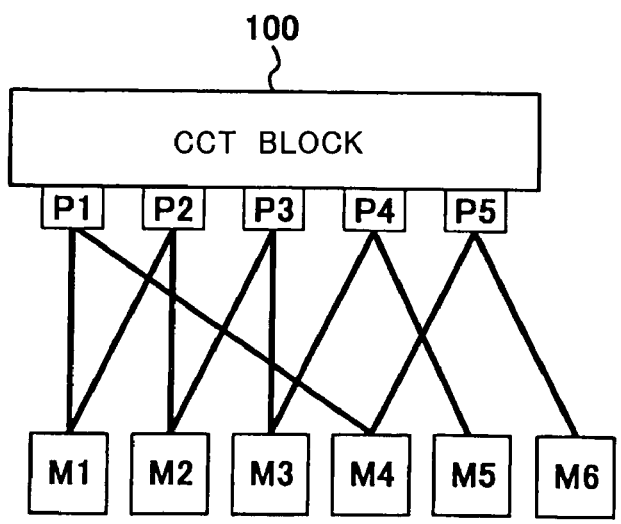

FIG. 4A is a diagram showing all connection paths between five input/output units (P1 to P5) and six circuit modules (M1 to M6). A combination of connection paths satisfying the condition that one of two circuit modules is selectively connected with respect to one input/output unit and any five circuit modules selected from among six circuit modules (M1 to M6) and five input/output units (P1 to P5) are connected in a one-to-one correspondence among all connection paths as shown in FIG. 4A will be called a "connection set" in the present embodiment. A connection set can be unambiguously designated by the combination of two circuit modules which can be connected to each of six input/output units. There are a plurality of these connection sets. FIG. 4B and FIG. 4C illustrate two among these.

The semiconductor integrated circuit shown in FIG. 4B has the same connection set as that of the semiconductor integrated circuit shown in FIGS. 1A and 1B. Namely, one of the circuit modules Mi and M(i+1) is selectively connected with respect to the input/output unit Pi (i indicates an integer from 1 to 5, same true below in the present embodiment).

On the other hand, in the semiconductor integrated circuit shown in FIG. 4C, the circuit module M4 or M6 is connected to the input/output unit P5, the circuit module M4 or M1 is connected to the input/output unit Pi, the circuit module M1 or M2 is connected to the input/output unit P2, the circuit module M2 or M3 is connected to the input/output unit P3, and the circuit module M3 or M5 is connected to the input/output unit P4.

The semiconductor integrated circuit according to the fourth embodiment employs a connection set selected among a plurality of connection sets existing in this way so that the change of the electric characteristics along with connection switching becomes as small as possible.

The connection set should be determined so that the maximum value of delays of all signal paths connecting five input/output units (P1 to P5) and six circuit modules (M1 to M6) via (through-hole) the circuit module selection unit (SWA1 to SWA5 and SWB1 to SWB5) becomes the smallest.

The connection set should be determined so that the sum of delays of these signal paths connecting five input/output units (P1 to P5) and six circuit modules (M1 to M6) via (through-hole) the circuit module selection unit (SWA1 to SWA5 and SWB1 to SWB5) becomes the smallest.

The connection set may be determined so that the sum of delays of all signal paths becomes the smallest within a range where the maximum value of delays of all signal paths connecting five input/output units (P1 to P5) and six circuit modules (M1 to M6) via (through-hole) the circuit module selection unit (SWA1 to SWA5 and SWB1 to SWB5) does not exceed the upper limit.

By selecting the connection set so that the change of electric characteristics (particularly signal delay) along with connection switching becomes as small as possible in this way, the change of the performance of the overall circuit along with fault repair can be kept small, therefore a semiconductor integrated circuit having the desired performance can be stably produced.

Fifth Embodiment

Next, a fifth embodiment of the present invention will be explained.

Figure 5:
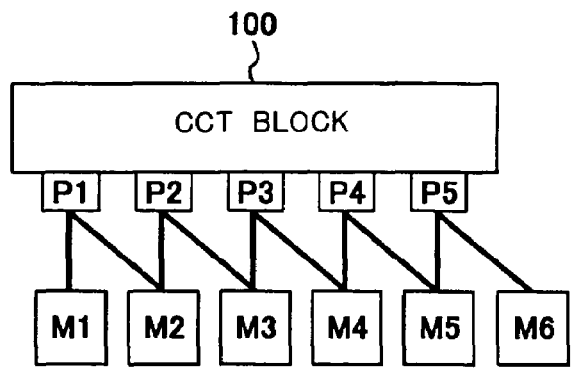
FIG. 5 is a diagram showing an example of layout of input/output units and circuit modules in the semiconductor integrated circuit shown in FIGS. 1A and 1B.

FIG. 5 is a diagram showing an example of the layout of input/output units (P1 to P5) and circuit modules (M1 to M6) in the semiconductor integrated circuit shown in FIGS. 1A and 1B and omits illustration of the circuit module selection unit and the switch circuits included in it. The input/output units and the circuit modules may be arranged in for example numerical order as shown in FIG. 5, but it is not always necessary to arrange these as shown in FIG. 5 when automatically designing the layout and interconnects by CAD etc.

Figure 6A:
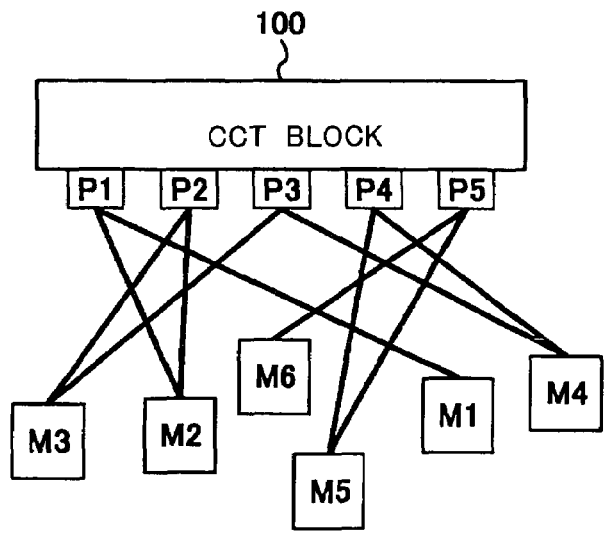
FIGS. 6A and 6B are diagrams showing an example of the layout and interconnects of input/output units and circuit modules in a semiconductor integrated circuit according to a fifth embodiment of the present invention.
Figure 6B:
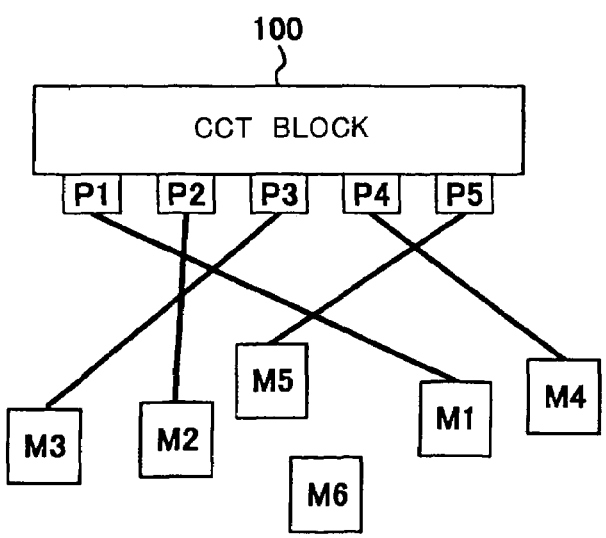

FIGS. 6A and 6B are diagrams showing an example of the layout and interconnects of the input/output units (P1 to P5) and the circuit modules (M1 to M6) in the semiconductor integrated circuit according to the present embodiment. In the semiconductor integrated circuit shown in FIG. 6A, the input/output units (P1 to P5) are arranged in numerical order in the same way as the example of FIG. 5, but the regular layout as shown in the example of FIG. 5 is broken for the circuit modules (M1 to M6). Note that the connections between the input/output units (P1 to P5) and the circuit modules (M1 to M6) are the same as the example of FIG. 5.

Figure 7A:
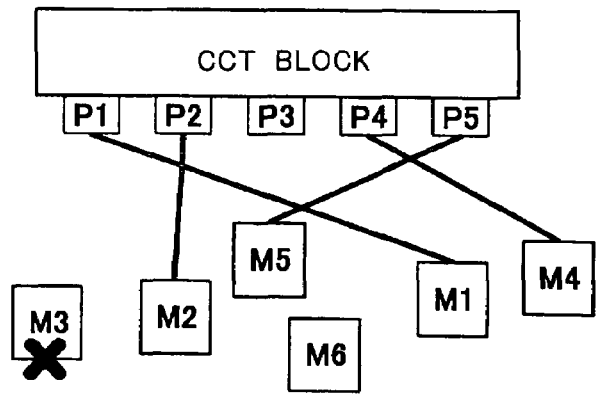
FIGS. 7A to 7D are diagrams for explaining the routine of repair in a case where a fault occurs in a circuit module M3 in the semiconductor integrated circuit shown in FIGS. 6A and 6B.
Figure 7B:
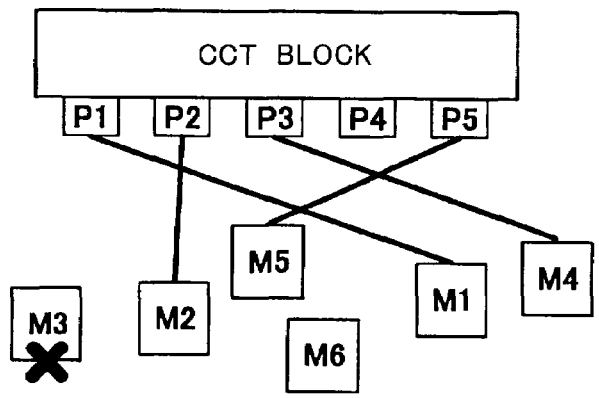
Figure 7C:
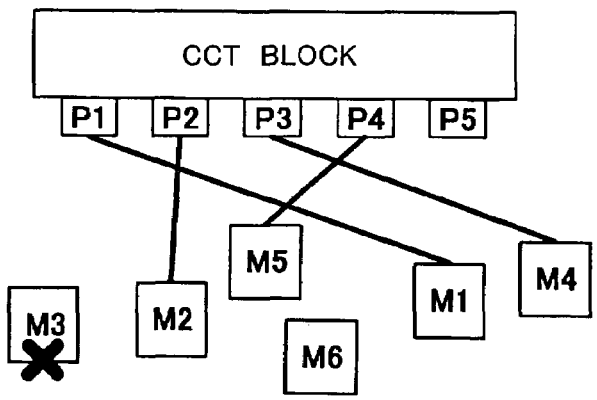
Figure 7D:
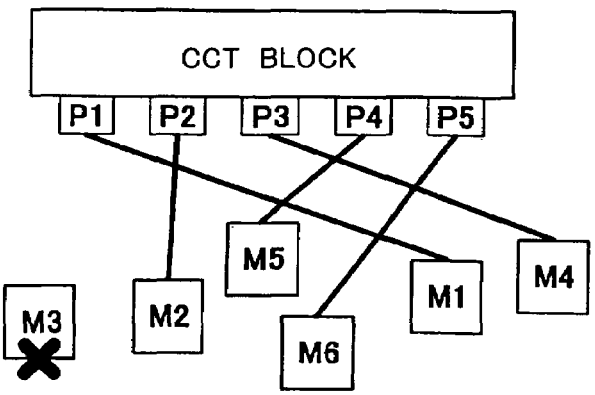

FIGS. 7A to 7D are diagrams for explaining the routine of repair when a fault occurs in the circuit module M3 in the semiconductor integrated circuit shown in FIGS. 6A and 6B. In a default state before a fault is repaired, as shown in FIG. 6B, input/output units Pi (i indicates an integer from 1 to 5, same true below in the present embodiment) and circuit modules Mi are connected in a one-to-one correspondence. In this initial connection, when a fault is discovered in the circuit module M3, first the circuit module M3 is disconnected from the input/output unit P3 (FIG. 7A). The circuit module M4 is connected to the input/output unit P3 from which the circuit module M3 is disconnected in place of that. The circuit module M4 is disconnected from the input/output unit P5 (FIG. 7B). The circuit module M5 is connected to the input/output unit P4 from which the circuit module M4 is disconnected in place of that. The circuit module M5 is disconnected from the input/output unit P5 (FIG. 7C). The input/output unit P5 disconnected from the circuit module M5 is connected to the circuit module M6 in the unconnected state in the initial connection (FIG. 7D). By the switching of connections as described above, the input/output units P1, P2, P3, P4, and P5 and the circuit modules M1, M2, M4, M5, and M6 are connected in a one-to-one correspondence, and the circuit module M3 having a fault is disconnected from all input/output units. In this way, even in the case where the layout and interconnects are not regular, the connections are the same as those of the semiconductor integrated circuit shown in FIGS. 1A and 1B and FIG. 5, therefore the fault repair can be carried out by the same routine.

Figure 8B:
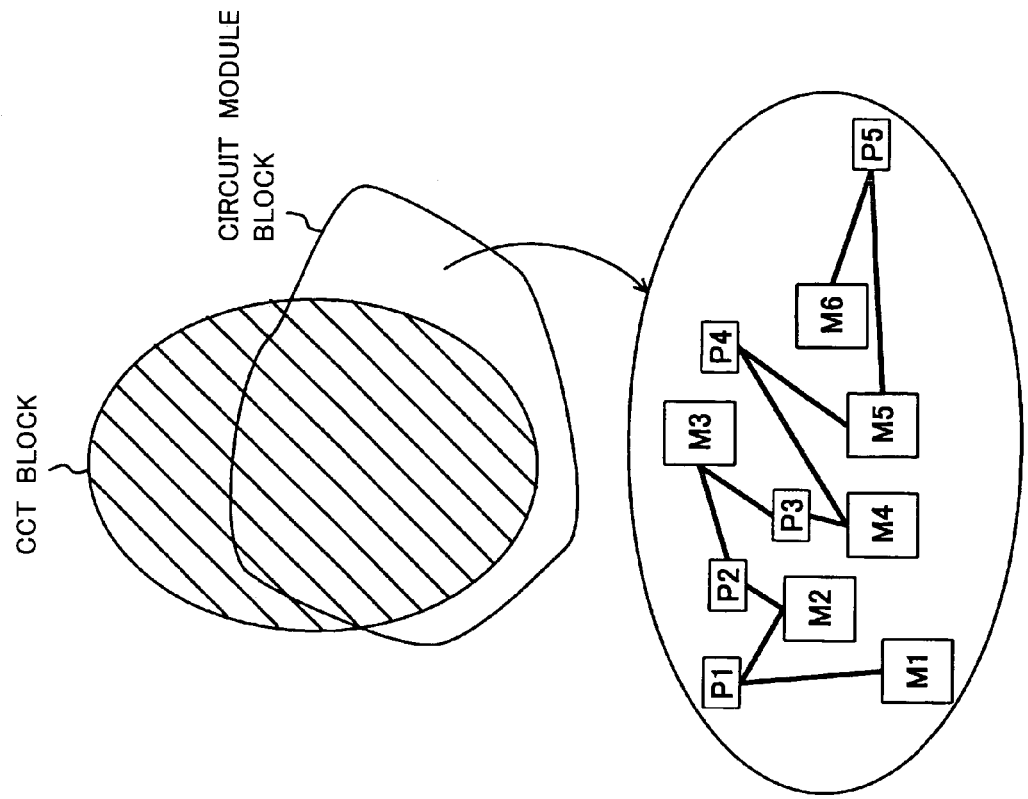
FIGS. 8A and 8B are diagrams showing an example of the overall circuit layout of a semiconductor integrated circuit according to the fifth embodiment of the present invention.
Figure 8A:
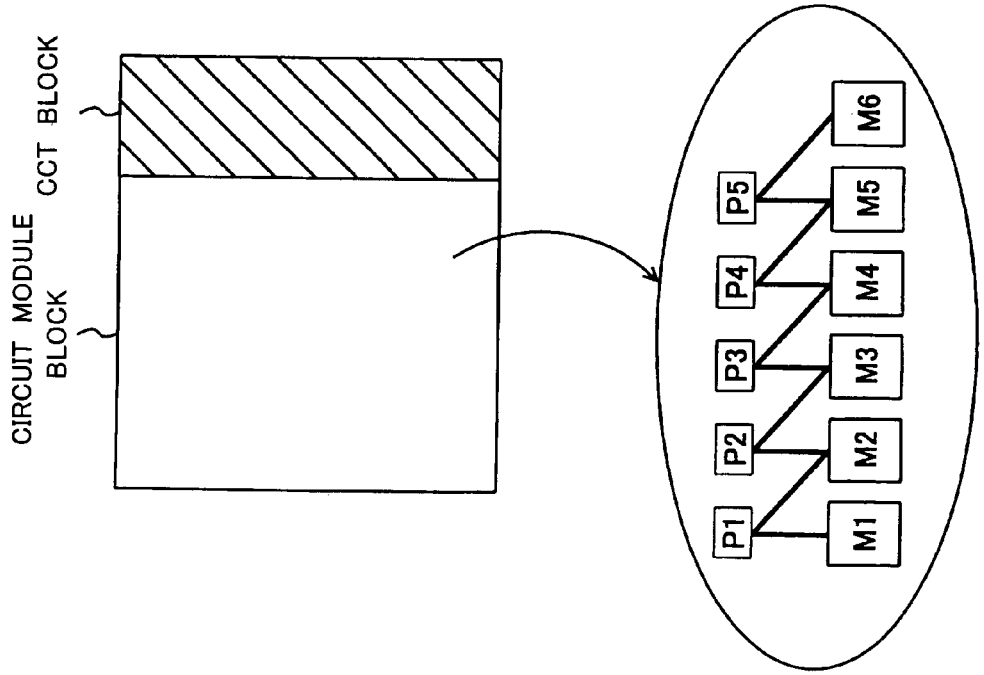

FIGS. 8A and 8B are diagrams showing an example of the overall layout of the circuit. FIG. 8A shows an example of regularly arranging the general circuit block 100 and circuit module block (indicating a group of circuit modules which can replace each other's functions). In this case, inside the circuit module block, for example as shown in FIG. 5, the circuit modules are arranged in numerical order at equal intervals. The a regular layout is apt to reduce the variation of distances between the input/output units and the circuit modules, therefore there is the advantage that the change of the signal delay along with the connection switching can be kept very small, so this is suited to a case where importance is attached to the improvement of performance of the circuit. On the other hand, FIG. 8B shows an example where the general circuit block 100 and the circuit module block are arranged in a free shape. This corresponds to for example the layout in the case of automatically designing the layout and interconnects by CAD. As shown in FIG. 8B, overlapping of the region of the general circuit block and the region of the circuit module block is permitted. The circuit modules and the input/output units can be freely arranged without being restricted to the regularity as shown in FIG. 8A, therefore there is the advantage that the density of layout of the circuit elements can be easily raised, so this is suitable for the case where importance is attached to the area of the circuit.

When changing the viewpoint, it is also possible to regard the previously explained semiconductor integrated circuit shown in FIG. 4C as the circuit obtained by changing the layout and interconnects of the input/output units (P1 to P5) and the circuit modules (M1 to M6) in the semiconductor integrated circuit shown in FIG. 4B. Namely, when the input/output units P5, P1, P2, P3, and P4 in FIG. 4C are regarded as the input/output units P1, P2, P3, P4 and P5 in FIG. 4B and the circuit modules M6, M4, M1, M2, M3, and M5 in FIG. 4C are regarded as the circuit modules M1, M2, M3, M4, M5, and M6 in FIG. 4B, the connections of the two are the same, but the layouts and interconnect patterns are different.

Accordingly, it is also possible to employ the previously explained standard of the selection set as the standard when determining the layout of the input/output units (P1 to P5) and the circuit modules (M1 to M6) and interconnect paths. Namely, the layout of the input/output units (P1 to P5) and the circuit modules (M1 to M6) and interconnect paths may be determined so that the maximum value of delays of all signal paths connecting five input/output units (P1 to P5) and six circuit modules (M1 to M6) via (through-hole) the circuit module selection unit (SWA1 to SWA5 and SWB1 to SWB5) becomes the smallest. Alternatively, the layout of the input/output units (P1 to P5) and the circuit modules (M1 to M6) and interconnect paths may be determined so that the sum of delays of all signal paths connecting five input/output units (P1 to P5) and six circuit modules (M1 to M6) via (through-hole) the circuit module selection unit (SWA1 to SWA5 and SWB1 to SWB5) becomes the smallest. Alternatively, the layout of the input/output units (P1 to P5) and the circuit modules (M1 to M6) and interconnect paths may be determined so that the sum of delays of all signal paths connecting becomes the smallest within the range where the maximum value of delays of all signal paths connecting five input/output units (P1 to P5) and six circuit modules (M1 to M6) via (through-hole) the circuit module selection unit (SWA1 to SWA5 and SWB1 to SWB5) does not exceed a predetermined upper limit value.

Sixth Embodiment

Next, a sixth embodiment of the present invention will be explained.

The semiconductor integrated circuit according to the present embodiment has a plurality of circuit module blocks. Here, a "circuit module block" designates a group of a plurality of (three or more) circuit modules which can replace each other's functions. For example, in the semiconductor integrated circuit shown in FIG. 1, the group of six circuit modules (M1 to M6) corresponds to one circuit module block.

Further, the semiconductor integrated circuit according to the present embodiment, in the same way as that explained in the previous embodiments, has a circuit module selection unit having the function of selecting part of the circuit modules from among the circuit module blocks and connecting the same to the input/output units of the general circuit block. The circuit module selection unit select parts of the (two or more) circuit modules from among the circuit module blocks in response to a control signal and connect the selected parts of the circuit modules to the same number of input/output units in a one-to-one correspondence. Further, they connect one circuit module selected from at least two circuit modules with respect to each input/output unit provided in the general circuit block.

By providing the a plurality of circuit module blocks and circuit module selection units, it becomes possible to repair a greater number of faults in the semiconductor integrated circuit. For example, in the semiconductor integrated circuit shown in FIG. 1, only one fault can be repaired, but by providing a plurality of the same circuit module blocks, it becomes possible to repair two or more faults.

Further, by providing a plurality of circuit module blocks, it becomes possible to repair a plurality of types of circuit modules. For example, there are a plurality of groups of circuit modules which can replace each other's functions, and circuit modules belonging to the same circuit module group can replace each other's functions, but sometimes circuit modules belonging to the different circuit module groups cannot replace each other's functions. In the a case, by configuring a plurality of circuit module blocks by adding redundant circuit modules to each circuit module group and repairing faults in each of these plurality of circuit module blocks, it becomes possible to repair a plurality of types of circuit modules.

Note that one circuit module may be included in only one circuit module block or may be commonly used by a different plurality of circuit module blocks.

A circuit module commonly used by a plurality of circuit module blocks is provided with a function encompassing all or part of the functions of the other circuit modules included in the plurality of circuit module blocks. For example, a circuit module commonly used by a circuit module block configured by circuit modules having the function A and by a circuit module block configured by circuit modules having the function B has a function C encompassing at least a part of the function A and at least a part of the function B. For this reason, the commonly used circuit module can replace the functions of a circuit module included in any circuit module.

Figure 9A:
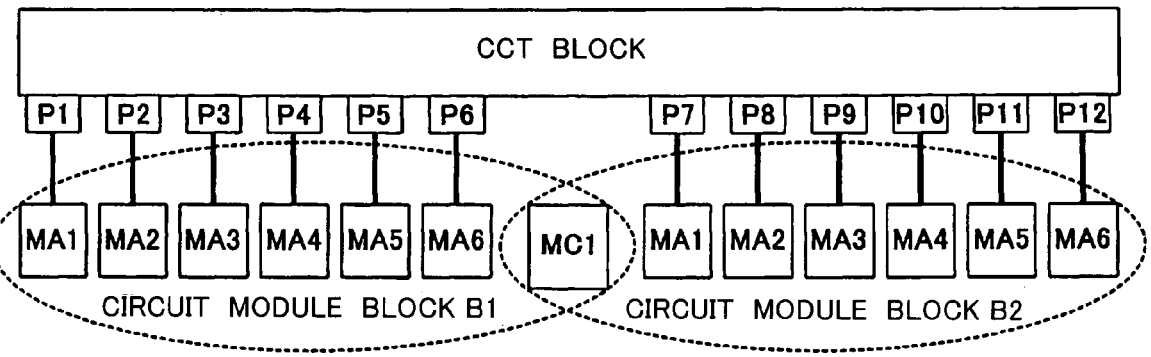
FIGS. 9A to 9C are diagrams showing an example where one circuit module is commonly used by two circuit module blocks in a semiconductor integrated circuit according to a sixth embodiment of the present invention.
Figure 9B:
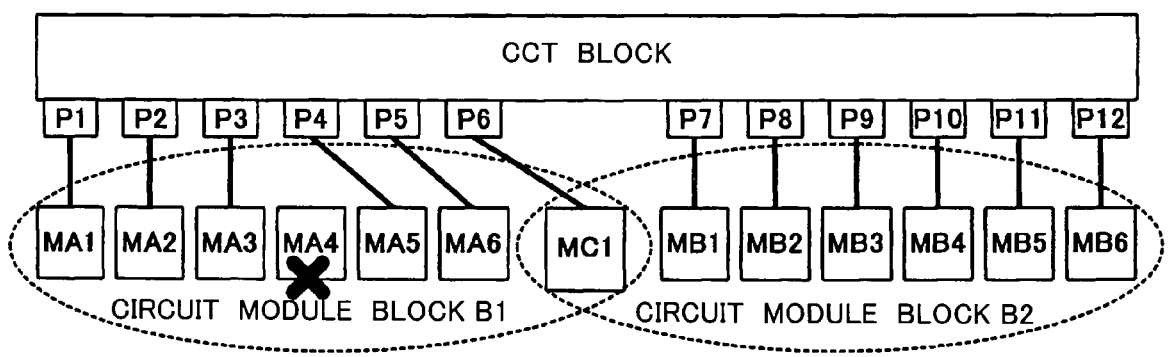
Figure 9C:
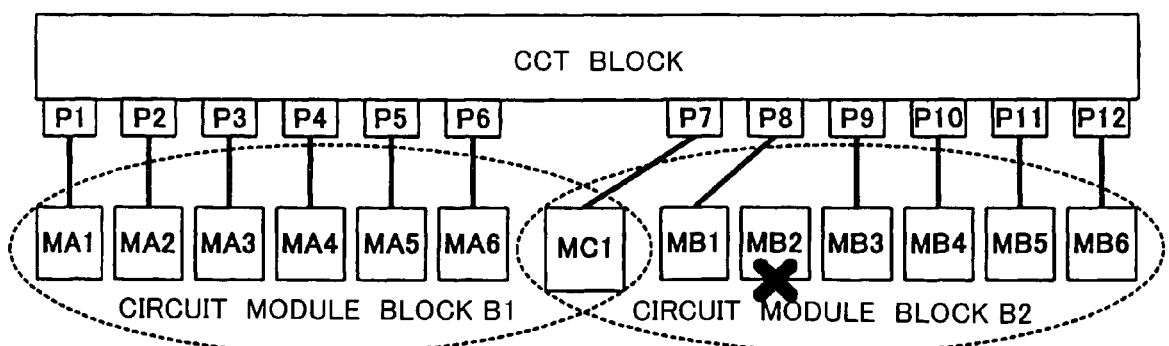

FIGS. 9A to 9C are diagrams showing an example where one circuit module (MC1) is commonly used by two circuit module blocks (B1, B2).

In the example of FIGS. 9A to 9C, the circuit module block B1 is configured by six circuit modules (M1 to M6) provided with the function A and the circuit module MC1 provided with the function C. The circuit module block B2 is configured by six circuit modules (MB1 to MB6) provided with the function B and the circuit module MC1 provided with the function C. Accordingly, the circuit module MC1 is commonly used by the circuit module blocks B1 and B2.

The function C of the circuit module MC1 encompasses for example both of the function A of the circuit modules MA1 to MA6 and the function B of the circuit modules MB1 to MB6. Namely, the circuit module MC1 has upward compatibility with respect to the circuit modules MA1 to MA6 and MB1 to MB6.

At the time of default, the circuit module MC1 having the upward compatibility is unconnected and becomes the redundant circuit module of the two circuit module blocks (B1, B2) (FIG. 9A). Further, the circuit modules MA1, . . . , and MA6 of the circuit module block B1 are connected to the input/output units P1, . . . , and P6 of the general circuit block in a one-to-one correspondence, and the circuit modules MB1, . . . , and MB6 of the circuit module block B2 are connected to the input/output units P7, . . . , and P12 of the general circuit block in a one-to-one correspondence.

If a fault occurs in for example the circuit module MA4 of the circuit module block B1 (FIG. 9B), the circuit module MA4 is disconnected from the input/output unit P4. Then, the circuit modules MA5, MA6, and MC1 are connected to the input/output units P4, P5, and P6. Further, if a fault occurs in for example the circuit module MB2 of the circuit module block B2 (FIG. 9C), the circuit module MB2 is disconnected from the input/output unit P8. Then, the circuit modules MC1 and MB1 are connected to the input/output units P7 and P8. In this way, the circuit module MC1 having the upward compatibility can repair a fault of either of the circuit module blocks B1 and B2.

By providing a circuit module commonly used by a plurality of circuit module blocks, the number of redundant circuit modules solely provided for each circuit module block can be decreased. For example, as shown in FIGS. 9A to 9C, even when there are no solely provided redundant circuit modules, faults can be repaired by using the commonly used circuit module. For this reason, even in a case where for example the number of circuit module blocks is very large, since the redundant circuit modules need not be provided for each circuit module block, an unnecessary increase of the number of redundant circuit modules can be prevented.

Figure 10A:
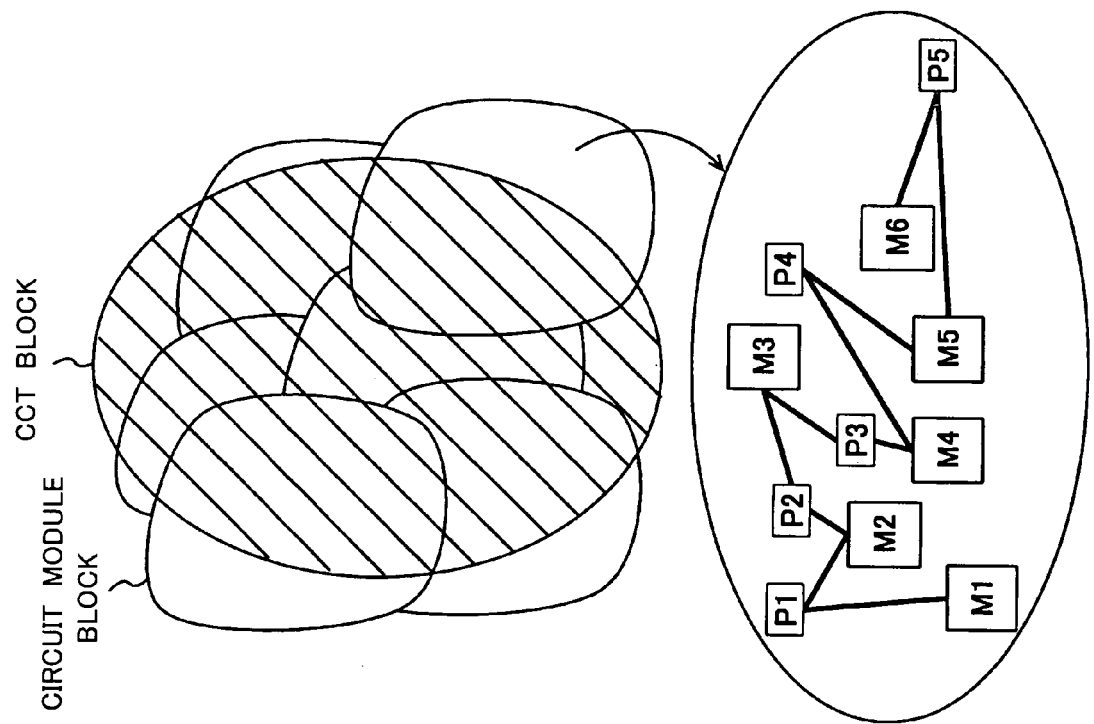
FIGS. 10A and 10B are diagrams showing an example of the overall circuit layout of a semiconductor integrated circuit according to the sixth embodiment of the present invention.
Figure 10B:
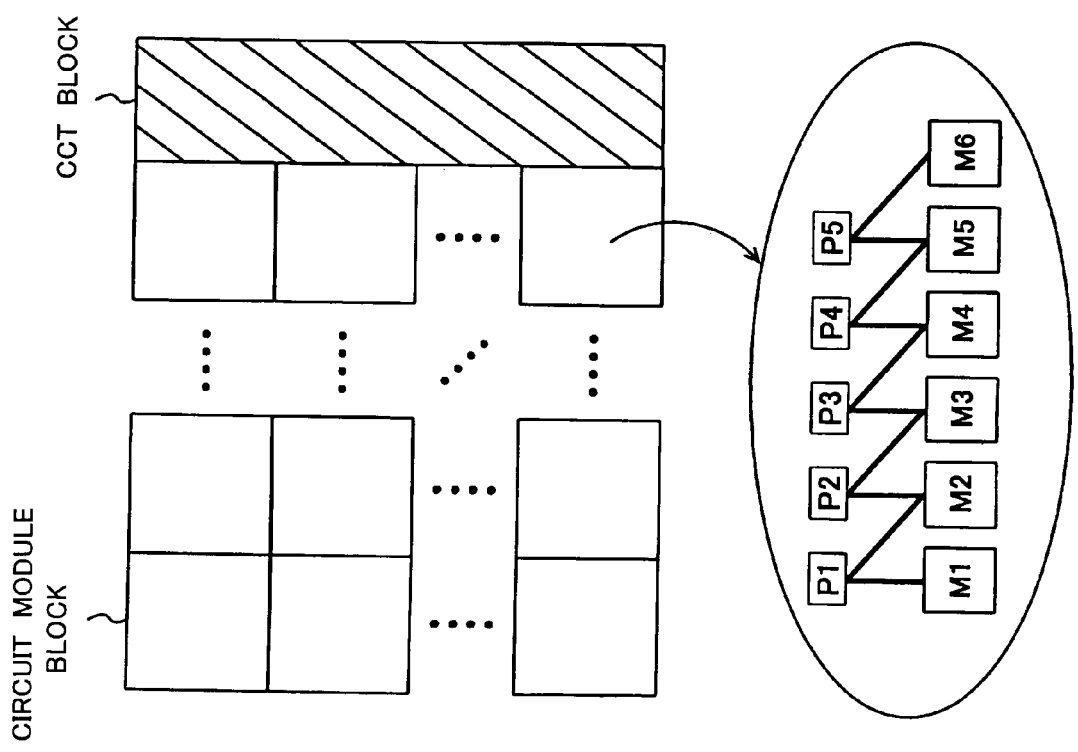

FIGS. 10A and 10B are diagrams showing an example of the overall layout of the circuit in the case where a plurality of circuit module blocks are provided. FIG. 10A shows an example of regular layout of circuit module blocks. In the example of the figures, the circuit module blocks are arranged in a matrix. Inside each circuit module block, in the same way as for example the case of FIG. 8A, circuit modules are arranged in numerical order at equal intervals. The a regular layout has the advantage that the change of the signal delay along with connection switching can be kept very small. On the other hand, FIG. 10B shows an example where the circuit module blocks are arranged in a free shape and corresponds to for example the layout in the case of automatically designing the layout and interconnects by CAD. In the example of FIG. 10B, the region of the general circuit block and the region of the circuit module blocks overlap. The a free layout has the advantage that the layout density of the circuit elements is easily raised.

Seventh Embodiment

Next, a seventh embodiment of the present invention will be explained.

Figure 11:
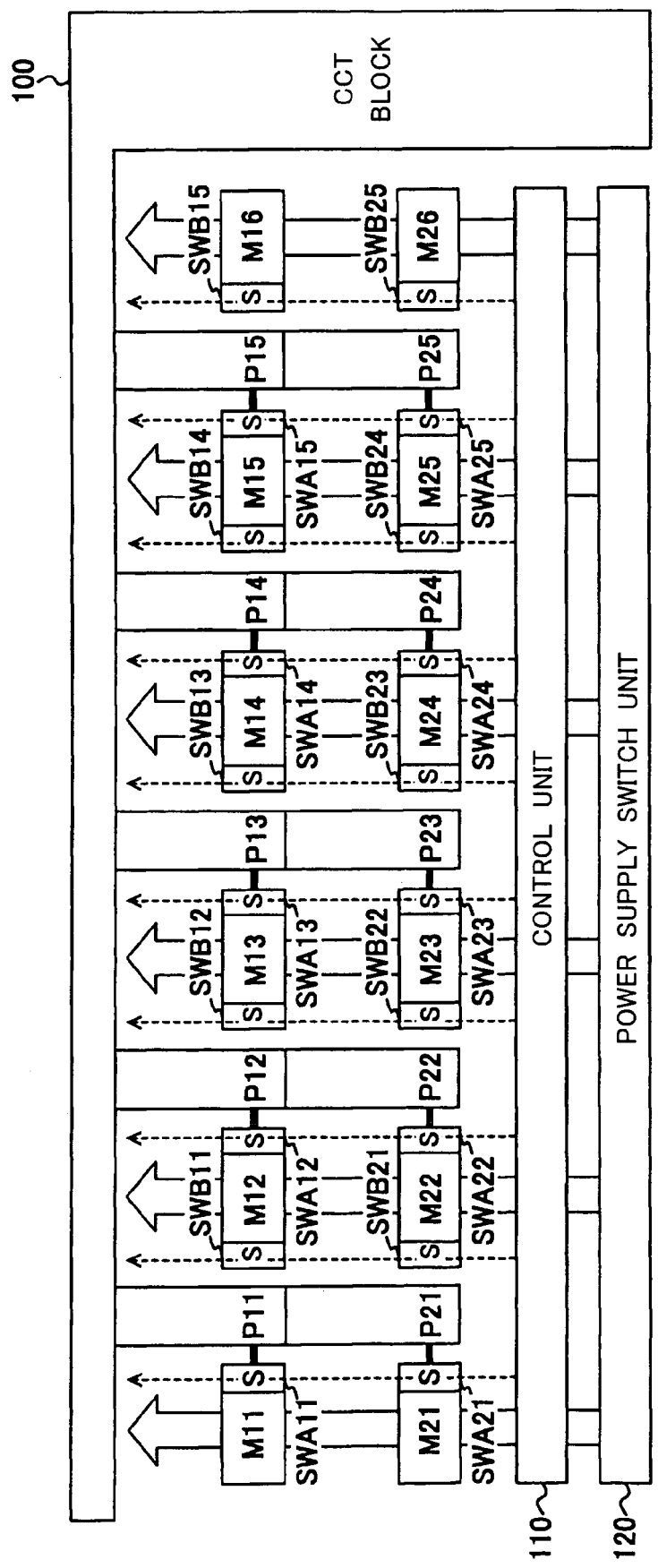
FIG. 11 is a diagram showing an example of the configuration of a semiconductor integrated circuit according to a seventh embodiment of the present invention.

FIG. 11 is a diagram showing an example of the configuration of a semiconductor integrated circuit according to the seventh embodiment. The semiconductor integrated circuit according to the seventh embodiment, for example as shown in FIG. 11, has circuit modules M11 to M16 and M21 to M26, a general circuit block 100, switch circuits SWA11 to SWA15 and SWA21 to SWA25, switch circuits SWB11 to SWB15 and SWB21 to SWB25, a control unit 110, and a power supply switch unit 120.

The group of circuit modules M11 to M16 and the group of M21 to M26 are circuit module blocks. The general circuit block 100 is a circuit block. The circuits including the switch circuits SWA11 to SWA15, SWA21 to SWA25, SWB11 to SWB15, and SWB21 to SWB25 are a circuit module selection unit. The group of switch circuits SWA11 to SWA15 and the group of the switch circuits SWA21 to SWA25 are a first switch group. The group of the switch circuits SWB11 to SWB15 and the group of the switch circuits SWB21 to SWB25 are second switch group. The circuit modules M11 to M16 and M21 to M26 are sets of circuits having a predetermined function in the same way as the previously explained circuit modules M1 to M6 (FIGS. 1A and 1B). The group of the circuit modules M11 to M16 and the group of circuit modules M11 to M16 form circuit module blocks. In the present embodiment, the group of the circuit modules M11 to M16 will be called a "first circuit module block", and the group of the circuit modules M21 to M26 will be called a "second circuit module block". The circuit modules belonging to the same circuit module block can replace each other's functions. The circuit modules belonging to different circuit module blocks may be able to or unable to replace each other's functions.

The general circuit block 100 has input/output units P11 to P15 for exchanging signals with the first circuit module block (M11 to M16) and input/output units P21 to P25 for exchanging signals with the second circuit module block (M21 to M26) and executes the predetermined processing in cooperation with these circuit modules.

Each of the input/output units P11 to P15 outputs at least one signal to one circuit module belonging to the first circuit module block (M11 to M16) and, at the same time, receives as input at least one signal generated in the one circuit module. Each of the input/output units P21 to P25 outputs at least one signal to one circuit module belonging to the second circuit module block (M21 to M26) and, at the same time, receives as input at least one signal generated in the one circuit module.

A switch circuit SWA1$i$ ($i$ indicates an integer from 1 to 5, same true below in the present embodiment) is connected between an input/output unit P1$i$ and a circuit module M1$i$ and turns on or off in response to a control signal supplied from the control unit 110. A switch circuit SWA2$i$ is connected between an input/output unit P2$i$ and a circuit module M2$i$ and turns on or off in response to a control signal supplied from the control unit 110. A switch circuit SWB1$i$ is connected between the input/output unit P1$i$ and a circuit module M1($i$+1) and turns on or off in response to a control signal supplied from the control unit 110. A switch circuit SWB2$i$ is connected between the input/output unit P2$i$ and a circuit module M2($i$+1) and turns on or off in response to a control signal supplied from the control unit 110.

The switch circuits SWA11 to SWA15 and SWB11 to SWB15 have the function of selecting five circuit modules from the first circuit module block (M11 to M16) and connecting the same with the input/output units P11 to P15 in a one-to-one correspondence. In the present embodiment, the circuit configured by these switch circuits SWA11 to SWA15 and SWB11 to SWB15 will be called a "first circuit module selection unit". The first circuit module selection unit (SWA11 to SWA15 and SWB11 to SWB15) connects one circuit module selected from two circuit modules included in the first circuit module block (M11 to M16) to each of the input/output units P11 to P15. Namely, it selects one of the circuit module M1$i$ or the circuit module M1($i$+1) in response to a control signal supplied from the control unit and connects this selected circuit module to the input/output unit P1$i$.

The switch circuits SWA21 to SWA25 and SWB21 to SWB25 have the function of selecting five circuit modules from the second circuit module block (M21 to M26) and connecting the same with the input/output units P21 to P25 in a one-to-one correspondence. In the present embodiment, the circuit configured by these switch circuits SWA21 to SWA25 and SWB21 to SWB25 will be called a "second circuit module selection unit". The second circuit module selection unit (SWA21 to SWA25 and SWB21 to SWB25) connects one circuit module selected from two circuit modules included in the second circuit module block (M21 to M26) to each of the input/output units P21 to P25. Namely, it selects one of the circuit module M2$i$ or the circuit module M2($i$+1) in response to a control signal supplied from the control unit and connects this selected circuit module to the input/output unit P2$i$.

The control unit 110 generates a control signal for selecting five circuit modules from the first circuit module block (M11 to M16) and the second circuit module block (M21 to M26) so as to disconnect the faulty circuit module (circuit module previously provided for redundancy when there is no fault) from all input/output units and supplies this to the first circuit module selection unit and the second circuit module selection unit explained above.

Note that the control unit 110 commonly uses the control signal supplied to the first circuit module selection unit (SWA11 to SWA15 and SWB11 to SWB15) and the second circuit module selection unit (SWA21 to SWA25 and SWB21 to SWB25), therefore, when a specific circuit module is disconnected from the input/output units in the first circuit module block (M11 to M16), a specific circuit module corresponding to this is disconnected from the input/output units in the second circuit module block (M21 to M26).

This will be explained in more generalized terms. In the overall set of the circuit modules (M11 to M16 and M21 to M26), six partial sets are formed. Each of these six partial sets is configured by two circuit modules. These sets do not have any relation with each other. When designating the six partial sets as the first partial set to the sixth partial set, the partial sets include the following components.

First partial set . . . {M11, M21}
Second partial set . . . {M12, M22}
Third partial set . . . {M13, M23}
Fourth partial set . . . {M14, M24}
Fifth partial set . . . {M15, M25}
Sixth partial set . . . {M16, M26}

The control unit 110 generates a control signal so as to disconnect all circuit modules belonging to the partial set from the input/output units when the circuit module belonging to a certain partial set is disconnected from the input/output units. For example, when the circuit module M23 is disconnected from the input/output units, a control signal is generated so that the circuit module M13 belonging to the partial set the same as this is disconnected from the input/output units. Namely, circuit modules belonging to the same partial set are controlled in connection state with the input/output units by the same control signal supplied from the control unit 110.

Here, the state of each switch circuit in a case where a control signal designating disconnection of an n-th partial set (n indicates an integer from 1 to 6, same true below in the present embodiment) from all input/output units is generated in the control unit 110 will be explained. In this case, when n is an integer from 2 to 5 (that is, when the second to the fifth partial sets are to be disconnected), the switch circuits SWA11 to SWA1(n−1) and SWA21 to SWA2(n−1) turn on, and the switch circuits SWA1n to SWA15 and SWA2n to SWA25 turn off. Further, the switch circuits SWB11 to SWB1(n−1) and SWB21 to SWB2(n−1) turn off, and the switch circuits SWB1n to SWB15 and SWB2n to SWB25 turn on. When n is the integer 1 (that is, when the first partial set is to be disconnected), all of the switch circuits SWA11 to SWA15 and SWA21 to SWA25 turn off, and all of the switch circuits SWB11 to SWB15 and SWB21 to SWB25 turn on. When n is the integer 6 (that is, when the first partial set is to be disconnected), all of the switch circuits SWA11 to SWA15 and SWA21 to SWA25 turn on, and the switch circuits SWB11 to SWB15 and SWB21 to SWB25 turn off.

The power supply switch unit 120 shuts off the power to any partial set disconnected from the input/output units among the first partial set to the sixth partial set in response to a control signal of the control unit 110. For example, the power supply switch unit 120 has six power supply switch circuits (not shown) inserted in the power supply lines of the first partial set to the sixth partial set. When a certain partial set is disconnected from the input/output units, the power supply switch unit inserted in that power supply line turns off.

Figure 12:
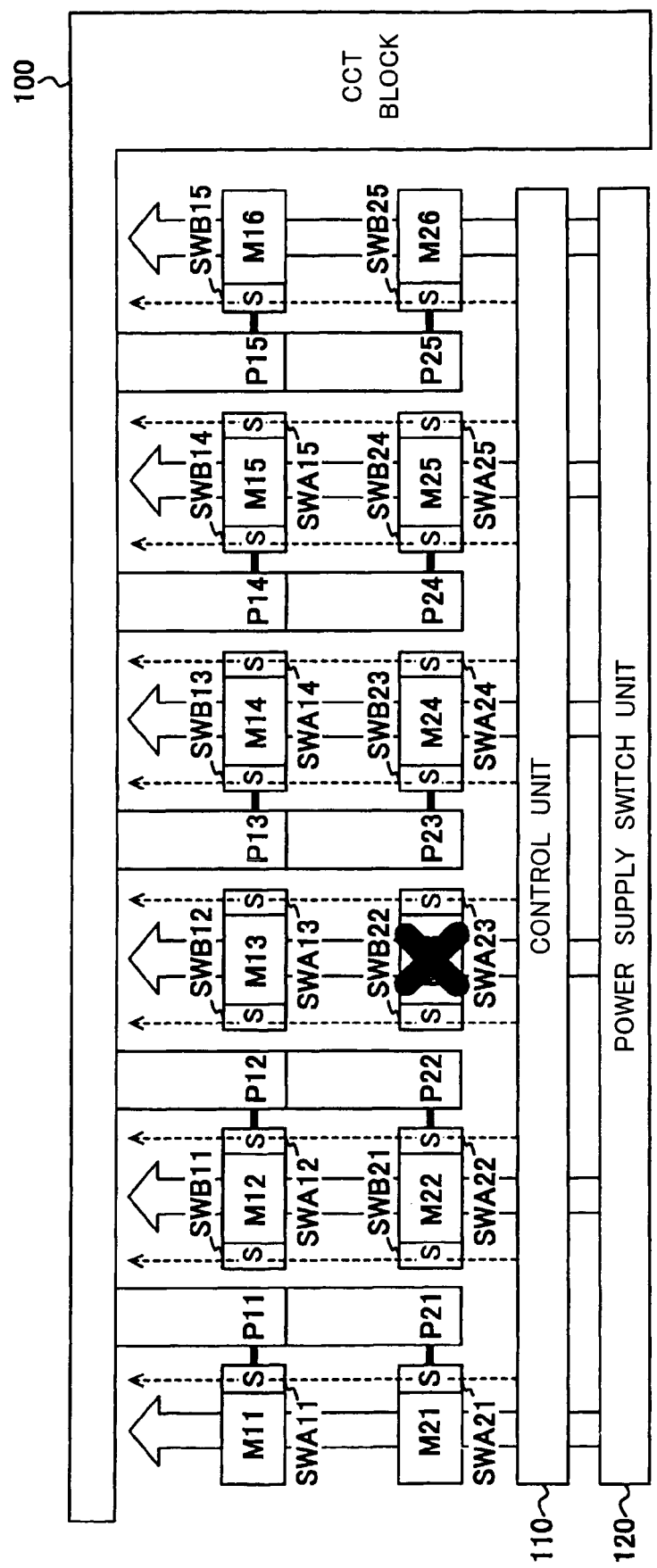
FIG. 12 is a diagram showing an example of fault repair in the semiconductor integrated circuit shown in FIG. 11.

FIG. 12 shows the connection state in a case where a fault occurs in the circuit module M23. In this case, the control unit 110 generates a control signal so as to disconnect the circuit module M23 from all input/output units. Upon receipt of this control signal, the switch circuits SWA11, SWA12, SWA21, and SWA22 turn on, the switch circuits SWA13, SWA14, SWA15, SWA23, SWA24, and SWA25 turn off, the switch circuits SWB11, SWB12, SWB21, and SWB22 turn off, and the switch circuits SWB13, SWB14, SWB15, SWB23, SWB24, and SWB25 turn on. Due to this, the input/output units P11 and P21 are connected with the circuit modules M11 and M21, the input/output units P12 and P22 are connected with the circuit modules M12 and M22, the input/output units P13 and P23 are connected with the circuit modules M14 and M24, the input/output units P14 and P24 are connected with the circuit modules M15 and M25, and the input/output units P15 and P25 are connected with the circuit modules M16 and M26, and the circuit modules M13 and M23 are disconnected from the general circuit block 100.

By the semiconductor integrated circuit according to the present embodiment, the connection states of all circuit modules belonging to the same partial set are commonly controlled by the same control signal supplied from the control unit 110. Due to this, it is possible to greatly decrease the number of control signals, and the circuit configuration of the control unit 110 can be simplified, in comparison with the case where the connection states with the input/output units are independently controlled for individual circuit modules.

The supply of power to the partial set disconnected from the input/output units is shut off, therefore wasted consumption of power in circuit modules not contributing to the operation of the circuit can be prevented. When a fault causing a large current to flow in the power supply line occurs in a circuit module, this is cut off and the influence upon the power supply system and other circuits can be prevented, therefore the drop of the yield due to a fault of a circuit module can be effectively suppressed.

When inspecting for faults, it is sufficient to inspect for the presence of faults for each partial set, therefore the inspection time can be shortened in comparison with the case of inspecting individual circuit modules.

Further, when writing information of a faulty circuit module into the semiconductor integrated circuit by utilizing a fuse or other storage element, since the information of the presence of faults may be written for each partial set, the amount of information becomes smaller and the time required for the write processing can be shortened.

In the semiconductor integrated circuit according to the present embodiment, when there is a faulty circuit module, all circuit modules belonging to the partial set the same as this are disconnected from the input/output units, therefore the normal circuit modules also become wasted. For this reason, if the probability of occurrence of faults is high, the number of circuit modules which become wasted tends to become larger. However, if the probability of occurrence of faults is not so high a large amount of circuit modules of relatively small scale are provided, the circuit area necessary for achieving the same yield can be suppressed in comparison with the method of control of the connection state for individual circuit modules and the control of shutoff of the power supply.

Eighth Embodiment

Next, an eighth embodiment of the present invention will be explained.

In the semiconductor integrated circuit shown in FIGS. 1A and 1B, the circuit module to be connected to each input/output unit is selected from two circuit modules, but in the semiconductor integrated circuit according to the present embodiment, this is selected from among three or more circuit modules.

Figure 13A:
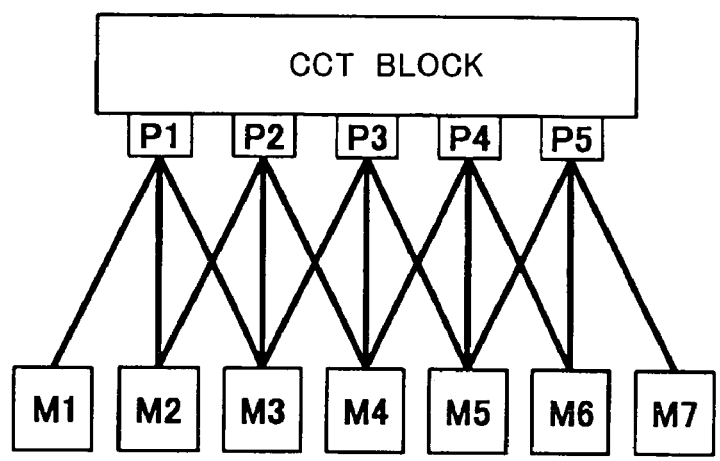
FIGS. 13A to 13C are diagrams showing a first example of the configuration of a semiconductor integrated circuit according to an eighth embodiment of the present invention.

FIG. 13A is a diagram showing an example of the configuration of a semiconductor integrated circuit selecting the circuit module connected to each input/output unit from among three circuit modules.

The semiconductor integrated circuit shown in FIG. 13A has a general circuit block provided with input/output units P1 to P5, circuit modules M1 to M7, and a circuit module selection unit. Note that, in FIG. 13A to 13C and FIGS. 14A to 14C explained later, the connection paths between input/output units and circuit modules are shown, but illustration of the circuit module selection unit realizing this switching of connection paths is omitted.

The input/output unit Pi (i indicates an integer from 1 to 5, same true below in the explanation of FIGS. 13A to 13C) is connected to one of circuit modules Mi, M(i+1), or M(i+2). These connections are switched by the circuit module selection unit.

Figure 13B:
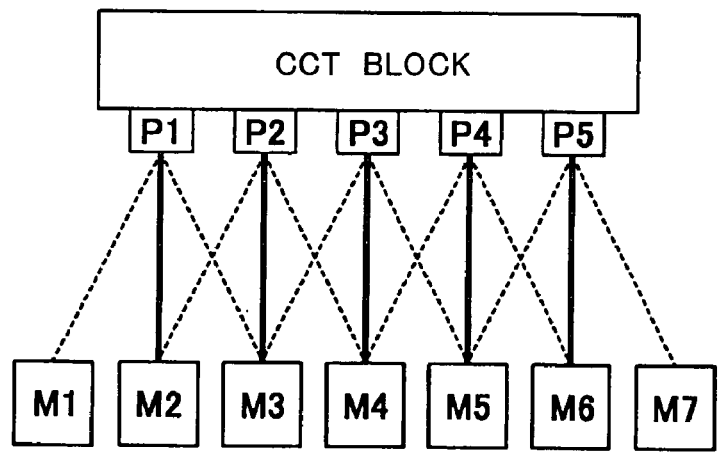

FIG. 13B shows an example of the initial connection pattern in a case where there are no faults in the circuit modules M1 to M7. In the example shown in FIG. 13B, the input/output units P1, P2, P3, P4, and P5 and the circuit modules M2, M3, M4, M5, and M6 are connected in a one-to-one correspondence.

Figure 13C:
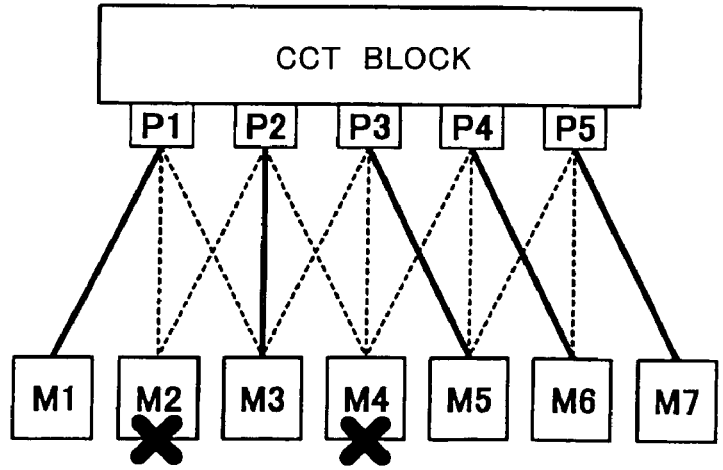

FIG. 13C shows the connection pattern in a case where the circuit modules M2 and M4 fail. In the example of FIG. 13C, the input/output units P1, P2, P3, P4, and P5, and the circuit modules M1, M3, M5, M6, and M7 are connected in a one-to-one correspondence, and the circuit modules M2 and M4 are disconnected from the input/output units.

When the initial connection pattern is set as shown in FIG. 13B, the connection pattern for repairing the faults can be determined according to for example the following routine. First, the presence of any faults is sequentially judged from the circuit module M1 to M7 (that is, toward the right direction in the figure). If there is a faulty circuit module, this is disconnected from the input/output units. Then, the other parties of connection of the input/output units on the left side in the figure from this disconnected input/output unit are wholly shifted toward the left direction in the figure. Further, when the above shift is carried out, the presence of faults is sequentially judged from the circuit module M7 to M1 (that is, toward the left direction in the figure). If there is a faulty circuit module different from the previously explained circuit module, this is disconnected from the input/output units. Then, the other parties of connection of the input/output units on the right side in the figure from this disconnected input/output unit are wholly shifted toward the right direction in the figure. For example, in the example of FIG. 13C, the other party of connection of the input/output unit existing on the left side from the input/output unit P1 connected to the faulty circuit module M2 (that is, the input/output unit P1) is shifted toward the left direction in the figure. Further, the other party of connection of the input/output units existing on the right side from the input/output unit P3 connected to the faulty circuit module M4 (that is, the input/output units P3, P4, P5) are shifted toward the right direction in the figure.

FIG. 14A is a diagram showing an example of the configuration of a semiconductor integrated circuit selecting a circuit module connected to each input/output unit from among four circuit modules. The semiconductor integrated circuit shown in FIG. 14A has a general circuit block provided with input/output units P1 to P3, circuit modules M1 to M4, and a circuit module selection unit.

The input/output unit P1 is connected to one of the circuit modules M1, M2, M4, and M5. The input/output unit P2 is connected to one of the circuit modules M2, M3, M4, and M5. The input/output unit P3 is connected to one of the circuit modules M1, M2, M3, and M4. The input/output unit P4 is connected to one of the circuit modules M1, M2, M3, and M4. These connections are switched by the circuit module selection unit.

FIG. 14B shows an example of the initial connection pattern when there is no fault in the circuit modules M1 to M4. In the example shown in FIG. 14B, the input/output units P1, P2, and P3 and the circuit modules M5, M4, and M2 are connected in a one-to-one correspondence.

FIG. 14C shows the connection pattern when the circuit module M2 fails. In the example of FIG. 14C, the input/output units P1, P2, and P3 and the circuit modules M5, M4, and M1 are connected in a one-to-one correspondence, and the circuit module M2 is disconnected from each input/output unit.

Figure 15:
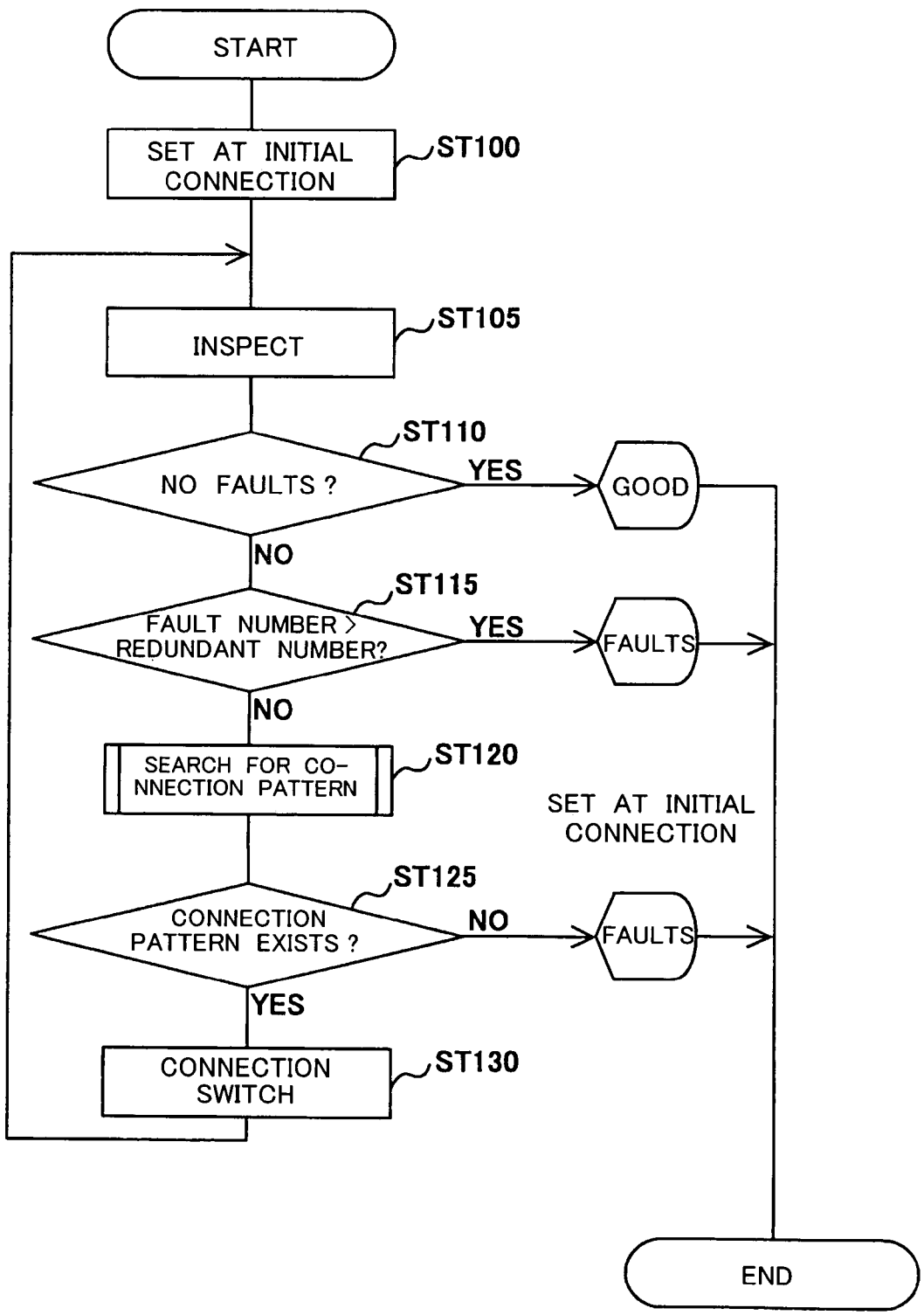
FIG. 15 is a first flow chart showing an example of a routine for searching for a connection pattern for repairing a fault.

Next, the general routine for searching for a connection pattern for repairing a fault in the semiconductor integrated circuit according to the present embodiment will be explained with reference to the flow charts of FIG. 15 to FIG. 17.

Step ST100

First, the connection pattern of the input/output units and circuit modules in the semiconductor integrated circuit to be inspected is set to for example a predetermined initial pattern as shown in FIG. 13B and FIG. 14B.

Step ST105

Then, the presence of any fault in the circuit modules is inspected for in the connection pattern set in the semiconductor integrated circuit at present. For example, the operation of each circuit module connected to an input/output unit is inspected by using for example a scan path test or other inspection technique.

Step ST110

When the inspection at step ST105 does not find any fault, it is judged that the semiconductor integrated circuit being inspected passes and the search of the connection pattern ends. In this case, the connection pattern set at present is acquired as a search result.

Step ST115

When any faulty circuit modules are found, it is judged whether or not the number of the faulty circuit modules is larger than the number of redundant circuit modules. If it is larger, the faults cannot be repaired, therefore it is judged that the semiconductor integrated circuit being inspected is defective and the search of the connection pattern ends. When the number of faulty circuit modules is smaller than the number of redundant circuit modules or the two are equal, there is a possibility that the faults can be repaired, therefore the search processing of the connection pattern is executed at step ST120.

Steps ST125 and ST130

As a result of the search processing at step ST120, when a pattern connecting circuit modules not judged as faulty to the input/output units one by one is found, the connection pattern of the semiconductor integrated circuit being inspected is set to this retrieved connection pattern and the inspection of step ST105 is executed again.

Figure 16:
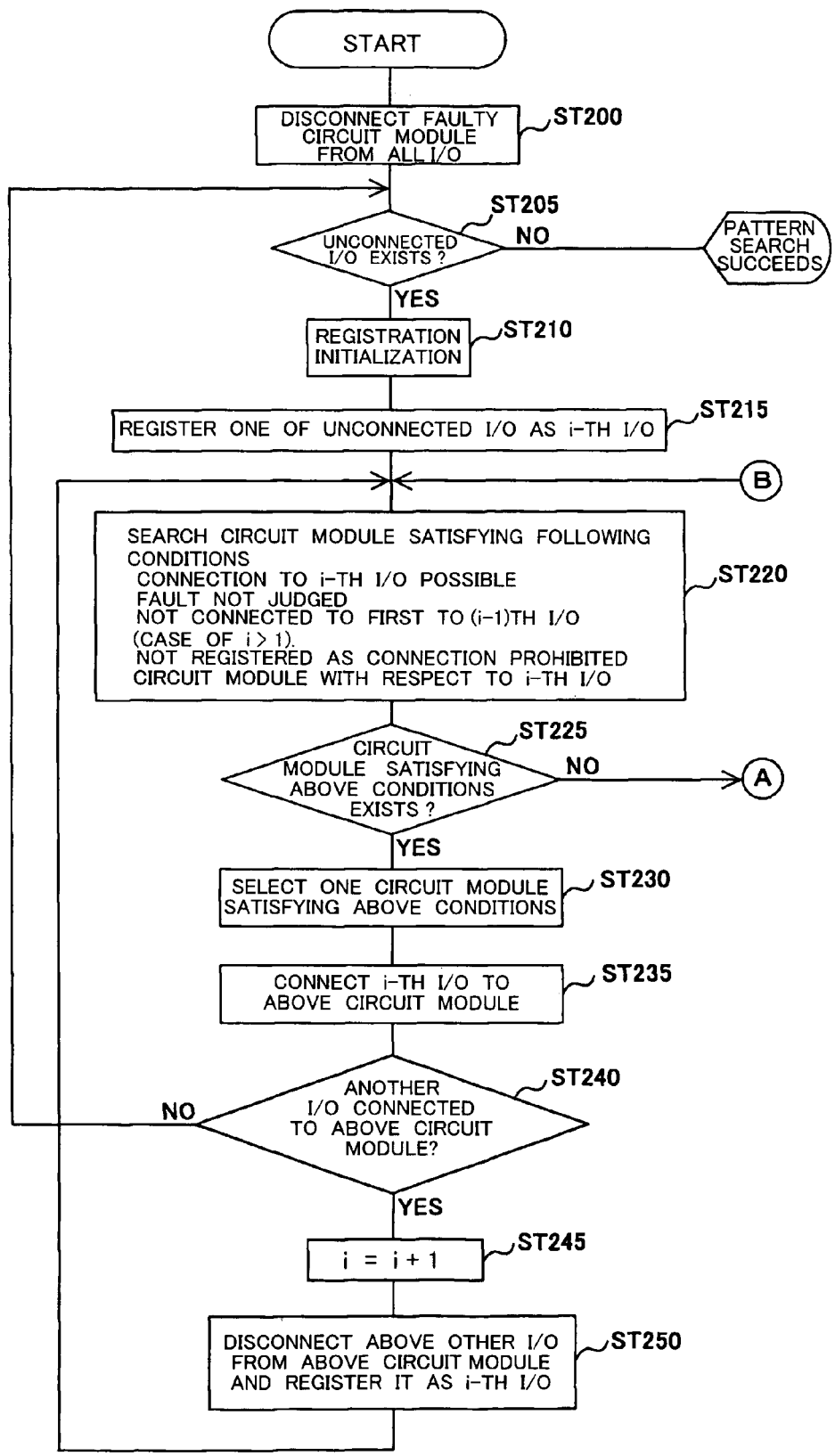
FIG. 16 is a second flow chart showing an example of a routine for searching for a connection pattern for repairing a fault.
Figure 17:
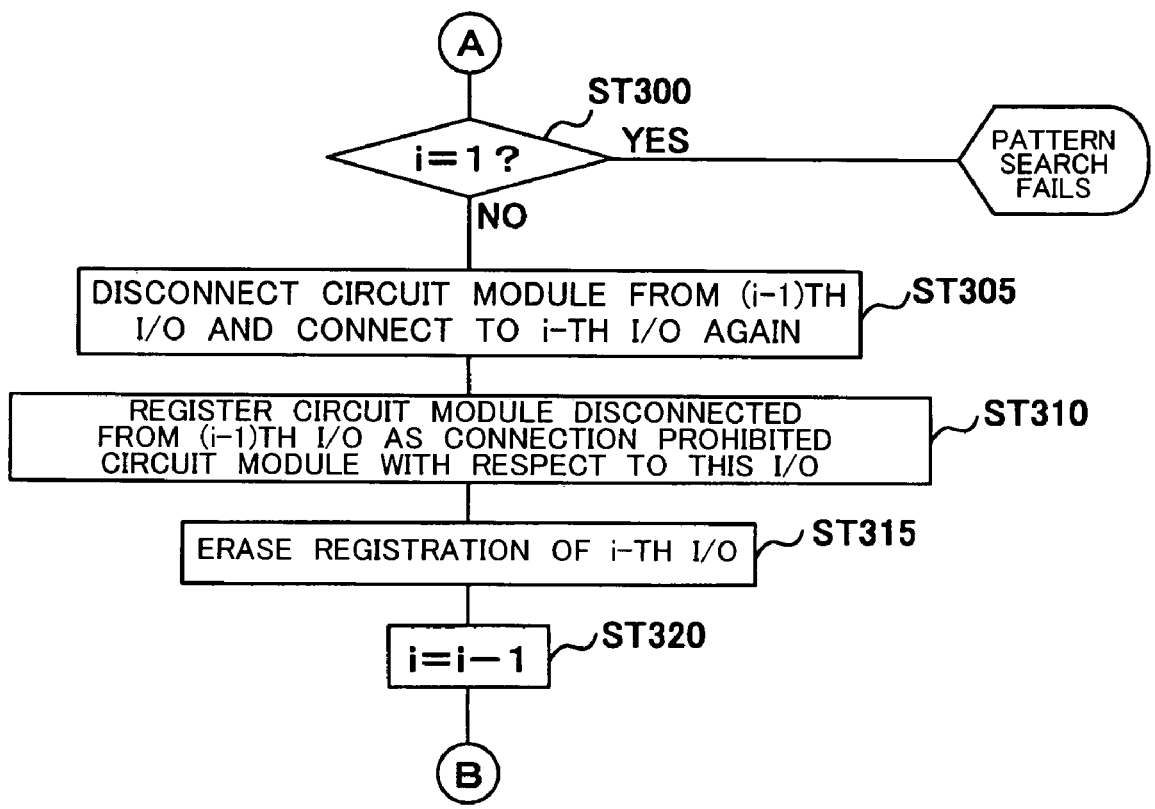
FIG. 17 is a third flow chart showing an example of a routine for searching for a connection pattern for repairing a fault.

FIG. 16 and FIG. 17 are flow charts for explaining the search processing of the connection pattern at step ST120. Note that the change of the connection pattern carried out in this search processing is a virtual change for searching for the target connection pattern and not actually carried out in the semiconductor integrated circuit being inspected. This search processing is executed by for example software on a computer.

Step ST200

First, the faulty circuit module found by the inspection at step ST105 is disconnected from all input/output units. Note that, in FIG. 16 and FIG. 17, an input/output unit is described as "I/O".

Step ST205

Next, it is judged whether or not there is any unconnected input/output unit which is not connected to a circuit module in the present connection pattern. When there is no unconnected input/output unit, the present connection pattern is acquired as the search result, and the search processing ends.

Step ST210

When it is judged at step ST205 that there is an unconnected input/output unit, the number i (i indicates a natural number, same true below in the explanation of FIG. 16 and FIG. 17) indicating a registration order of input/output units is set at the initial value "1". Further, the registrations of input/output units (step ST250) and the registrations of circuit modules (step ST310) are all initialized and brought to the unregistered state. Note that, the "registration" carried out for the input/output units and circuit modules will be explained in the later steps.

Step ST215

The input/output unit unconnected at present is registered as the i-th input/output unit. When there are a plurality of unconnected input/output units, any one is selected from among those and defined as the i-th input/output unit.

Step ST220

Circuit modules satisfying all of the following four conditions are searched for:

(1) Able to be connected to the i-th input/output unit.

(2) Judged not faulty in the inspection of step ST105

(3) Not connected to the first to the (i−1)th input/output units (that is, already registered input/output units) in a case where the number i is 2 or more.

(4) Not registered as a connection prohibited circuit module with respect to the i-th input/output unit.

Step ST225

When circuit modules satisfying the conditions of step ST220 are found, the routine shifts to step ST230, while when they are not found, the routine shifts to step ST300.

Step ST230

One circuit module satisfying the conditions of step ST200 is selected.

Step ST235

The circuit module selected at step ST230 is connected to the i-th input/output unit.

Step ST240

It is judged if an input/output unit different from the i-th input/output unit is connected to the circuit module selected at step ST230. When a different input/output unit is connected, the routine shifts to step ST245, while when it is not connected, the routine returns to step ST205.

Step ST245

"1" is added to the number i and the routine shifts to step ST250.

Step ST250

The different input/output unit connected to the circuit module selected at step ST230 is disconnected from the circuit module. Further, the input/output unit disconnected from the circuit module is registered as the i-th input/output unit, and the circuit module search of step ST220 is carried out again.

Step ST300

When the circuit module satisfying the conditions is not found by the search of step ST220, it is judged if the present number i is "1". Namely, it is judged if the present i-th input/output unit is the input/output unit registered first after the initialization of the registration of step ST210. If it is that input/output unit, it can be considered that any circuit module which can be connected to the first input/output unit does not satisfy the condition (2) of step ST220 (that is, there is a fault), therefore a circuit module having a fault will be connected to the first input/output unit no matter what connection pattern is employed. For this reason, in this case, it is judged that the search of the connection pattern has failed and the search processing ends.

Steps S305, ST310, and ST315

When it is judged that the present number i is not "1" at step ST300, the circuit module is disconnected from the (i−1)th input/output unit registered one time before the present i-th input/output unit, and this disconnected circuit module is connected to the i-th circuit module-again. Then, the circuit module disconnected from this (i−1)th input/output unit is registered as a connection prohibited circuit module with respect to the (i−1)th input/output unit. Further, the registration of the present i-th input/output unit is erased, and the state is returned back to the unregistered state. By the above processing (ST305, ST310, and ST315), the present connection pattern returns to the state where the (i−1)th input/output unit was unconnected.

Step ST320

"1" is subtracted from the number i, and the circuit module search of step ST220 is carried out again.

Here, a specific example of the connection pattern search processing shown in FIG. 16 and FIG. 17 will be explained with reference to FIGS. 18A to 18C.

Figure 18A:
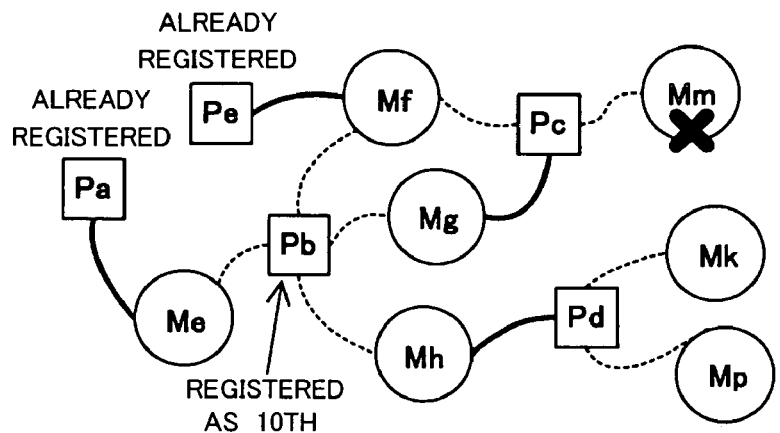
FIGS. 18A to 18C are diagrams for explaining a specific example of the connection pattern search processing.
Figure 18B:
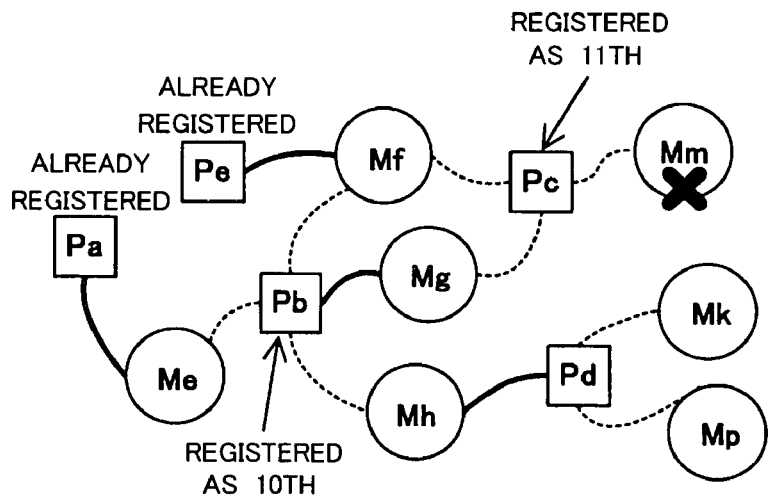
Figure 18C:
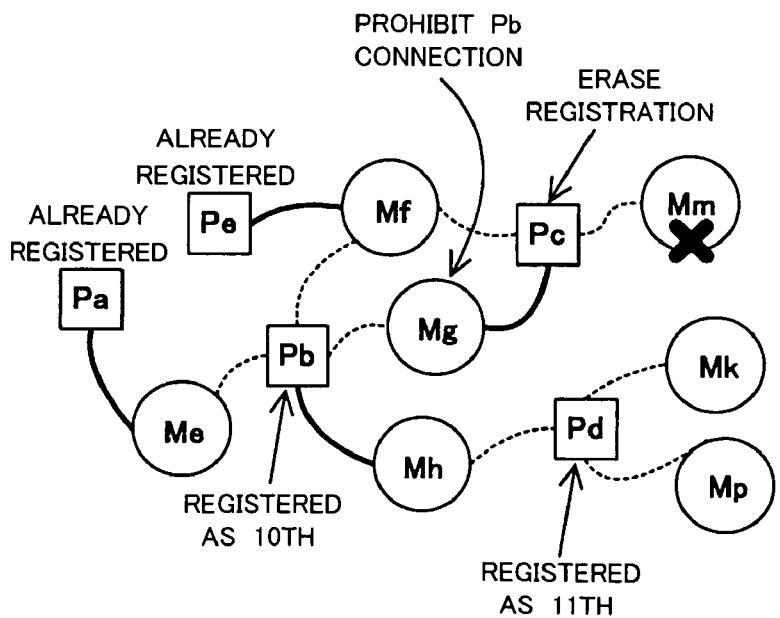

At step ST250, an input/output unit Pb is registered as the 10th input/output unit (FIG. 18A). At this time, the number i is "10".

There are four circuit modules (Me, Mf, Mg, Mh) which can be connected to the input/output unit Pb. Among these, the circuit modules Me and Mf are connected to the already registered input/output units (Pa, Pe), therefore the condition of (3) explained above is not satisfied. The circuit modules Mg and Mh satisfy all of the conditions (1) to (4). Therefore, at step ST220, two circuit modules (Mg, Mh) are retrieved.

At step ST230, the circuit module Mg between these two circuit modules (Mg, Mh) is selected. The circuit module Mg is connected to the input/output unit Pb at step ST235. Here, the input/output unit Pc is connected to the circuit module Mg, therefore the input/output unit Pc is disconnected from the circuit module Mg at step ST250, and the input/output unit Pc which becomes unconnected is registered as the 11th input/output unit (FIG. 18B). At this time, the number i is "11".

There are two circuit modules (Mf, Mm) which can be connected to the input/output unit Pc. Among these, the circuit module Mf is connected to the already registered input/output units (Pa, Pe), therefore the condition of (3) explained above is not satisfied. Namely, there is no circuit module satisfying the conditions of step ST220. For this reason, the processing shifts from step ST225 to step ST300.

At this time, the number i is "11", therefore the processing shifts from step ST300 to step ST305.

At step ST305, the circuit module Mg is disconnected from the input/output unit Pb as the 10th input/output unit. This disconnected circuit module Mg is connected to the original input/output unit Pc. Further, at step ST310, the circuit module Mg disconnected from the input/output unit Pb is registered as the connection prohibited circuit module with respect to the input/output unit Pb. Then, at step ST315, the registration of the 11th input/output unit is erased, and the unregistered state is exhibited for the 11th input/output unit.

When the processing of steps ST305, ST310, and ST315 returns to the connection pattern shown in FIG. 18A, the number i is subtracted from "11" to "10" at step ST320, then the search of the circuit modules is carried out again at step ST220.

Among the four circuit modules (Me, Mf, Mg, Mh) to which the input/output unit Pb can be connected, the circuit modules Me and Mf do not satisfy the condition (3), and the circuit module Mg does not satisfy the condition (4). Only the circuit module Mh satisfies all of the conditions (1) to (4). Therefore, at step ST220, only the circuit module Mh is retrieved.

At step ST230, this circuit module Mh is selected. The circuit module Mh is connected to the input/output unit Pb at step ST235. Here, the input/output unit Pd is connected to the circuit module Mh, therefore the input/output unit Pd is disconnected from the circuit module Mh at step ST250, and the input/output unit Pd which becomes unconnected is registered as the 11th input/output unit (FIG. 18C).

By the semiconductor integrated circuit according to the present embodiment, by increasing the number of circuit modules which can be selectively connected with respect to one input/output unit to three or more, the patterns connecting input/output units and circuit modules in a one-to-one correspondence can be increased, therefore it becomes possible to flexibly repair faults occurring in a variety of manners. Further, by the increase of the connection patterns, even when the structure becomes complex, a connection pattern for circumventing the faults can be found according to the routine as shown in FIG. 16 and FIG. 17.

Ninth Embodiment

Next, a ninth embodiment of the present invention will be explained.

Figure 19:
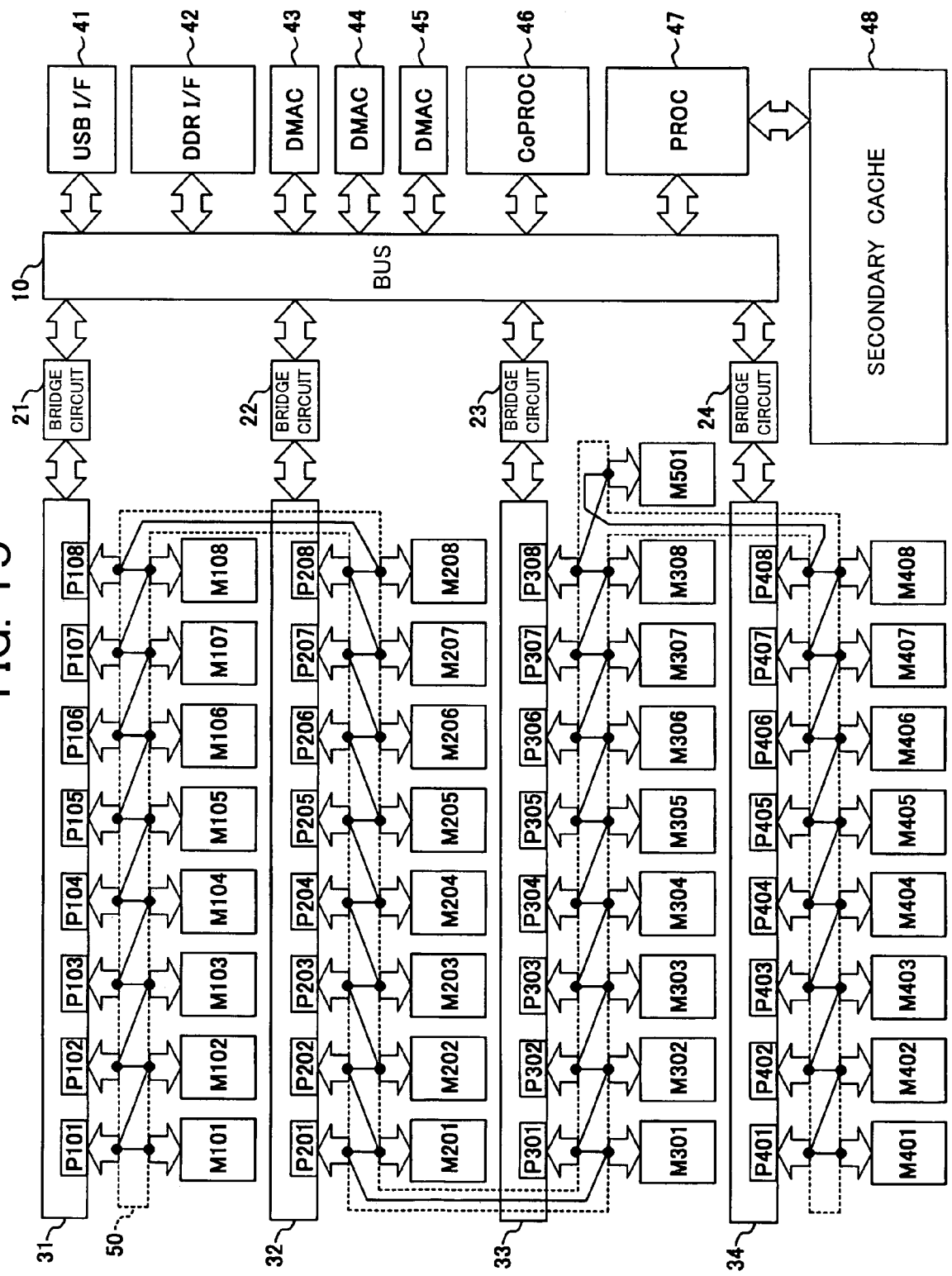
FIG. 19 is a diagram showing an example of the configuration of a semiconductor integrated circuit according to a ninth embodiment of the present invention.
Figure 21:
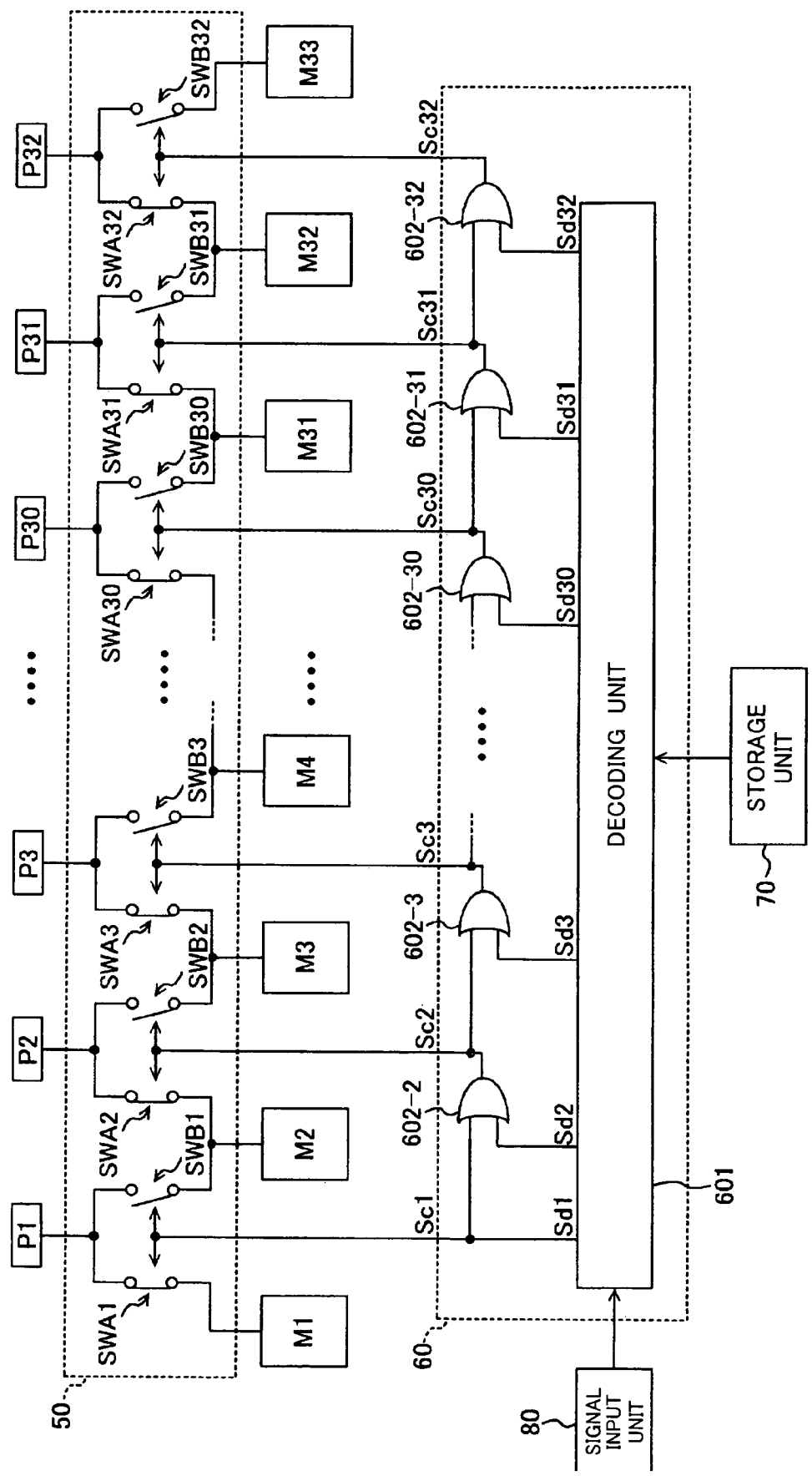
FIG. 21 is a diagram showing an example of the configuration of a portion relating to switching control of circuit modules in the semiconductor integrated circuit shown in FIGS. 18A to 18C.

FIG. 19 is a diagram showing an example of the configuration of the semiconductor integrated circuit according to the ninth embodiment. The semiconductor integrated circuit according to the present embodiment, for example as shown in FIG. 19, has circuit modules M101 to M108, M201 to M208, M301 to M308, M401 to M408, and M501, a bus 10, bridge circuits 21 to 24, switch networks 31 to 34, a universal serial bus (USB) interface circuit 41, a double data rate dynamic random access memory (DDR DRAM) interface circuit 42, direct memory access (DMA) controllers 43 to 45, a supervisor processor 47, a co-processor 46, a secondary cache 48, and a circuit module selection unit 50. Further, the semiconductor integrated circuit according to the present embodiment has a control unit 60, storage unit 70, and signal input unit 80 as shown in FIG. 21 explained later as components according to the switching control of circuit modules.

The circuit modules M101 to M108, M201 to M208, M301 to M308, M401 to M408, and M501 are sets of circuits each having predetermined functions and which can replace each other's functions.

Figure 20:
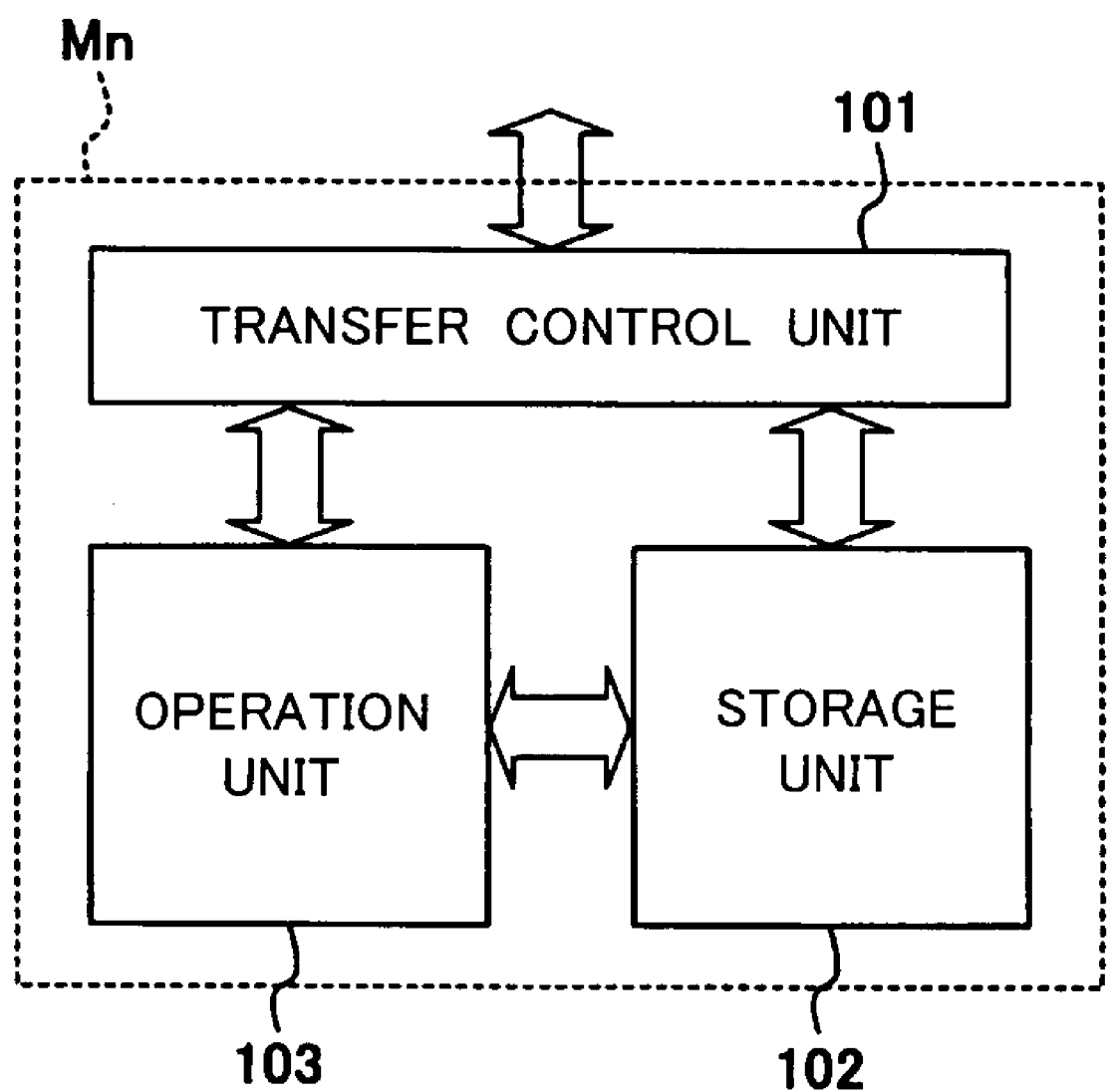
FIG. 20 is a diagram showing an example of the configuration of a circuit module.

Each circuit module, for example as shown in FIG. 20, has a transfer control unit 101, operation unit 103, and storage unit 102.

The transfer control unit 101 controls the transfer of the data input/output via (through-hole) the input/output units (P101, P102, . . . ) of the switch networks 31 to 34. The operation unit 103 executes an operation in accordance with command codes stored in the storage unit 102. The operation unit 103, for example, mounts an arithmetic logical unit (ALU) and sequencer circuit. The sequencer circuit controls the ALU in response to the above command codes to execute various operations. The storage unit 102 stores the command codes executed in the operation unit 103, the data utilized for the processing of the operation unit 103, the data output from the operation unit 103, etc. as processing results. Further, it temporarily stores the data input/output at the transfer control unit 101.

The circuit module shown in FIG. 20 executes processing according to the group of command codes supplied through for example the input/output units of the switch networks 31 to 34. The group of command codes is transferred from the supervisor processor 47 etc. directed to the individual input/output units, therefore, when the connection between the input/output units and circuit modules is switched by the circuit module selection unit 50 explained later, different groups of command codes will be supplied to the circuit modules. For this reason, the processing function of the circuit module changes in accordance with the input/output unit as the destination of connection.

Each of the switch networks 31 to 34 has eight input/output units connected to circuit modules. Namely, the switch network 31 has the input/output units P101 to P108, the switch network 32 has the input/output units P201 to P208, the switch network 33 has the input/output units P301 to P308, and the switch network 34 has the input/output units P401 to P408. The switch networks 31 to 34 connect eight input/output units to each other so that the circuit modules can exchange data with respect to each other. Further, they connect bridge circuits and input/output units so that the circuit modules can exchange data with units (41 to 47) on the bus 10 via (through-hole) the bridge circuits (21, 22, . . . )

The bridge circuits 21 to 24 are controlled to transfer data to each other between the switch networks 31 to 34 and the bus 10.

The bus 10 is controlled so that circuit modules of the switch networks 31 to 34 connected via (through-hole) the bridge circuits 21 to 24 and units such as the supervisor processor 47 can transfer data to each other.

The bus configured by the switch networks 31 to 34, the bridge circuits 21 to 24, and the bus 10 may be of any structure. For example, it may be based on for example the advanced extensible interface (AXI) or other bus standard.

The bus 10 has the USB interface circuit 41, the DDR DRAM interface circuit 42, the DMA controllers 43 to 45, the supervisor processor 47, and the co-processor 46 connected to it. The USB interface circuit 41 is controlled to communicate with the USB apparatus. The DDR DRAM interface circuit 42 is controlled so that each unit connected to the bus 10 accesses the DDR DRAM. The DMA controllers 43 to 45 perform control for transferring data by DMA between units connected to the bus 10. Three DAM controllers independently transfer data of the three channels. The supervisor processor 47 centrally controls the entire operation of the system. The secondary cache 48 is connected to the supervisor processor 47 and temporarily stores data having a high usage frequency. The co-processor 46 assists the operation and processing in the supervisor processor 47.

The circuit module selection unit 50 selects 32 circuit modules from among 33 circuit modules (M101 to M108, M201 to M208, M301 to M308, M401 to M408, M501) in response to the control signal supplied from the control unit 60 and connects these to 32 input/output units (P101 to P108, P201 to P208, P301 to P308, P401 to P408) in a one-to-one correspondence. Further, one circuit module selected from two circuit modules in response to the above control signal is connected to each of 32 input/output units.

Here, the circuit module selection unit 50 and the portion concerned with the control thereof will be explained with reference to FIG. 21. Note that, for the convenience of explanation, in FIG. 21, the notations of circuit modules and input/output units are replaced as follows:

(Circuit Modules)
M101, . . . , M108→M1, . . . , M8;
M208, . . . , M201→M9, . . . , M16;
M301, . . . , M308→M17, . . . , M24;
M408, . . . , M401→M26, . . . , M33;
M501→M25;
(Input/Output Units)
P101, . . . , P108→P1, . . . , P8;
P208, . . . , P201→P9, . . . , P16;
P301, . . . , P308→P17, . . . , P24;
P408, . . . , P401→P25, . . . , P32;

The circuit module selection unit 50, for example as shown in FIG. 21, has switch circuits SWA1 to SWA32 and switch circuits SWB1 to SWB32. The group of the switch circuits SWA1 to SWA32 is an embodiment of the first switch group of the present invention. The group of the switch circuits SWB1 to SWB32 is an embodiment of the second switch group of the present invention.

The switch circuit SWAi (i indicates an integer from 1 to 32, same true below in the present embodiment) is connected between the input/output unit Pi and the circuit module Mi, turns on when a control signal Sci supplied from the control unit 60 has the value "0", and turns off when the control signal Sci has the value "1".

The switch circuit SWBi is connected between the input/output unit Pi and the circuit module M(i+1), turns off when the control signal Sci has the value "0", and turns on when the control signal Sci has the value "1".

The switch circuit SWAi has at least one circuit for turning on/off a signal Sin transmitted from the input/output unit Pi to the circuit module Mi and at least one circuit for turning on/off a signal Sout transmitted from the circuit module Mi to the input/output unit Pi. In the same way, the switch circuit SWBi has at least one circuit for turning on/off the signal Sin transmitted from the input/output unit Pi to the circuit module M(i+1) and at least one circuit for turning on/off the signal Sout transmitted from the circuit module M(i+1) to the input/output unit Pi. Below, the circuits for turning on/off individual signals will be called switch elements. Some examples of their configurations thereof will be explained below.

Figure 22:
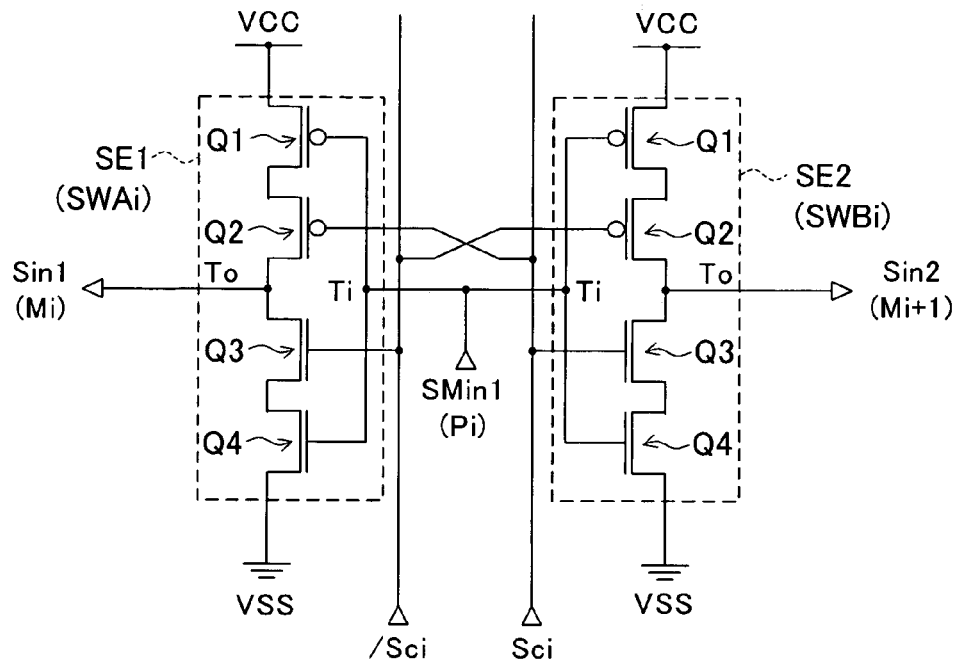
FIG. 22 is a diagram showing a first example of the configuration of a switch element for turning on/off a signal transmitted from an input/output unit to a circuit module.

FIG. 22 is a diagram showing a first example of the configuration of switch elements for turning on/off a signal transmitted from an input/output unit to a circuit module.

A switch element SE1 shown in FIG. 22 is a circuit for turning on/off a signal Sin1 transmitted from the input/output unit Pi to the circuit module Mi and is included in the switch circuit SWAi. The switch element SE1 has an input terminal Ti for receiving as input the signal from the input/output unit Pi and an output terminal To for outputting the signal to the circuit module Mi. When the control signal Sci has the value "0" (low level), the signal input to the input terminal Ti is logically inverted and output from the output terminal To, while when the control signal Sci has the value "1" (high level), the output terminal To is brought to a high impedance state.

A switch element SE2 shown in FIG. 22 is a circuit for turning on/off a signal Sin2 transmitted from the input/output unit Pi to the circuit module Mi(i+1) and is included in the switch circuit SWBi. The switch element SE2 has an input terminal Ti for receiving as input the signal from the input/output unit Pi and an output terminal To for outputting the signal to the circuit module Mi(i+1). When the control signal Sci has the value "1" (high level), the signal input to the input terminal Ti is logically inverted and output from the output terminal To, while when the control signal Sci has the value "0" (low level), the output terminal To is brought to the high impedance state. Further, the switch element SE2 connects the output terminal To to the ground line VSS when a signal designating disconnection of the circuit module (i+1) as the destination of connection from all input/output units is input.

Both of the switch elements SE1 and SE2 have four transistors (Q1 to Q4). The p-type MOS transistors Q1 and Q2 are connected in series between the power supply line VCC and the output terminal To, and the n-type MOS transistors Q3 and Q4 are connected in series between the output terminal To and the ground line VSS. Gates of the p-type MOS transistors Q1 and Q4 receive as input a signal SMin1 from the input/output unit Pi.

In the switch element SE1, the control signal Sci is input to the gate of the p-type MOS transistor Q2. A control signal /Sci obtained by inverting the logic of the control signal Sci in a not shown inverter circuit is input to the gate of the n-type MOS transistor Q3. On the other hand, in the switch element SE2, the control signal /Sci obtained by inversion of the logic explained above is input to the gate of the p-type MOS transistor Q2, and the control signal Sci is input to the gate of the n-type MOS transistor Q3.

When the control signal Sci is at the low level (value "0"), in the switch element SE1, the p-type MOS transistor Q2 and the n-type MOS transistor Q3 turn on, therefore the switch element SE1 operates as an inverter circuit. The signal SMin1 from the input/output unit Pi is logically inverted by this inverter circuit and input to the circuit module Mi. Further, in the switch element SE2, the p-type MOS transistor Q2 and the n-type MOS transistor Q3 turn off, the output terminal To becomes the high impedance state, and the circuit module M(i+1) and the input/output unit Pi are disconnected. When the control signal Sci is at the high level (value "1"), the switch element SE2 operates as an inverter circuit reverse to that explained above. The signal SMin1 from the input/output unit Pi is logically inverted by this inverter circuit and input to the circuit module M(i+1). Further, in the switch element SE1, the output terminal To becomes the high impedance state, and the circuit module Mi and the input/output unit Pi are disconnected.

Figure 23:
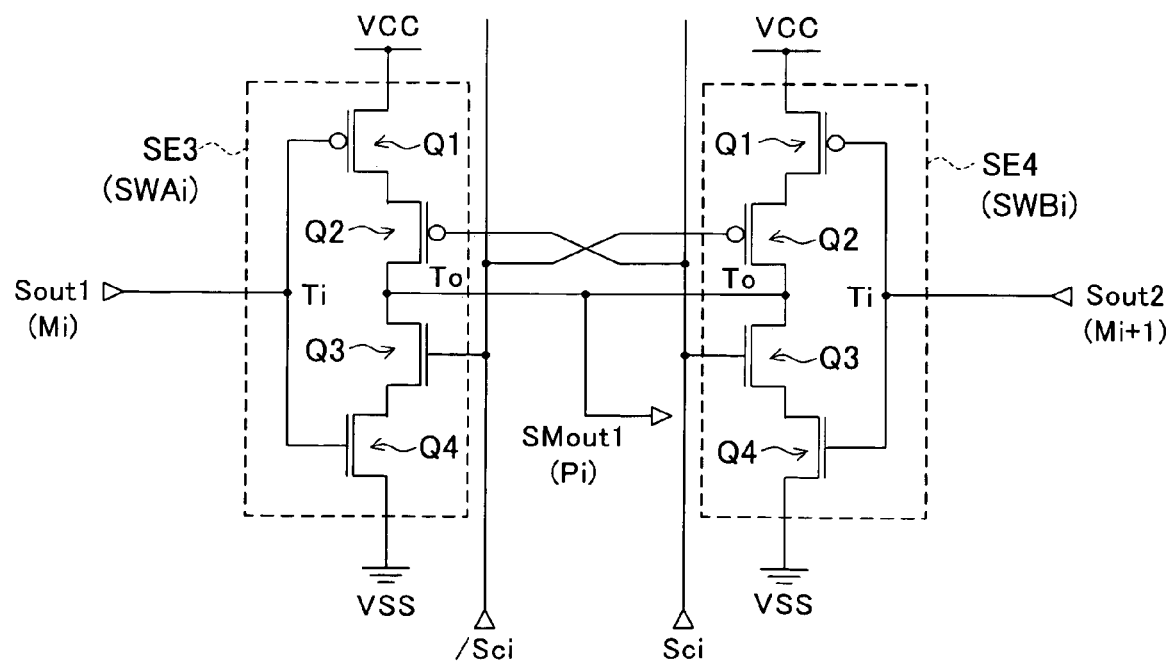
FIG. 23 is a diagram showing a first example of the configuration of a switch element for turning on/off a signal transmitted from a circuit module to an input/output unit.

FIG. 23 is a diagram showing a first example of configuration of the switch elements for turning on/off a signal transmitted from a circuit module to an input/output unit. A switch element SE3 shown in FIG. 23 is a circuit for turning on/off the signal Sout1 transmitted from the circuit module Mi to the input/output unit Pi and is included in the switch circuit SWAi.

The switch element SE3 has an input terminal Ti for receiving as input a signal from the circuit module Mi and an output terminal To for outputting a signal to the input/output unit Pi. When the control signal Sci has the value "0" (low level), the signal input to the input terminal Ti is logically inverted and output from the output terminal To, while when the control signal Sci has the value "1" (high level), the output terminal To is brought to the high impedance state.

A switch element SE4 shown in FIG. 23 is a circuit for turning on/off the signal Sout2 transmitted from the circuit module M(i+1) to the input/output unit Pi and included in a switch circuit SWBi. The switch element SE4 has an input terminal Ti for receiving as input a signal from the circuit module M(i+1) and an output terminal To for outputting a signal to the input/output unit Pi. When the control signal Sci has the value "1" (high level), the signal input to the input terminal Ti is logically inverted and output from the output terminal To, while when the control signal Sci has the value "0" (low level), the output terminal To is brought to the high impedance state.

The switch elements SE3 and SE4 have four transistors (Q1 to Q4) in the same way as the switch elements SE1 and SE2. The p-type MOS transistors Q1 and Q2 are connected in series between the power supply line VCC and the output terminal To, while the n-type MOS transistors Q3 and Q4 are connected in series between the output terminal To and the ground line VSS.

In the switch element SE3, the control signal Sci is input to the gate of the p-type MOS transistor Q2, the control signal /Sci is input to the gate of the n-type MOS transistor Q3, and the signal Sout1 from the circuit module Mi is input to gates of the p-type MOS transistors Q1 and Q4. On the other hand, in the switch element SE4, the control signal /Sci is input to the gate of the p-type MOS transistor Q2, the control signal Sci is input to the gate of the n-type MOS transistor Q3, and the signal Sout2 from the circuit module M(i+1) is input to the gates of the p-type MOS transistors Q1 and Q4.

When the control signal Sci is at the low level (value "0"), the p-type MOS transistor Q2 and the n-type MOS transistor Q3 turn on in the switch element SE3, and the switch element SE3 operates as the inverter circuit. The signal Sout1 from the circuit module Mi is logically inverted by this inverter circuit and input to the input/output unit Pi. Further, in the switch element SE4, the p-type MOS transistor Q2 and the n-type MOS transistor Q3 turn off, the output terminal To becomes the high impedance state, and the circuit module M(i+1) and the input/output unit Pi are disconnected. When the control signal Sci is at the high level (value "1"), the switch element SE4 operates as the inverter circuit reverse to that explained above. The signal Sout2 from the circuit module (i+1) is logically inverted at this inverter circuit and input to the input/output unit Pi. In the switch element SE3, the output terminal To becomes the high impedance state, and the circuit module Mi and the input/output unit Pi are disconnected.

Figure 24:
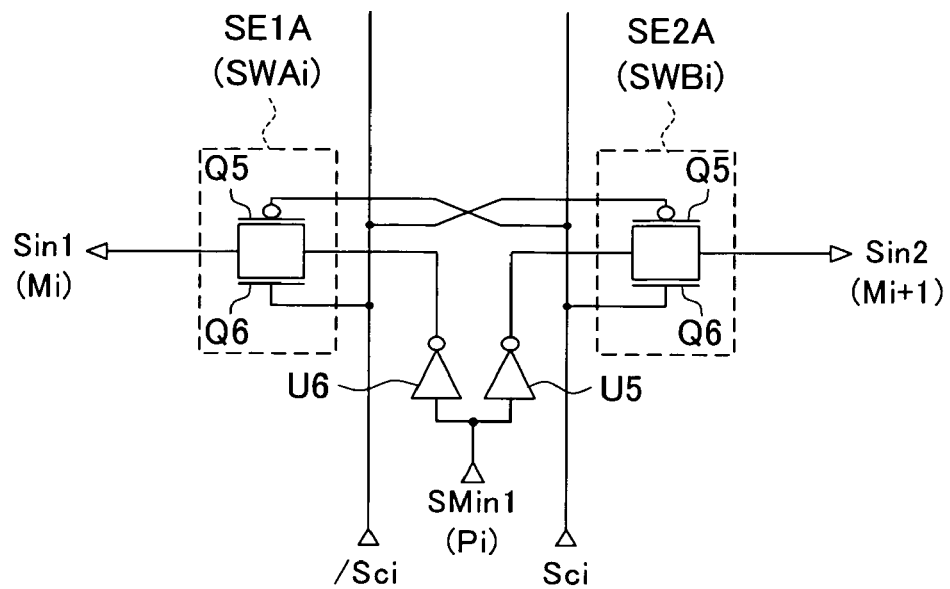
FIG. 24 is a diagram showing a second example of the configuration of a switch element for turning on/off a signal transmitted from an input/output unit to a circuit module.

FIG. 24 is a diagram showing a second example of the configuration of the switch elements for turning on/off a signal transmitted from an input/output unit to a circuit module.

A switch element SE1A shown in FIG. 24 is a circuit for turning on/off the signal Sin1 transmitted from the input/output unit Pi to the circuit module Mi in the same way as the switch element SE1 shown in FIG. 22 and is included in the switch circuit SWAi. The switch element SE1A has a transmission gate circuit inserted in a path for transmitting the signal from the input/output unit Pi to the circuit module Mi. This transmission gate circuit is configured by a p-type MOS transistor Q5 and an n-type MOS transistor Q6 connected in parallel.

The switch element SE2A shown in FIG. 24 is a circuit for turning on/off the signal Sin2 transmitted from the input/output unit Pi to the circuit module M(i+1) in the same way as the switch element SE2 shown in FIG. 22 and is included in the switch circuit SWBi. The switch element SE2A has a transmission gate circuit inserted in a path for transmitting the signal from the input/output unit Pi to the circuit module M(i+1). This transmission gate circuit is configured by the p-type MOS transistor Q5 and the n-type MOS transistor Q6 connected in parallel in the same way as the switch element SE1A.

In the switch element SE1A, the control signal Sci is input to the gate of the p-type MOS transistor Q5, and the logically inverted control signal /Sci is input to the gate of the n-type MOS transistor Q6. On the other hand, in the switch element SE2A, the logically inverted control signal /Sci is input to the gate of the p-type MOS transistor Q5, and the control signal Sci is input to the gate of the n-type MOS transistor Q6.

When the control signal Sci is at the low level (value "0"), the p-type MOS transistor Q5 and the n-type MOS transistor Q6 of the switch element SE1A are driven ON, and the switch element SE1A becomes the conductive state. The signal SMin1 output from the input/output unit Pi is input via (through-hole) the switch element SE1A to the circuit module Mi. Further, the p-type MOS transistor Q5 and the n-type MOS transistor Q6 of the switch element SE2A are driven OFF, the switch element SE2A becomes cut off, and the circuit module M(i+1) and the input/output unit Pi are disconnected. When the control signal Sci is at the high level (value "1"), the switch element SE2A becomes the conductive state reverse to that explained above. The signal SMin1 output from the input/output unit Pi is input via (through-hole) the switch element SE2A to the circuit module M(i+1). Further, the switch element SE1A becomes cut off, and the circuit module Mi and the input/output unit Pi are disconnected.

Note that, in the example of FIG. 24, in order to reduce the signal delay due to the resistance component of the transmission gate circuit, the inverter circuits U5 and U6 are inserted in paths on the input side (input/output unit side) of the switch elements SE1A and SE2A.

Figure 25:
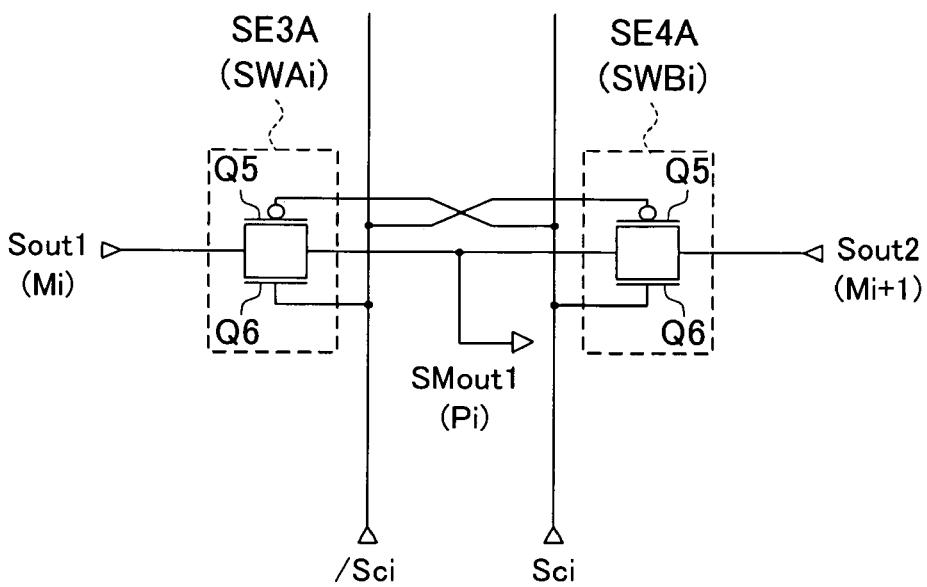
FIG. 25 is a diagram showing a second example of the configuration of a switch element for turning on/off a signal transmitted from a circuit module to an input/output unit.

FIG. 25 is a diagram showing a second example of the configuration of the switch elements for turning on/off a signal transmitted from a circuit module to an input/output unit.

A switch element SE3A shown in FIG. 25 is a circuit for turning on/off the signal Sout1 transmitted from the circuit module Mi to the input/output unit Pi in the same way as the switch element SE3 shown in FIG. 23 and is included in the switch circuit SWAi. The switch element SE3A has a transmission gate circuit inserted in the path for transmitting the signal from the circuit module Mi to the input/output unit Pi. This transmission gate circuit is configured by a p-type MOS transistor Q5 and an n-type MOS transistor Q6 connected in parallel.

A switch element SE4A shown in FIG. 25 is a circuit for turning on/off the signal Sout2 transmitted from the circuit module M(i+1) to the input/output unit Pi in the same way as the switch element SE4 shown in FIG. 23 and is included in the switch circuit SWBi. The switch element SE4A has a transmission gate circuit inserted in the path for transmitting the signal from the circuit module M(i+1) to the input/output unit Pi. This transmission gate circuit is configured by a p-type MOS transistor Q5 and an n-type MOS transistor Q6 connected in parallel in the same way as the switch element SE3A.

In the switch element SE3A, the control signal Sci is input to the gate of the p-type MOS transistor Q5, and the logically inverted control signal /Sci is input to the gate of the n-type MOS transistor Q6. On the other hand, in the switch element SE4A, the logically inverted control signal /Sci is input to the gate of the p-type MOS transistor Q5, and the control signal Sci is input to the gate of the n-type MOS transistor Q6.

When the control signal Sci at the low level (value "0"), the p-type MOS transistor Q5 and the n-type MOS transistor Q6 of the switch element SE3A are driven ON, and the switch element SE1A becomes the conductive state. The signal Sout1 output from the circuit module Mi is input via (through-hole) the switch element SE3A to the input/output unit Pi. Further, the p-type MOS transistor Q5 and the n-type MOS transistor Q6 of the switch element SE4A are driven OFF, the switch element SE4A becomes cut off, and the circuit module M(i+1) and the input/output unit Pi are disconnected. When the control signal Sci is at the high level (value "1"), the switch element SE4A becomes a conductive state reverse to that explained above. The signal Sout2 output from the circuit module M(i+1) is input to the input/output unit Pi via (through-hole) the switch element SE4A. Further, the switch element SE3A becomes cut off, and the circuit module Mi and the input/output unit Pi are disconnected.

Note that in order to reduce the signal delay due to the resistance component of the transmission gate circuit, the inverter circuits may be inserted in paths on the input side (circuit module side) of the switch elements SE1A and SE2A.

Figure 26:
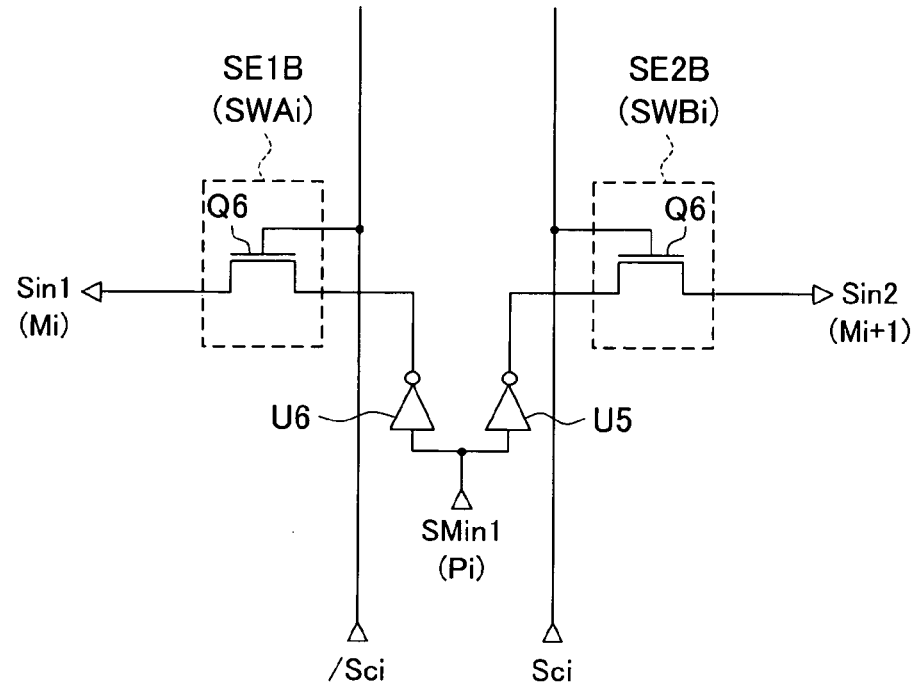
FIG. 26 is a diagram showing a third example of the configuration of a switch element for turning on/off a signal transmitted from an input/output unit to a circuit module.

FIG. 26 is a diagram showing a third example of the configuration of the switch elements for turning on/off a signal transmitted from an input/output unit to a circuit module.

The switch elements SE1B and SE2B shown in FIG. 26 are obtained by deleting the p-type MOS transistors Q5 of the switch elements SE1A and SE2A shown in FIG. 24. The basic operation is the same as that of the switch elements SE1A and SE2A. Namely, when the control signal Sci is at the low level (value "0"), the signal from the input/output unit Pi is transmitted to the circuit module Mi, and the input/output unit Pi and the circuit module M(i+1) are disconnected. When the control signal Sci is at the high level (value "1"), the signal from the input/output unit Pi is transmitted to the circuit module M(i+1), and the input/output unit Pi and the circuit module Mi are disconnected.

Figure 27:
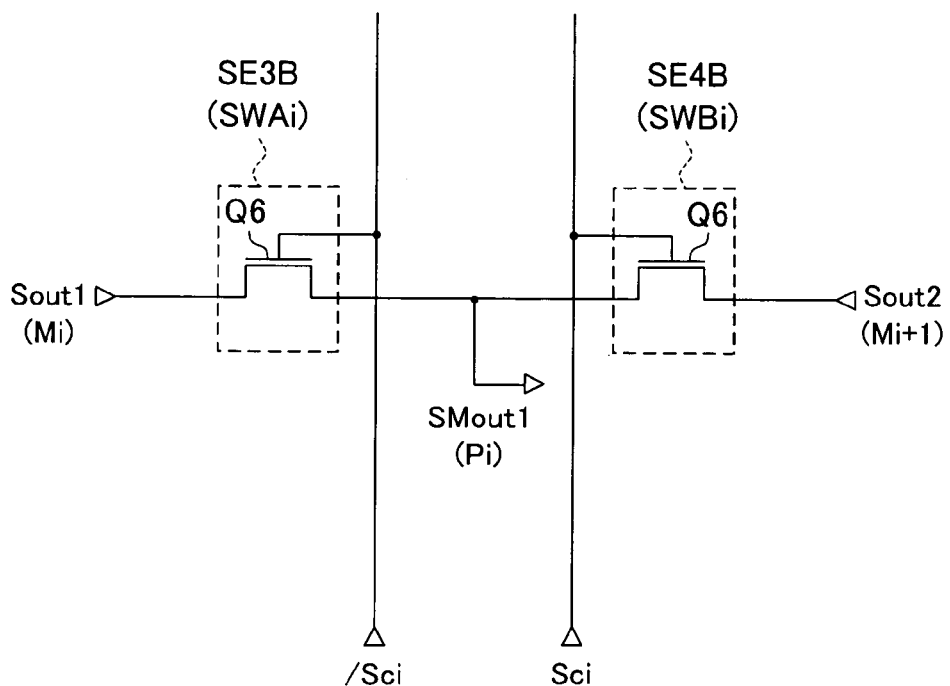
FIG. 27 is a diagram showing a third example of the configuration of a switch element for turning on/off a signal transmitted from a circuit module to an input/output unit.

FIG. 27 is a diagram showing a third example of the configuration of the switch elements for turning on/off a signal transmitted from a circuit module to an input/output unit.

The switch elements SE3B and SE4B shown in FIG. 27 are obtained by deleting the p-type MOS transistors Q5 of the switch elements SE3A and SE4A shown in FIG. 25. The basic operation is the same as that of the switch elements SE3A and SE4A. Namely, when the control signal Sci is at the low level (value "0"), the signal from the circuit module Mi is transmitted to the input/output unit Pi, and the input/output unit Pi and the circuit module M(i+1) are disconnected. When the control signal Sci is at the high level (value "1"), the signal from the circuit module M(i+1) is transmitted to the input/output unit Pi, and the input/output unit Pi and the circuit module Mi are disconnected.

Note that when signals of a high level are input to the switch elements shown in FIG. 26 and FIG. 27 (SE1B, SE2B, SE3B, SE4B), signals output after passing through these switch elements cause a voltage drop corresponding to the threshold value of the n-type MOS transistor Q6. For this reason, where the switch elements shown in FIG. 26 and FIG. 27 are used, it is required that the effect (delay, noise margin, etc.) by this voltage drop upon the circuit operation be kept in a permissible range.

Here, the structure in a case where switch elements of the first example of the configuration (FIG. 22, FIG. 23) and the second example of the configuration (FIG. 24, FIG. 25) are formed on a semiconductor substrate will be explained with reference to FIGS. 28A and 28B and FIGS. 29A and 29B.

Figure 28A:
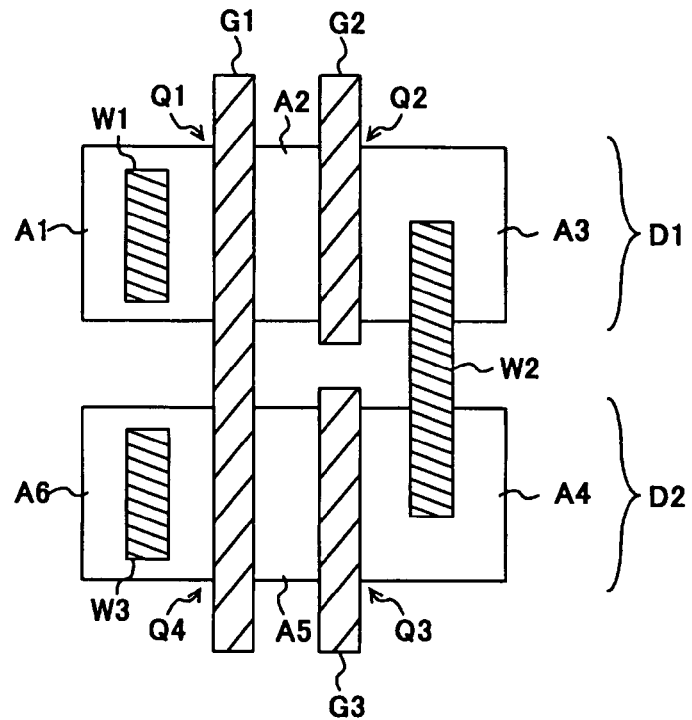
FIGS. 28A and 28B are plan views showing an example of the structure of a switch element of a first example of the configuration shown in FIG. 22 and FIG. 23.
Figure 28B:
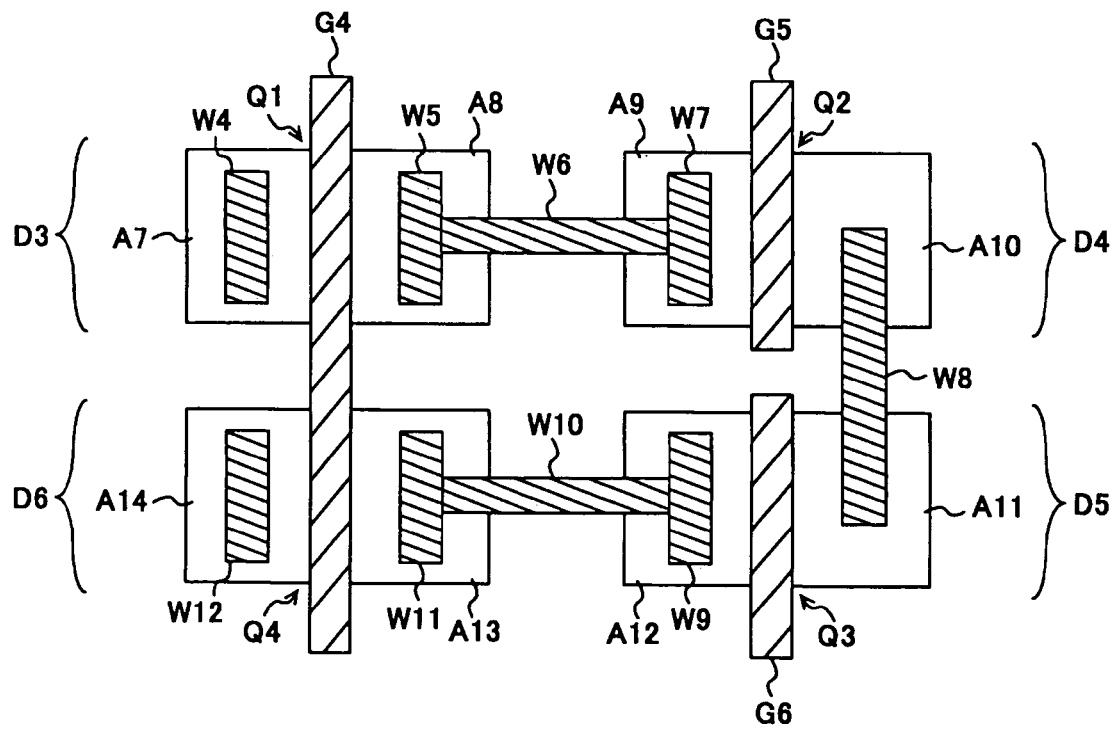

FIGS. 28A and 28B are plan views showing an example of the structure of the switch elements (SE1 to SE4) of the first example of the configuration shown in FIG. 22 and FIG. 23. FIG. 28A shows an example of a case where two MOS transistors each are formed in two active regions (D1, D2), and FIG. 28B shows an example of a case where one MOS transistor each is formed in the four active regions (D3 to D6).

In the structural example shown in FIG. 28A, the active regions D1 and D2 are formed aligned on the semiconductor substrate. An n-type impurity is introduced into the active region D1, and a p-type impurity is introduced into the active region D2. The active regions D1 and D2 have for example rectangular shapes as shown in FIG. 28A. The sizes are almost the same. A region for electrically isolating elements in different active regions from each other (element isolation region) is provided between the active regions.

On the active regions D1 and D2, gate electrodes G1 to G3 are provided via (through-hole) a not shown gate oxidation mask.

The gate electrode G1 is provided over two active regions (D1, D2). In a portion facing the gate electrode G1 in the active region D1, a channel of the p-type MOS transistor Q1 is formed. Further, in the active region D2, the channel of the n-type MOS transistor Q4 is formed in a portion facing the gate electrode G1. The gate electrode G1 corresponds to the input terminals Ti in the switch elements (SE1 to SE4) in the first example of the configuration.

The gate electrode G2 is provided on the active region D1 on the right side of the gate electrode G1 in the figure. In the active region D1, the channel of the p-type MOS transistor Q2 is formed in a portion facing the gate electrode G2. The gate electrode G3 is provided on the active region D2 on the right side of the gate electrode G1 in the figure. In the active region D2, the channel of the n-type MOS transistor Q3 is formed in a portion facing the gate electrode G3. The gate electrodes G2 and G3 correspond to terminals for receiving as input the control signal Sci or the logically inverted signal /Sci thereof.

In the active region D1, a region A1 on the left side of the gate electrode G1 corresponds to the source of the p-type MOS transistor Q1. This region A1 is connected via (through-hole) not shown vias (through-hole) to the metal interconnect W1. The metal interconnect W1 corresponds to the power supply line VCC.

A region A2 sandwiched between the gate electrodes G1 and G2 in the active region D1 corresponds to the drain of the p-type MOS transistor Q1 and the source of the p-type MOS transistor Q2. The drain of the p-type MOS transistor Q1 and the source of the p-type MOS transistor Q2 are connected to each other in this region A2.

A region A3 on the right side of the gate electrode G2 in the active region D1 corresponds to the drain of the p-type MOS transistor Q2. Further, a region A4 on the right side of the gate electrode G3 in the active region D2 corresponds to the drain of the n-type MOS transistor Q3. These regions A3 and A4 are connected via (through-hole) not shown vias (through-hole) and the metal interconnect W2 to each other. Connection points of the regions A3 and A4 correspond to the output terminals To in the switch elements (SE1 to SE4) of the first example of the configuration.

In the active region D2, a region A5 sandwiched between the gate electrodes G1 and G3 corresponds to the source of the n-type MOS transistor Q3 and the drain of the n-type MOS transistor Q4. The source of the n-type MOS transistor Q3 and the drain of the n-type MOS transistor Q4 are connected to each other in this region A5.

A region A6 on the left side of the gate electrode G1 in the active region D2 corresponds to the source of the n-type MOS transistor Q4. This region A6 is connected to the metal interconnect W3 via (through-hole) the not shown vias (through-hole). The metal interconnect W3 corresponds to the ground line VSS.

In the structural example shown in FIG. 28B, four active regions D3, D4, D5, and D6 are formed in a matrix on the semiconductor substrate. In the example of FIG. 28B, the active region D4 is formed on the right side of the active region D3, the active region D6 is formed on the lower side of the active region D3, and the active region D5 is formed on the lower side of the active region D4 and the right side of the active region D6. n-type impurities are introduced into the active regions D3 and D4, and p-type impurities are introduced into the active regions D5 and D6. The active regions D3 to D6 have rectangular shapes for example as shown in FIG. 28B. The sizes are almost the same. The element isolation region is provided between the active regions.

On the active regions D3 to D6, gate electrodes G4 to G6 are provided via (through-hole) not shown gate oxidation masks.

The gate electrode G4 is provided over the active regions D3 and D6. The channel of the p-type MOS transistor Q1 is formed in a portion facing the gate electrode G4 in the active region D3. Further, the channel of the n-type MOS transistor Q4 is formed in a portion facing the gate electrode G4 in the active region D6. The gate electrode G4 corresponds to the input terminals Ti in the switch elements (SE1 to SE4) in the first example of the configuration.

The gate electrode G5 is provided on the active region D4. The channel of the p-type MOS transistor Q2 is formed in a portion facing the gate electrode G5 in the active region D4. The gate electrode G6 is provided on the active region D5. The channel of the n-type MOS transistor Q3 is formed in a portion facing the gate electrode G6 in the active region D5. The gate electrodes G5 and G6 correspond to terminals for receiving as input the control signal Sci or the logically inverted signal /Sci thereof.

A region A7 on the left side of the gate electrode G4 in the active region D3 corresponds to the source of the p-type MOS transistor Q1. This region A7 is connected to the metal interconnect W4 via (through-hole) not shown vias (through-hole). The metal interconnect W4 corresponds to the power supply line VCC.

A region A8 on the right side of the gate electrode G4 in the active region D3 corresponds to the drain of the p-type MOS transistor Q1. Further, a region A9 on the left side of the gate electrode G5 in the active region D4 corresponds to the source of the p-type MOS transistor Q2. These regions A8 and A9 are connected to each other via (through-hole) not shown vias (through-hole) and metal interconnects W5 W6, and W7.

A region A10 on the right side of the gate electrode G5 in the active region D4 corresponds to the drain of the p-type MOS transistor Q2. Further, a region A11 on the right side of the gate electrode G6 in the active region D5 corresponds to the drain of the n-type MOS transistor Q3. These regions A3 and A4 are connected to each other via (through-hole) not shown vias (through-hole) and a metal interconnect W8. The connection points of the regions A10 and A11 correspond to the output terminals To in the switch elements (SE1 to SE4) in the first example of the configuration.

A region A12 on the left side of the gate electrode G6 in the active region D5 corresponds to the source of the n-type MOS transistor Q3. Further, a region A13 on the right side of the gate electrode G4 in the active region D6 corresponds to the drain of the n-type MOS transistor Q1. These regions A12 and A13 are connected to each other via (through-hole) not shown vias (through-hole) and metal interconnects W9, W10, and W11.

A region A14 on the left side of the gate electrode G1 in the active region D6 corresponds to the source of the n-type MOS transistor Q4. This region A14 is connected to a metal interconnect W12 via (through-hole) not shown vias (through-hole). The metal interconnect W3 corresponds to the ground line VSS.

Figure 29A:
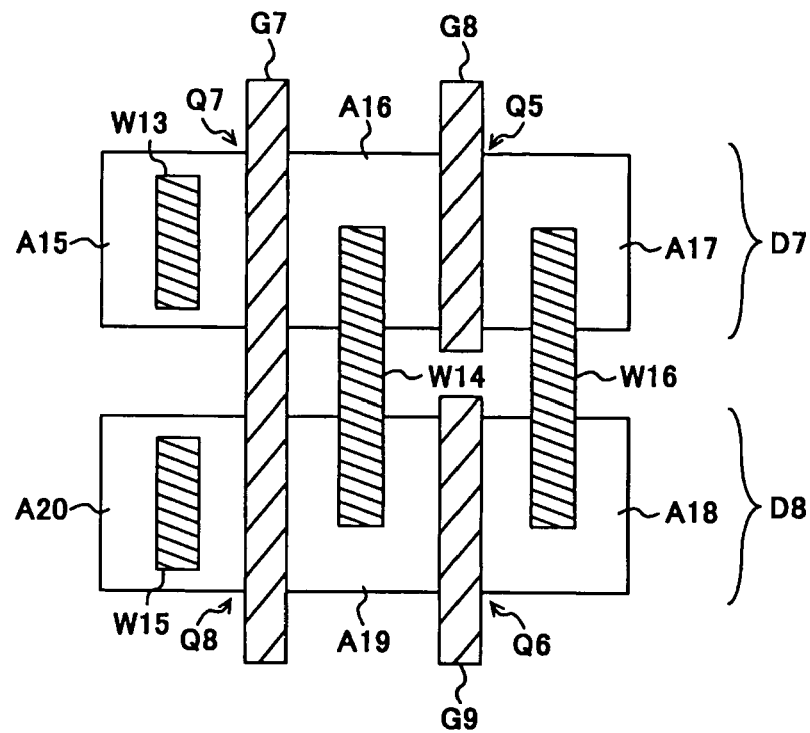
FIGS. 29A and 29B are plan views showing an example of the structure of a switch element of a second example of the configuration shown in FIG. 24 and FIG. 25.
Figure 29B:
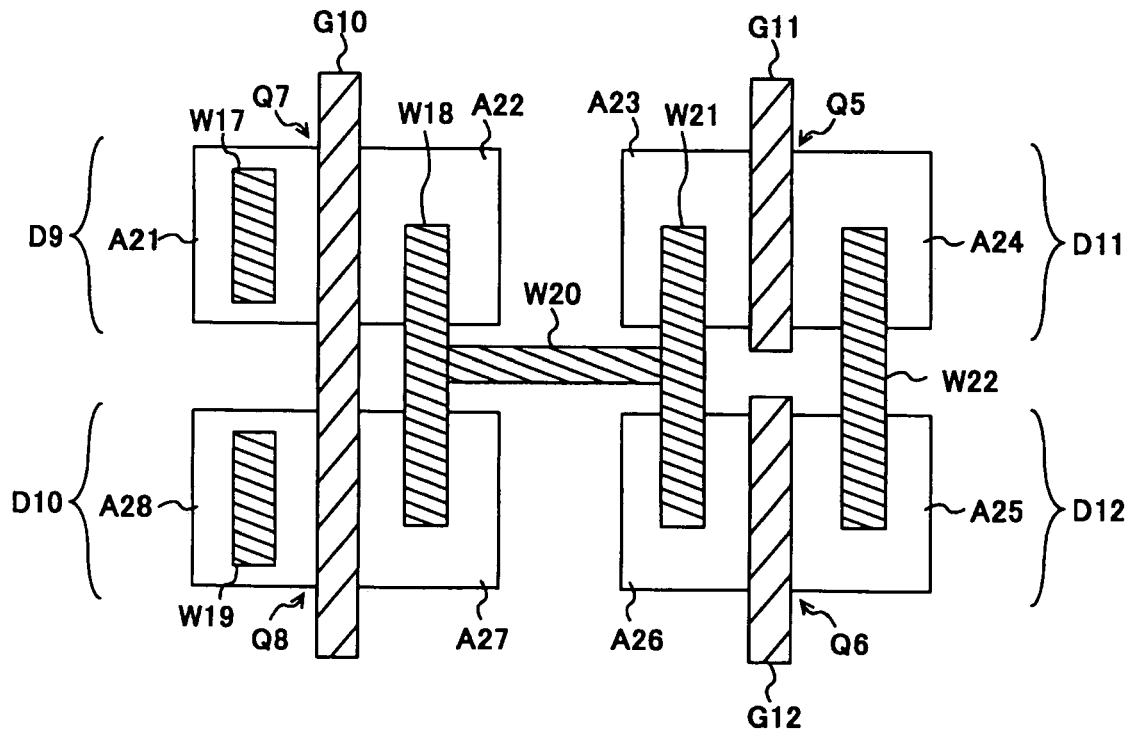

FIGS. 29A and 29B are plan views showing an example of the structure of switch elements (SE1A to SE4A) in the second example of the configuration shown in FIG. 24 and FIG. 25. FIG. 29A shows an example of a case where two MOS transistors each are formed in the two active regions (D7, D8), and FIG. 29B shows an example of a case where one MOS transistor each is formed in the four active regions (D9 to D12).

In the structural example shown in FIG. 29A, the active regions D7 and D8 are formed aligned on the semiconductor substrate. An n-type impurity is introduced into the active region D7, and a p-type impurity is introduced into the active region D8. The active regions D7 and D8 have rectangular shapes as shown in for example FIG. 29A. The sizes are almost the same. An element isolation region is provided between the active regions.

On the active regions D7 and D8, gate electrodes G7 to G9 are provided via (through-hole) not shown gate oxidation masks.

The gate electrode G7 is provided over two active regions (D7, D8). The channel of the p-type MOS transistor Q7 is formed in a portion facing the gate electrode G7 in the active region D7. Further, the channel of the n-type MOS transistor Q8 is formed in a portion facing the gate electrode G7 in the active region D8.

Note that the p-type MOS transistor Q7 and the n-type MOS transistor Q8 are transistors configuring the inverter circuit inserted in the path on the input side of each of the switch elements (SE1A to SE4A). The gate electrode G7 corresponds to the input terminal of this inverter circuit.

The gate electrode G8 is provided on the active region D7 on the right side of the gate electrode G7 in the figure. The channel of the p-type MOS transistor Q5 is formed in a portion facing the gate electrode G8 in the active region D7. The gate electrode G9 is provided on the active region D8 on the right side of the gate electrode G7 in the figure, and the channel of the n-type MOS transistor Q6 is formed in a portion facing the gate electrode G9 in the active region D8. The gate electrodes G8 and G9 correspond to the terminal for receiving as input the control signal Sci or the logically inverted signal /Sci thereof.

A region A15 on the left side of the gate electrode G7 in the active region D7 corresponds to the source of the p-type MOS transistor Q7. This region A15 is connected to a metal interconnect W13 via (through-hole) not shown vias (through-hole). The metal interconnect W13 corresponds to the power supply line VCC.

A region A20 on the left side of the gate electrode G7 in the active region D8 corresponds to the source of the n-type MOS transistor Q8. This region A20 is connected to a metal interconnect W15 via (through-hole) not shown vias (through-hole). The metal interconnect W15 corresponds to the power supply line VCC.

A region A16 sandwiched between the gate electrodes G7 and G8 in the active region D7 corresponds to the drain of the p-type MOS transistor Q7 and the source of the p-type MOS transistor Q5. Further, a region A19 sandwiched between the gate electrodes G7 and G8 in the active region D8 corresponds to the drain of the n-type MOS transistor Q8 and the source of the n-type MOS transistor Q6. These regions A16 and A19 are connected to each other via (through-hole) not shown vias (through-hole) and a metal interconnect W14. The connection points of the regions A16 and A19 correspond to the output terminals of the inverter circuit explained above and, at the same time, correspond to the terminals on the sides for receiving as input the signal in the switch elements (SE1A to SE4A) in the second example of the configuration.

A region A17 on the right side of the gate electrode G8 in the active region D7 corresponds to the drain of the p-type MOS transistor Q5. Further, a region A18 on the right side of the gate electrode G9 in the active region D8 corresponds to the drain of the n-type MOS transistor Q6. These regions A17 and A18 are connected to each other via (through-hole) not shown vias (through-hole) and a metal interconnect W16. The connection points of the regions A17 and A18 correspond to the terminals on the sides for outputting the signal in the switch elements (SE1A to SE4A) in the second example of the configuration.

In the structural example shown in FIG. 29B, four active regions D9, D10, D11, and D12 are formed in a matrix on the semiconductor substrate. In the example of FIG. 29B, the active region D11 is formed on the right side of the active region D9, the active region D10 is formed on the lower side of the active region D9, and the active region D12 is formed on the lower side of the active region D11 and on the right side of the active region D10. n-type impurities are introduced into the active regions D9 and D11, and p-type impurities are introduced into the active regions D10 and D12. The active regions D9 to D12 have rectangular shapes as shown in for example FIG. 29B. The sizes are almost the same. The element isolation region is provided between the active regions.

On the active regions D9 to D12, gate electrodes G10 to G12 are provided via (through-hole) not shown gate oxidation masks.

The gate electrode G10 is provided over the active regions D9 and D10. The channel of the p-type MOS transistor Q7 is formed in a portion facing the gate electrode G10 in the active region D9. The channel of the n-type MOS transistor Q8 is formed in a portion facing the gate electrode G10 in the active region D10. The gate electrode G10 corresponds to an input terminal of the inverter circuit configured by a p-type MOS transistor Q7 and an n-type MOS transistor Q8.

The gate electrode G11 is provided on the active region D11. The channel of the p-type MOS transistor Q5 is formed in a portion facing the gate electrode G11 in the active region D11. The gate electrode G12 is provided on the active region D12. The channel of the n-type MOS transistor Q6 is formed in a portion facing the gate electrode G12 in the active region D12. The gate electrodes G11 and G12 correspond to terminals for receiving as input the control signal Sci or the logically inverted signal /Sci thereof.

A region A21 on the left side of the gate electrode G10 in the active region D9 corresponds to the source of the p-type MOS transistor Q7. This region A21 is connected to a metal interconnect W17 via (through-hole) not shown vias (through-hole). The metal interconnect W17 corresponds to the power supply line VCC.

A region A28 on the left side of the gate electrode G10 in the active region D10 corresponds to the source of the n-type MOS transistor Q8. This region A28 is connected to a metal interconnect W19 via (through-hole) not shown vias (through-hole). The metal interconnect W19 corresponds to the ground line VSS.

A region A22 on the right side of the gate electrode G10 in the active region D9 corresponds to the drain of the p-type MOS transistor Q7. Further, a region A27 on the right side of the gate electrode G10 in the active region D10 corresponds to the drain of the n-type MOS transistor Q8. These regions A22 and A27 are connected to each other via (through-hole) not shown vias (through-hole) and a metal interconnect W18. The connection point of the regions A22 and A27 corresponds to the output terminal of the inverter circuit configured by a p-type MOS transistor Q7 and an n-type MOS transistor Q8.

A region A23 on the left side of the gate electrode G11 in the active region D11 corresponds to the source of the p-type MOS transistor Q5. Further, a region A26 on the left side of the gate electrode G12 in the active region D12 corresponds to the source of the n-type MOS transistor Q6. These regions A23 and A26 are connected to each other via (through-hole) not shown vias (through-hole) and a metal interconnect W21. The connection points of the regions A23 and A26 correspond to the terminals for receiving as input the signals in the switch elements (SE1A to SE4A) in the second example of the configuration.

The metal interconnects W18 and W21 are connected via (through-hole) a metal interconnect W20. Due to this, output terminals of the inverter circuits (Q7, Q8) and input terminals of the switch elements (SE1A to SE4A) are connected.

A region A24 on the right side of the gate electrode G11 in the active region D11 corresponds to the drain of the p-type MOS transistor Q5. Further, a region A25 on the right side of the gate electrode G12 in the active region D12 corresponds to the drain of the n-type MOS transistor Q6. These regions A24 and A25 are connected to each other via (through-hole) not shown vias (through-hole) and a metal interconnect W22. The connection points of the regions A24 and A25 correspond to the terminals on the sides for outputting the signals in the switch elements (SE1A to SE4A) in the second example of the configuration.

In the switch elements (SE1A to SE4A) of the second example of the configuration shown in FIG. 29A, a metal interconnect W14 and vias (through-hole) are provided in order to connect regions A16 and A19 sandwiched between the gate electrode G7 and the gate electrodes G8 and G9. On the other hand, in the switch elements (SE1 to SE4) in the first example of the configuration shown in FIG. 28(A), it is not necessary to connect regions A2 and A5 sandwiched between the gate electrode G1 and the gate electrodes G2 and G3, therefore the metal interconnect and vias (through-hole) as shown in FIG. 29A are unnecessary. Accordingly, the area of the switch elements (SE1 to SE4) of the first example of the configuration can be made smaller than that of the circuit obtained by adding inverter circuits (Q7, Q8) to the switch elements (SE1A to SE4A) of the second example of the configuration.

Note that when the transistors are formed in different active regions, as seen also by comparison of FIG. 28B and FIG. 29B, the areas of the two are not different so much. Further, when the inverter circuits (Q7, Q8) are deleted and only the switch elements (SE1A to SE4A) of the second example of the configuration are used, the area of the switch elements (SE1A to SE4A) of the second example of the configuration can be made smaller than that of the switch elements (SE1 to SE4) of the first example of the configuration. However, in this case, a signal delay occurs due to the resistance component of the transmission gate circuits (Q5, Q6), therefore the operation speed of the circuit becomes slower in comparison with the case where the switch elements (SE1 to SE4) of the first example of the configuration are used.

Above, the switch elements included in the switch circuits SWAi and SWBi of the circuit module selection unit 50 were explained.

Next, a description will be given again with reference to FIG. 21. The control unit 60 generates control signals Sc1 to Sc32 for controlling the operation of the circuit module selection unit 50 in response to the signal stored in the storage unit 70 or the signal input from the signal input unit 80.

The control unit 60 outputs the following control signals Sc1 to Sc32 in accordance with the value of the integer n when the signal stored in the storage unit 70 or the signal input from the signal input unit 80 designates to disconnect the circuit module Mn (n indicates an integer from 1 to 33, same true below in the present embodiment) from all input/output units.

[$2 \leq n \leq 32$]

In this case, the control unit 60 sets the control signals Sc1 to Sc(n−1) at the value "0" and sets the control signals Scn to Sc32 at the value "1". Due to this, the switch circuits SWA1 to SWA(n−1) turn on, the switch circuits SWAn to SWA32 turn off, the switch circuits SWB1 to SWB(n−1) turn off, and the switch circuits SWBn to SWB32 are set ON. As a result, the circuit modules M1 to M(n−1) are connected with the input/output units P1 to P(n−1) in a one-to-one correspondence, the circuit modules M(n+1) to M33 are connected with the input/output units Pn to P32 in a one-to-one correspondence, and the circuit module Mn is disconnected from all input/output units.

[n=1]

In this case, the control unit 60 sets all of the control signals Sc1 to Sc32 at the value "1". Due to this, all of the switch circuits SWA1 to SWA32 are set OFF, and all of the switch circuits SWB1 to SWB32 are set ON. As a result, the circuit modules M2 to M33 are connected with the input/output units P1 to P32 in a one-to-one correspondence, and the circuit module M1 is disconnected from all input/output units.

[n=33]

In this case, the control unit 60 sets all of the control signals Sc1 to Sc32 at the value "0". Due to this, all of the switch circuits SWA1 to SWA32 are set ON, and all of the switch circuits SWB1 to SWB32 are set OFF. As a result, the circuit modules M1 to M32 are connected with the input/output units P1 to P32 in a one-to-one correspondence, and the circuit module. M33 is disconnected from all input/output units.

When the signal stored in the storage unit 70 has the predetermined initial value, the control unit 60 generates control signals Sc1 to Sc32 in response to the signal input from the signal input unit 80, while when the signal stored in the storage unit 70 has a value different from the above predetermined initial value, it generates control signals Sc1 to Sc32 in response to the signal stored in the storage unit 70. Due to this, in the initial state where for example no signals are written in the storage unit 70 (case of inspection of the circuit modules etc.), the control signals Sc1 to Sc32 can be generated in response to the signal input from the outside of the semiconductor integrated circuit to the signal input unit 80, therefore the connections between the input/output units and the circuit modules can be freely controlled. Further, after signals are written in the storage unit 70, the control signals Sc1 to SC32 can be generated in response to a written signal, therefore the connections between the input/output units and the circuit modules can be fixed to the desired state without input of a signal from the outside.

The control unit 60, for example as shown in FIG. 21, has a decoding unit 601 and OR circuits 602-2 to 602-32.

The decoding unit 601 decodes a signal input from the storage unit 70 or the signal input unit 80 and outputs the decoding result as the signals Sd1 to Sd32. Namely, when the signal input stored in the storage unit 70 or the signal input from the signal input unit 80 designates to disconnect the circuit module Mn from all input/output units, the decoding unit 601 generates the following signals Sd1 to Sd32 in accordance with the value of the integer n. When "n" is an integer from 1 to 32, only the signal Sdn is set at "1". The other signals are set at "0". When "n" is the integer 33, all of the signals Sd1 to Sd32 are set at the value "0".

The signals Sd1 to Sd32 are signals for designating whether or not the circuit modules M1 to M32 are disconnected from all input/output units, therefore in the following explanation, these will be called "designation signals Sd1 to Sd32".

The decoding unit 601 generates designation signals Sd1 to Sd32 in response to a signal input from the signal input unit 80 when the signal stored in the storage unit 70 has the above predetermined initial value and generates the designation signals Sd1 to Sd32 in response to a signal stored in the storage unit 70 where the signal stored in the storage unit 70 has a value different from the above predetermined initial value.

Note that the designation signal Sd1 output by the decoding unit 601 in the example of FIG. 21 is the same as the control signal Sci supplied to the circuit module selection unit 50.

The OR circuits 602-2 to 602-32 are logical OR operation circuits each having two inputs and one output and cascade connected in this order. The OR circuit 602-2 receives as input the designation signal Sd1 (=control signal Sc1) at one of two inputs and receives as input the designation signal Sd2 at the other. The output of the OR circuit 602-2 is supplied as the control signal Sc2 to the circuit module selection unit 50. The OR circuit 602-$k$ ($k$ indicates an integer from 3 to 32, same true below in the present embodiment) receives as input the output signal of the OR circuit 602-($k$−1) at one of two inputs and receives as input a designation signal Sdk at the other. The output of the OR circuit 602-$k$ is supplied as a control signal Sck to the circuit module selection unit 50.

When a designation signal Sdj (j indicates an integer from 2 to 32, same true below in the present embodiment) of the decoding unit 601 becomes the value "1", the OR circuit 602-$j$ to which this designation signal Sdj is input outputs a control signal Scj of "1". When "j" is smaller than 32, all of the control signals Sc(j+1) to Sc32 output from the OR circuits 602-(j+1) to 602-32 after the OR circuit 602-$j$ also become the value "1". When the designation signal Sd1 (=control signal Sc1) of the decoding unit 601 becomes the value "1", the OR circuit 602-2 to which this designation signal Sd1 is input outputs the control signal Sc2 having the value "1". All of the control signals Sc3 to Sc32 output from the OR circuits 602-3 to 602-32 after this OR circuit 602-2 become the value "1". On the other hand, when all designation signals (Sd1 to Sd32) of the decoding unit 601 become the value "0", all of the input/output signals of the OR circuits 602-2 to 602-32 become the value "0", therefore all of the control signals (Sc1 to Sc32) supplied to the circuit module selection unit 50 become the value "0".

Accordingly, when the circuit module Mn is disconnected from all input/output units, when "n" is an integer from 2 to 32, the designation signals Sd1 to Sd(n−1) are set at the value "0", and the designation signal Sdn is set at the value "1" by the decoding unit 601, therefore the control signals Sc1 to Sc(n−1) become the value "0", and the control signals Sc1 to Sc32 become the value "1". When "n" is the integer 1, the designation signal Sd1 is set at the value "1" by the decoding unit 601, therefore all of the control signals Sc1 to Sc32 become the value "1". When "n" is the integer 33, all of the designation signals Sd1 to Sd32 are set at the value "0" by the decoding unit 601, therefore all of the control signals Sc1 to Sc32 become the value "0".

The storage unit 70 stores a signal for designating one circuit module to be disconnected from 32 input/output units (P1 to P32) among 33 circuit modules (M1 to M33). Further, the storage unit 70 stores a signal having the predetermined initial value in the initial state where no signal is written. The storage unit 70 can be configured by for example a fuse element or nonvolatile memory.

The signal input unit 80 is a circuit for receiving as input a signal designating one circuit module to be disconnected from 32 input/output units (P1 to P32) and is used for receiving as input a signal to the control unit 60 from the external device in for example a case of inspecting a semiconductor integrated circuit.

The operation of fault repair in the semiconductor integrated circuit according to the present embodiment having the above configuration will be explained with reference to FIG. 30 to FIG. 32.

Figure 30:
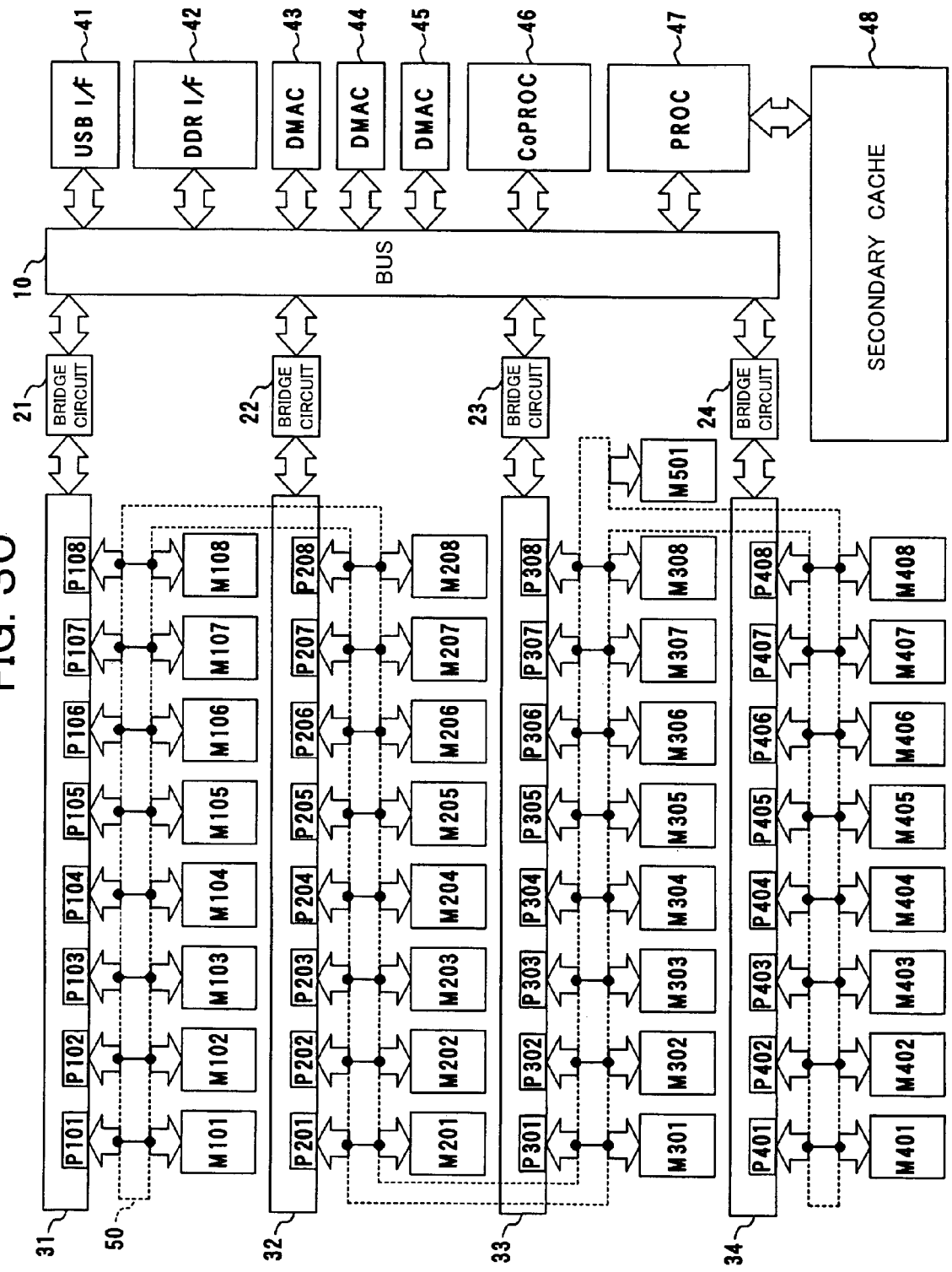
FIG. 30 is a diagram showing a default connection state of the semiconductor integrated circuit shown in FIG. 19.

FIG. 30 shows the default connection state before the inspection of faults. In the example shown in FIG. 30, the input/output units P101 to P108 and the circuit modules M101 to M108, the input/output units 201 to P208 and the circuit modules M201 to M208, the input/output units P301 to P308 and the circuit modules M301 to M308, and the input/output units P401 to P408 and the circuit modules M401 to M408 are connected in a one-to-one correspondence. Further, the circuit module M501 is disconnected from all input/output units and becomes the redundant circuit module.

When explaining this default connection state by the notations shown in FIG. 21, the input/output units P1 to P24 and circuit modules M1 to M24 and the input/output units P25 to P32 and circuit modules M26 to M33 are connected in a one-to-one correspondence. Further, the circuit module M25 is disconnected from all input/output units and becomes the redundant circuit module. In this case, the control unit 60 sets the control signals Sc1 to Sc24 at the value "0" and sets the control signals Sc25 to Sc32 at the value "1". In the circuit module selection unit 50, the switch circuits SWA1 to SWA24 turn on, the switch circuits SWA25 to SWA32 turn off, the switch circuits SWB1 to SWB24 turn off, and the switch circuits SWB25 to SWB32 turn on.

Figure 31:
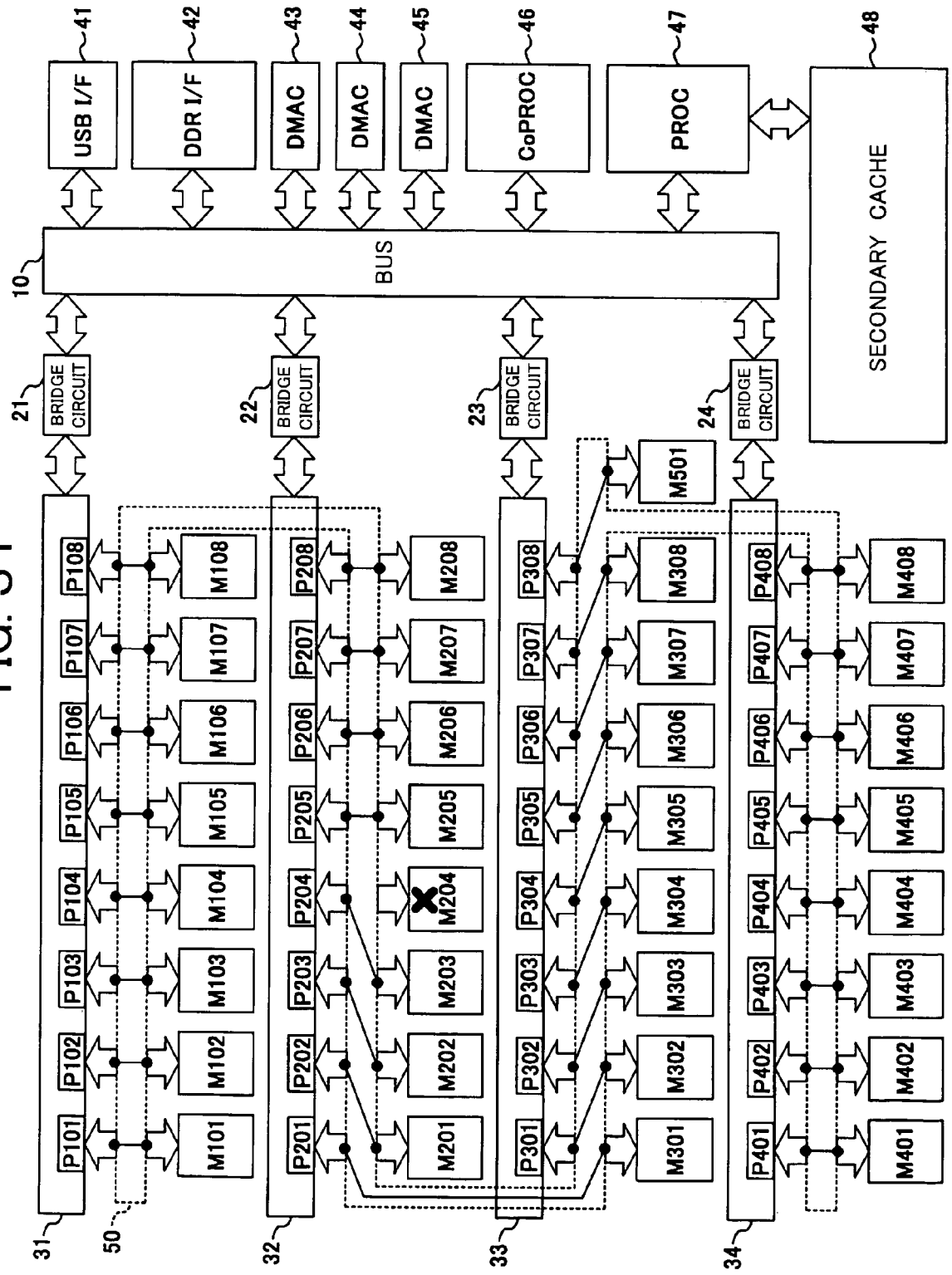
FIG. 31 is a first diagram showing the connection state in a case where fault repair is carried out in the semiconductor integrated circuit shown in FIG. 19.

FIG. 31 shows the connection state in a case where the circuit module M204 has a fault. In this case, the connections between the input/output units and circuit modules shift from the circuit module M204 having the fault toward the redundant circuit module M501. Namely, the input/output units P204, P203, P202, P201, P301, P302, . . . , P307, and P308 are connected with the circuit modules M203, M202, M201, M301, M302, . . . , M307, M308, and M501 in a one-to-one correspondence, and the circuit module M204 is disconnected from all input/output units. The rest of the connections is the same as that at the time of the default shown in FIG. 30.

When explaining the connection state shown in FIG. 31 by notations shown in FIG. 21, the input/output units P1 to P12 and circuit modules M1 to M12 and the input/output units P13 to P33 and circuit modules M14 to M33 are connected in a one-to-one correspondence, and the circuit module M13 is disconnected from all input/output units. In this case, the control unit 60 sets the control signals Sc1 to Sc12 at the value "0" and sets the control signals Sc13 to Sc32 at the value "1". In the circuit module selection unit 50, the switch circuits SWA1 to SWA12 turn on, the switch circuits SWA13 to SWA32 turn off, the switch circuits SWB1 to SWB12 turn off, and the switch circuits SWB13 to SWB32 turn on.

Figure 32:
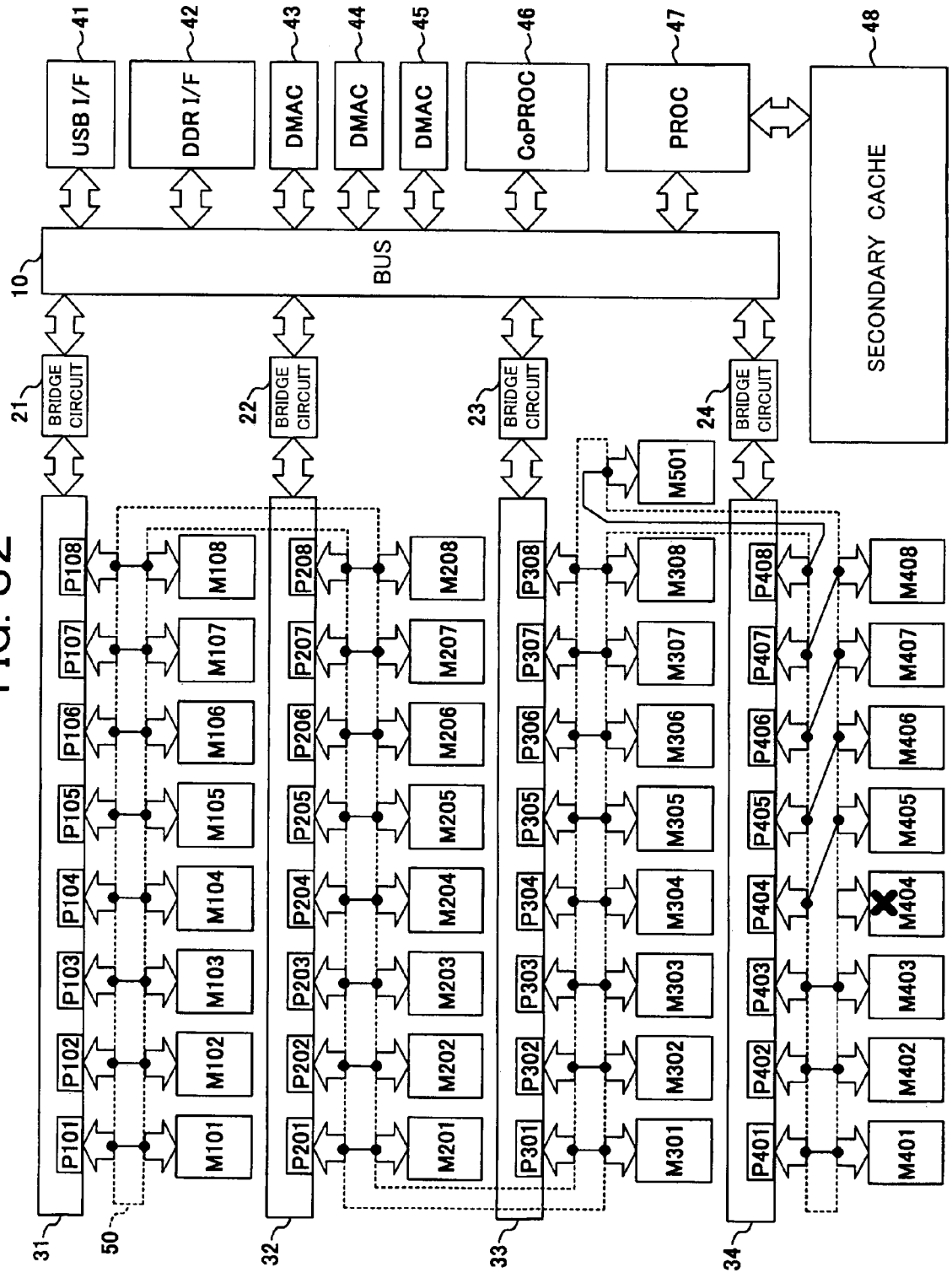
FIG. 32 is a second diagram showing the connection state in a case where fault repair is carried out in the semiconductor integrated circuit shown in FIG. 19.

FIG. 32 shows the connection state in a case where the circuit module M404 has a fault. In this case, the connections of the input/output units and the circuit modules shift from the circuit module M404 having the fault toward the redundant circuit module M501. Namely, the input/output units P404, P405, P406, P407, and P408 are connected with the circuit modules M405, M406, M407, M408, and M501 in a one-to-one correspondence, and the circuit module M404 is disconnected from all input/output units. The rest of the connections is the same as that at the time of default shown in FIG. 30.

When explaining the connection state shown in FIG. 32 by the notations shown in FIG. 21, the input/output units P1 to P29 and circuit modules M1 to M29 and the input/output units P30 to P32 and circuit modules M31 to M33 are connected in a one-to-one correspondence, and the circuit module M30 is disconnected from all input/output units. In this case, the control unit 60 sets the control signals Sc1 to Sc29 at the value "0" and sets the control signals Sc30 to Sc32 at the value "1". In the circuit module selection unit 50, the switch circuits SWA1 to SWA29 turn on, the switch circuits SWA30 to SWA32 turn off, the switch circuits SWB1 to SWB29 turn off, and the switch circuits SWB30 to SWB32 turn on.

By the semiconductor integrated circuit according to the present embodiment, 32 circuit modules are selected from among 33 circuit modules (M1 to M33) in response to the signal input from the storage unit 70 or the signal input unit 80, and the selected 32 circuit modules and 32 input/output units (P1 to P32) are connected in a one-to-one correspondence. To the input/output unit Pi, one circuit module selected from two circuit modules (Mi, M(i+1)) is connected. Accordingly, it becomes possible to design the layout so that the change of the signal delay occurring where the connection between the input/output unit Pi and the circuit modules (Mi, M(i+1)) is switched becomes smaller. For example, as shown in FIG. 19 and FIG. 21, by arranging the input/output units in numerical order (P1, P2, . . . , P32) and arranging the circuit modules in numerical order (M1, M2, . . . , M33) along this layout, the difference of distances between the input/output unit Pi and the circuit modules (Mi, M(i+1)) is made smaller, and the signal change along with connection switching can be made smaller.

10th Embodiment

Next, a 10th embodiment of the present invention will be explained.

The semiconductor integrated circuit according to the present embodiment is obtained by changing the control unit 60 (FIG. 21) in the semiconductor integrated circuit according to the ninth embodiment explained above. The rest of the configuration is the same as that of the semiconductor integrated circuit according to the ninth embodiment.

Figure 33:
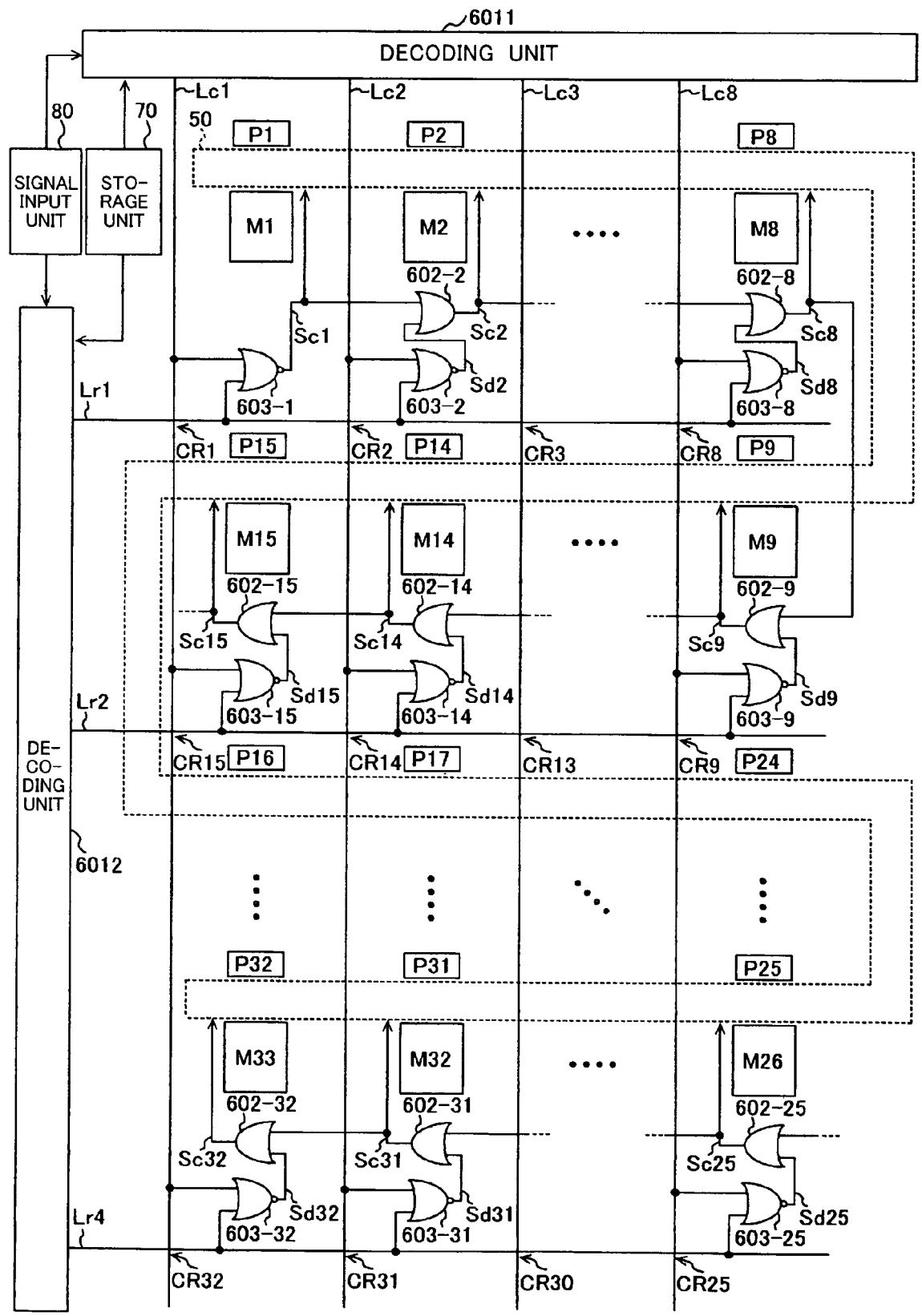
FIG. 33 is a diagram showing an example of the configuration of a semiconductor integrated circuit according to a 10th embodiment of the present invention.

FIG. 33 is a diagram showing an example of the configuration of a semiconductor integrated circuit according to the present embodiment. The semiconductor integrated circuit shown in FIG. 33 is obtained by replacing the control unit 60 in the semiconductor integrated circuit shown in FIG. 21 by a control unit 60A. The same notations in FIG. 21 and FIG. 33 show same components.

In the example of FIG. 33, the control unit 60A has decoding units 6011 and 6012, OR circuits 602-2 to 602-32, NOR circuits 603-1 to 603-32, and control lines Lc1 to Lc8 and Lr1 to Lr4.

The control lines Lc1 to Lc8 are a first control line. The control lines Lr1 to Lr4 are a second control line. The circuit including the decoding units 6011 and 6012 is a first control unit. The OR circuits 602-2 to 602-32 and the NOR circuits 603-1 to 603-32 are a second control unit.

The control lines Lc1 to Lc8 are formed extended in the vertical direction in the figure, while the control lines Lr1 to Lr4 are formed extended in the lateral direction in FIG. 33.

In the example of FIG. 33, the control lines Lc1 to Lc8 and the control lines Lr1 to Lr4 schematically vertically cross. 32 cross points (CR1 to CR32) are formed by the crossing of the two. The cross points CR1, . . . , and CR8 are cross points of the control lines Lc1, . . . , and Lc8 with the control line Lr1. The cross points CR9, . . . , and CR16 are cross points of the control lines Lc8, . . . , and Lc1 with the control line Lr2. The cross points CR17, . . . , and CR24 are cross points of the control lines Lc1, . . . , and Lc8 with the control line Lr3. The cross points CR25, . . . , and CR32 are cross points of the control lines Lc8, . . . , and Lc1 with the control line Lr4.

The decoding unit 6011 outputs a signal of the value "0" to one of the control lines Lc1 to Lc8 or outputs the signal of the value "1" to all in response to a signal stored in the storage unit 70 or a signal input from the signal input unit 80. In the same way, the decoding unit 6012 outputs a signal of the value "0" to one of the control lines Lr1 to Lr4 or outputs a signal of the value "1" to all in response to a signal stored in the storage unit 70 or a signal input from the signal input unit 80. Accordingly, the circuit configured by the decoding units 6011 and 6012 (first control circuit) selects one cross point from among the 32 cross points (CR1 to CR32) in response to a signal stored in the storage unit 70 or a signal input from the signal input unit 80 and outputs a signal having the value "0" to two control lines forming the selected cross point or outputs a signal having the value "1" to all control lines (Lc1 to Lc8 and Lr1 to Lr4) forming 32 cross points (CR1 to CR32).

Further, when the signal stored in the storage unit 70 has a predetermined initial value, the decoding unit 6011 determines the signal values of the control lines Lc1 to Lc8 in response to the signal input from the signal input unit 80, while when the signal stored in the storage unit 70 has a value different from the above predetermined initial value, it determines the signal values of the control lines Lc1 to Lc8 in response to the signal stored in the storage unit 70. In the same way, when the signal stored in the storage unit 70 has the above predetermined initial value, the decoding unit 6012 determines the signal values of the control lines Lr1 to Lr4 in response to the signal input from the signal input unit 80, while when the signal stored in the storage unit 70 has a value different from the above predetermined initial value, it determines the signal values of the control lines Lr1 to Lr4 in response to a signal stored in the storage unit 70. Namely, the circuit configured by the decoding units 6011 and 6012 (first control circuit) determines the signal values of the control lines in response to a signal input from the signal input unit 80 when the signal stored in the storage unit 70 has the above predetermined initial value and determines signal values of the control lines in response to a signal stored in the storage unit 70 when the signal stored in the storage unit 70 has a value different from the above predetermined initial value.

The NOR circuit 603-*i* (i indicates an integer from 1 to 32, same true below in the present embodiment.) operates the inverted OR logic of the signals output to two control lines forming the cross point CR*i*, and outputs the operation result as the signal Sd*i*. The signal Sd*i* output from the NOR circuit 603-*i* corresponds to the designation signal Sd*i* output from the decoding unit 601 to the OR circuit 602-*i* in the control unit 60 (FIG. 21).

Next, the operation of the semiconductor integrated circuit shown in FIG. 33 will be explained.

When the cross point CR*i* is selected by the decoding units 6011 and 6012, and the signal of the value "0" is output to the two control lines forming the selected cross point CR*i*, the designation signal Sd*i* output from the NOR circuit 603-*i* becomes the value "1". At this time, when "i" is an integer from 2 to 32, the control signal Sc1 output from the NOR circuit 603-1 and the control signals Sc2 to Sc(i−1) output from the OR circuits 602-2 to 602-(i−1) become the value "0", and the control signals Sc*i* to Sc32 output from the OR circuits 602-*i* to 602-32 become the value "1". Further, when "i" is the integer 1 at this time, the control signal Sc1 output from the NOR circuit 603-1 and the control signals Sc2 to Sc32 output from the OR circuits 602-2 to 602-32 all become the value "1". Accordingly, when the cross point CR*i* (i=1 to 32) is selected by the decoding units 6011 and 6012, the circuit module M*i* is selected as the circuit module disconnected from all input/output units. Then, the remaining 32 circuit modules and 32 input/output units (P1 to P32) are connected in a one-to-one correspondence.

On the other hand, when a signal of the value "1" is output to all control lines forming the cross points CR1 to CR32 by the decoding units 6011 and 6012, all of the designation signals Sd1 to Sd32 output from the NOR circuits 603-1 to 603-32 become the value "0". When the designation signals Sd1 to Sd32 become the value "0", all of the input/output signals of the OR circuits 602-2 to 602-32 become the value "0", therefore all of the control signals (Sc1 to Sc32) supplied to the circuit module selection unit 50 become the value "0". When all of the control signals Sc1 to Sc32 become the value "0", the circuit module M33 is disconnected from all of the input/output units and the remaining 32 circuit modules (M1 to M32) and 32 input/output units (P1 to P32) are connected in a one-to-one correspondence.

By the semiconductor integrated circuit according to the present embodiment, from among the 32 cross points (CR1 to CR32) formed by the eight control lines Lc1 to LC8 and four control lines Lr1 to LR4, one cross point CR*i* is selected by the decoding units 6011 and 6012. Then, by the setting of the two control lines forming this selected cross point CR*i* at the value "0", the circuit module M*i* corresponding to the cross point CR*i* is disconnected from all input/output units, and the remaining 32 circuit modules are connected with the 32 input/output units (P1 to P32) in a one-to-one correspondence. On the other hand, when all of the control lines forming the 32 cross points (CR1 to CR32) are set at the value "1", the circuit module M33 is disconnected from all input/output units and the remaining 32 circuit modules (M1 to M32) are connected with the 32 input/output units (P1 to P32) in a one-to-one correspondence. Namely, one circuit module is brought into correspondence with each of a plurality of cross points formed by a plurality of control lines (first control lines) and a plurality of control lines (second control lines). By giving the signal to each control line so that one cross point is selected from among these plurality of cross points, the circuit module linked with this selected cross point is disconnected and can be designated as the circuit module for disconnection. Accordingly, even when the number of circuit modules able to be repaired is large, the circuit modules for disconnection can be designated by a very small number of control lines in comparison with the number of these circuit modules.

For example, in the semiconductor integrated circuit shown in FIG. 21, 32 designation signals (Sd1 to Sd32) are generated at the decoding unit 601 in order to indicate one circuit module as the disconnection target from among 33 circuit modules (M1 to M33). Contrarily to this, in the semiconductor integrated circuit shown in FIG. 33, it is possible to perform the same designation by 12 control lines (Lc1 to Lc8, Lr1 to Lr4). Accordingly, the decoding units 6011 and 6012 of FIG. 33 can be given a very simple configuration in comparison with the decoding unit 601 of FIG. 21.

Note that, in the example of FIG. 33, the circuit modules are linked with all of the 32 cross points formed by the eight control lines (Lc1 to Lc8) and four control lines (Lr1 to Lr4), but when the number of formed cross points is larger than the number of circuit modules, the circuit modules may be linked with just part of the cross points.

Further, the input/output units, circuit modules, and cross points may be freely laid out, but preferably the positional relationships of the above are determined so that the distance between circuit modules connected to the same input/output unit becomes shorter and the distances of the cross points linked with the circuit modules becomes shorter. For example, in the example shown in FIG. 33, the input/output units P1, . . . , and P32 and the circuit modules M1, M2, . . . , and M33 are arranged along a path obtained by connecting all cross points formed by the crossing of the control lines (Lc1 to Lc8, Lr1 to Lr4) in a line with the shortest distance. Then, the cross point located at the nearest position from each circuit module is linked with each circuit module. When employing this layout, for example, as shown in FIG. 33, the distance between the switch circuit (SWA*i*, SWB*i*) and the cross point CR*i* can be made shorter. Due to this, the circuits generating the control signals Sc*i* in response to the signals of the control lines forming the cross point CR*i* (OR circuit 602-*j*, NOR circuit 603-*i*) can be arranged near the switch circuits (SWA*i*, SWB*i*) controlled by these control signals Sc*i*. When this layout becomes close, it is not necessary to lay a long interconnect in order to transmit the control signal Sc*i*, therefore the interconnect resources can be saved.

11th Embodiment

Next, an 11th embodiment of the present invention will be explained.

The semiconductor integrated circuit according to the present embodiment is formed by providing a power supply switch unit 90 in the semiconductor integrated circuit according to the above ninth embodiment (FIG. 19, FIG. 21). The rest of the configuration is the same as that of the semiconductor integrated circuit according to the ninth embodiment.

Figure 34:
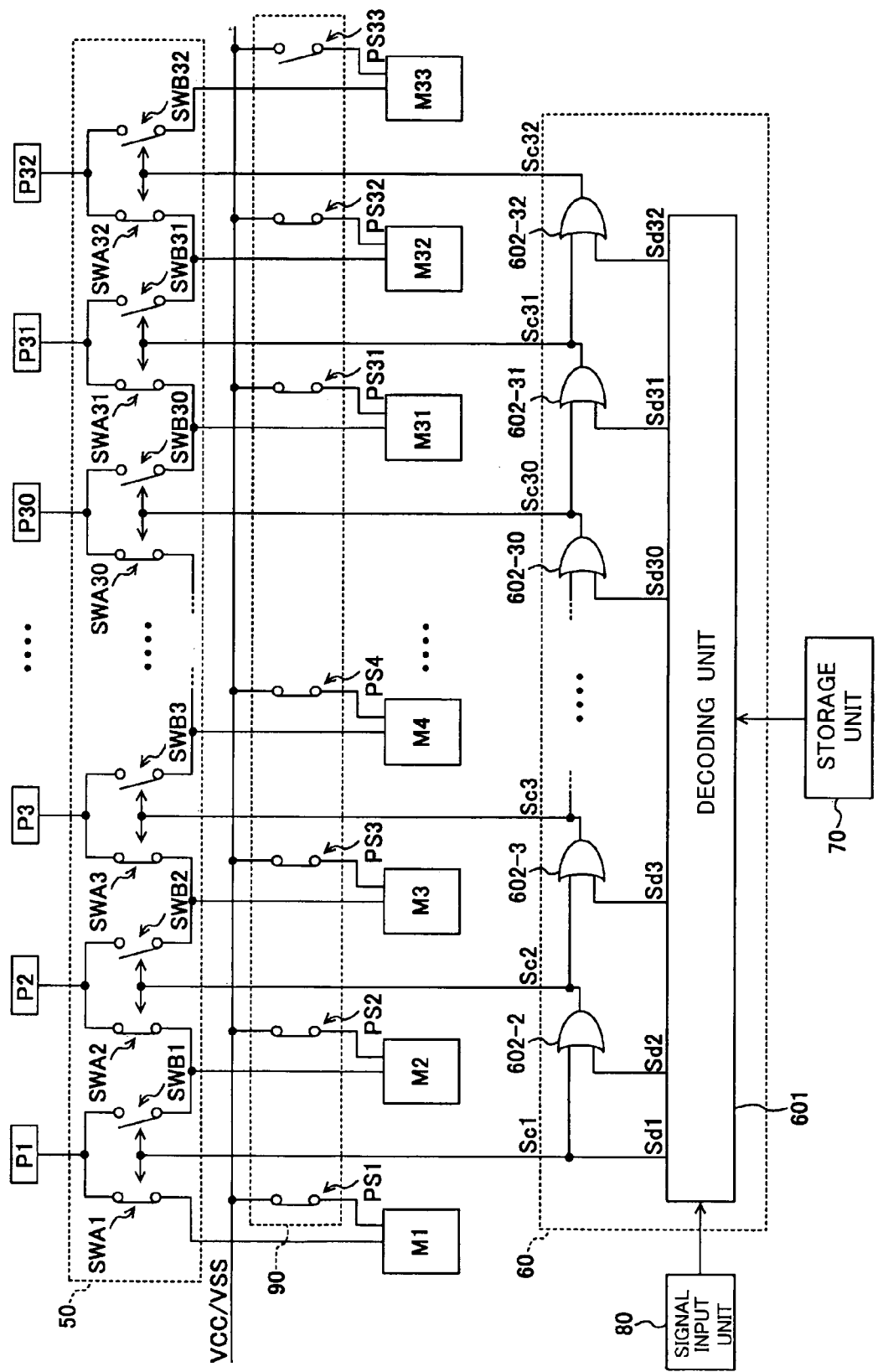
FIG. 34 is a diagram showing an example of the configuration of a semiconductor integrated circuit according to an 11th embodiment of the present invention.

FIG. 34 is a diagram showing an example of the configuration of the semiconductor integrated circuit according to the present embodiment. The semiconductor integrated circuit shown in FIG. 34 is obtained by adding the power supply switch unit 90 to the semiconductor integrated circuit shown in FIG. 21. The same notations in FIG. 21 and FIG. 34 show the same components.

The power supply switch unit 90 controls the supply of power to each circuit module (M1 to M33) in response to the signal output from the control unit 60. Namely, it turns off the power supply of the circuit module disconnected from the input/output units P1 to P32.

The power supply switch unit 90, for example as shown in FIG. 34, has power supply switch circuits PS1 to PS33.

The power supply switch circuit PSi (i indicates an integer from 1 to 32, same true below in the present embodiment) is inserted in the power supply line of the circuit module Mi, turns on when the designation signal Sdi has the value "0", and turns off where it has the value "1". The designation signal Sdi becomes the value "1" when disconnecting the circuit module Mi from all input/output units, therefore, in this case, the supply of the power to the circuit module Mi is cut off.

The power supply switch circuit PS33 is inserted in the power supply line of the circuit module M33, turns on when the control signal /Sc32 (the signal obtained by inverting the logic of the control signal Sc32) has the value "0", while turns off when this signal has the value "1". The control signal /Sc32 becomes the value "1" when disconnecting the circuit module M33 from all input/output units, therefore, in this case, the supply of the power to the circuit module M33 is cut off.

Figure 35A:
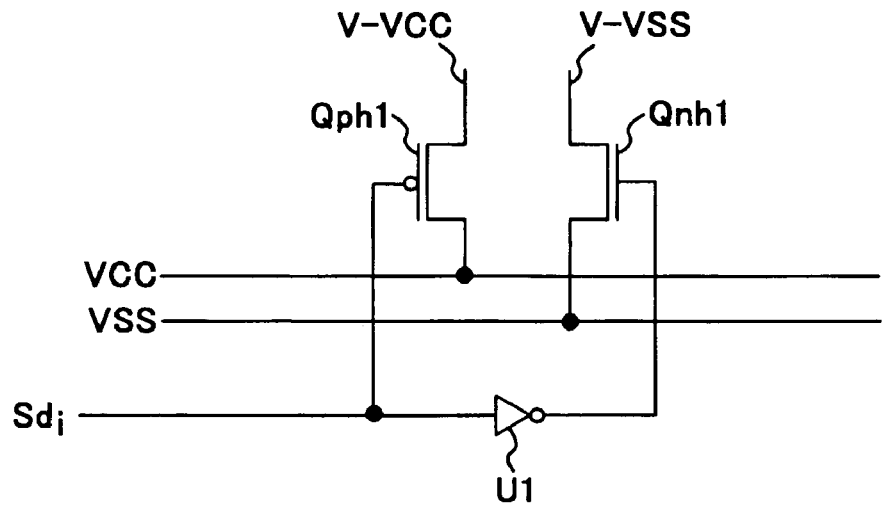
FIGS. 35A and 35B are diagrams showing an example of the configuration of a power supply switch circuit.

FIG. 35A is a diagram showing an example of the configuration of the power supply switch circuit PSi (i=1, . . . , 32). The power supply switch circuit PSi, for example as shown in FIG. 35A, has an n-type MOS transistor Qnh1, a p-type MOS transistor Qph1, and an inverter circuit U1.

The p-type MOS transistor Qph1 is connected at its source to the power supply line VCC, connected at its drain to a virtual power supply line V-VCC of the circuit module Mi, and receives as input the designation signal Sdi at its gate. As the p-type MOS transistor Qph1, use may be made of a p-type MOS transistor of a high threshold value type having a smaller leakage current in comparison with the usual p-type MOS transistor in the semiconductor integrated circuit.

The n-type MOS transistor Qnh1 is connected at its source to the ground line VSS and connected at its drain to a virtual ground line V-VSS of the circuit module Mi. As the n-type MOS transistor Qnh1, use may be made of an n-type MOS transistor of a high threshold value type having a smaller leakage current in comparison with the usual n-type MOS transistor in the semiconductor integrated circuit.

The inverter circuit U1 inverts the logic of the signal input to the gate of the p-type MOS transistor Qph1 and inputs the same to the gate of the n-type MOS transistor Qnh1.

According to the power supply switch circuit PSi shown in FIG. 35A, when the designation signal Sdi has the value "0" (where the circuit module Mi is connected to any input/output unit), a signal of the low level is input to the gate of the p-type MOS transistor Qph1, a signal of the high level is input to the gate of the n-type MOS transistor Qnh1, and therefore these transistors turn on. For this reason, power is supplied to the circuit module Mi from the power supply line VCC and the power supply line VSS. On the other hand, when the designation signal Sdi has the value "1" (where the circuit module Mi is disconnected from all input/output units), both of the p-type MOS transistor Qph1 and the n-type MOS transistor Qnh1 turn off, and the supply of the power to the circuit module Mi is cut off.

Figure 35B:
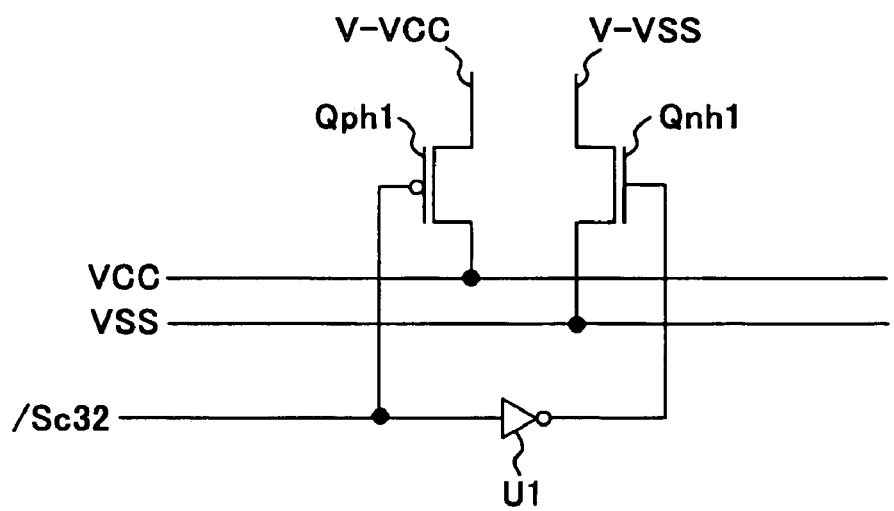

FIG. 35B is a diagram showing an example of the configuration of the power supply switch circuit PS33. The power supply switch circuit PS33 has the same configuration as that of the power supply switch circuit PSi (i=1, . . . , 32) shown in FIG. 35A. The power supply switch circuit PS33 is different from the power supply switch circuit PSi shown in FIG. 35A in the point that the control signal /Sc32 is input in place of the designation signal Sdi. The control signal /Sc 32 becomes the value "0" when any of the designation signals Sd1 to Sd32 becomes the value "1". Namely, when any of the circuit modules M1 to M32 is disconnected from the input/output units, and the circuit module M33 is connected to the input/output unit P32 in place of that, it becomes the value "0". In this case, a signal of the low level is input to the gate of the p-type MOS transistor Qph1, a signal of the high level is input to the gate of the n-type MOS transistor Qnh1, and both of these transistors turn on, therefore power is supplied to the circuit module M33 from the power supply line VCC and the ground line VSS. On the other hand, the control signal /Sc32 becomes the value "1" when all of the designation signals Sd1 to Sd32 become the value "0". Namely, this becomes the value "0" when the circuit modules M1 to M32 are connected to the input/output units, and the circuit module M33 is disconnected from the input/output unit P32 as the redundant circuit module. In this case, both of the p-type MOS transistor Qph1 and the n-type MOS transistor Qnh1 turn off, and the supply of power to the circuit module Mi is cut off.

By the semiconductor integrated circuit according to the present embodiment, a power supply switch circuit is inserted in the power supply line to each circuit module. By controlling this, the supply of power to the circuit module disconnected from the input/output units is cut off, therefore wasted power consumption in circuit modules not contributing to the operation of the circuit can be prevented, and the power consumption can be reduced. When a fault causing a large current to flow in the power supply line occurs in a circuit module, this is cut off and the influence upon the power supply system and other circuits can be prevented, therefore the drop of the yield due to a fault of a circuit module can be effectively suppressed.

12th Embodiment

Next, a 12th embodiment of the present invention will be explained.

Figure 36:
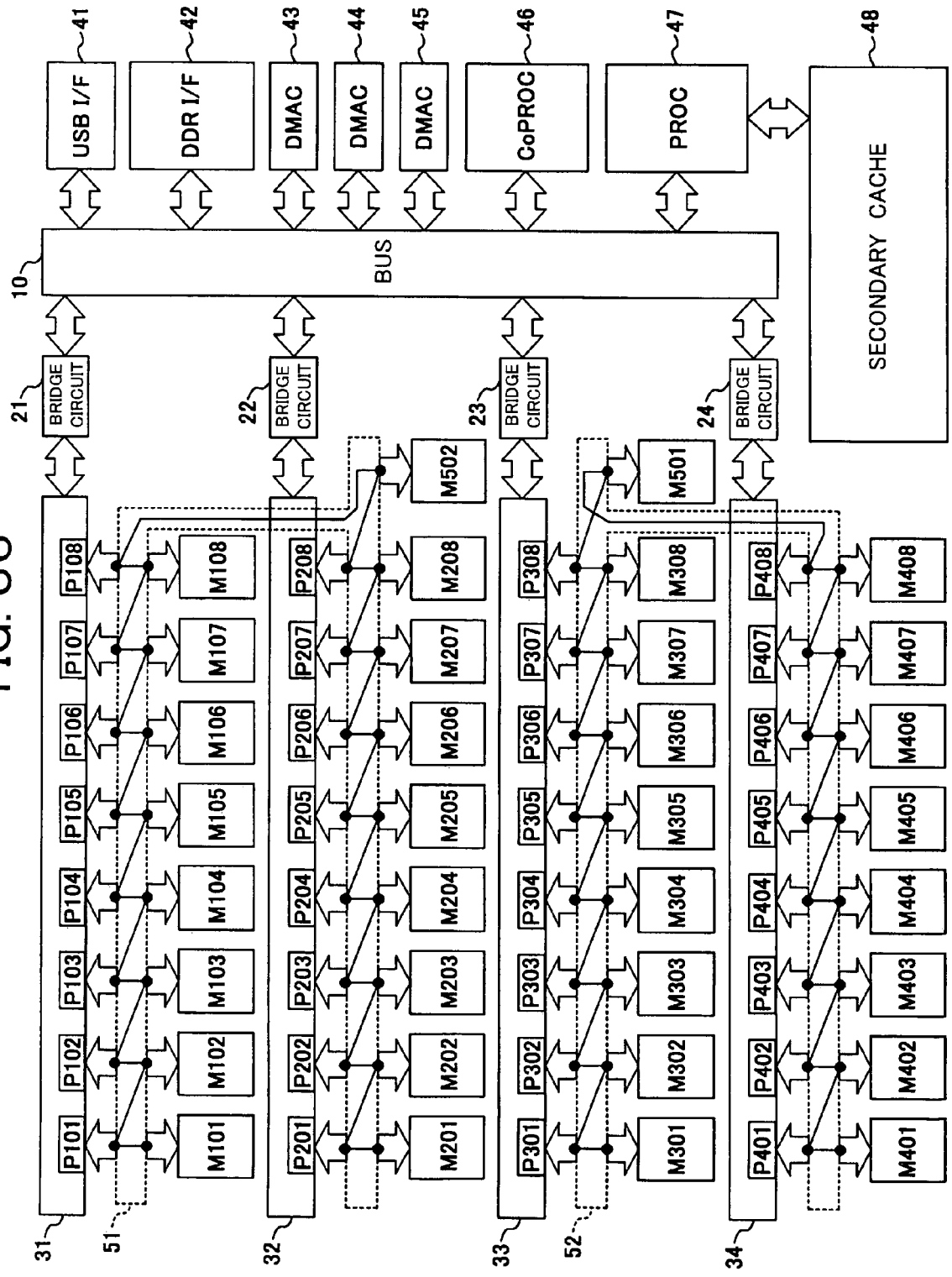
FIG. 36 is a diagram showing an example of the configuration of a semiconductor integrated circuit according to a 12th embodiment of the present invention.

FIG. 36 is a diagram showing an example of the configuration of a semiconductor integrated circuit according to the present embodiment. The semiconductor integrated circuit shown in FIG. 36 is obtained by replacing the circuit module selection unit 50 in the semiconductor integrated circuit shown in FIG. 19 by circuit module selection units 51 and 52 and adding a circuit module M502 to this. The rest of the configuration is the same as that of the semiconductor integrated circuit shown in FIG. 19. The same notations in FIG. 19 and FIG. 25 show same components.

The circuit module selection unit 51 selects 16 circuit modules from among 17 circuit modules (M101, . . . , M108, M201, . . . , M208, M502) in response to a control signal supplied from a not shown control unit and connects the selected 16 circuit modules and 16 input/output units (P101, . . . , P108, P201, . . . , P208) in a one-to-one correspondence. The 17 circuit modules (M101, ..., M108, M201, ..., M208, M502) for switching of the circuit module selection unit 51 are a group of circuit modules which can replace each other's functions and form one circuit module block.

Here, the circuit module selection unit 51 will be explained by replacing the 17 circuit modules (M101, ..., M108, M201, ..., M208, M502) and the 16 input/output units (P101, ..., P108, P201, ..., P208) by the following notations.

(Circuit Modules)
M101, ..., M108→M1, ..., M8
M208, ..., M201→M10, ..., M17
M502→M9
(Input/Output Units)
P101, ..., P108→P1, ..., P8
P208, ..., P201→P9, ..., P16

Explaining this by using above notations, the circuit module selection unit 51 selects one of the circuit module Mi (i indicates an integer from 1 to 16, same true below in the present embodiment) or the circuit module M((i+1) in response to the control signal supplied from a not shown control unit and connects the selected circuit module to the input/output unit Pi.

The circuit module selection unit 51 performing the switching operation can be realized by the same configuration as that of for example the circuit module selection unit 50 in FIG. 21. Namely, the circuit module selection unit 51 can be configured by decreasing the number of input/output units connected to the circuit module selection unit 50 from 32 to 16 and decreasing the switch circuits in the inside matching with this. Further, the control unit for supplying the control signal to the circuit module selection unit 51 can be realized by the same configuration as that of for example the control unit 60 in FIG. 21. Namely, the number of the control signals output from the control unit 60 may be decreased matching with the number of switch circuits of the circuit module selection unit 51.

On the other hand, the circuit module selection unit 52 selects 16 circuit modules from among 17 circuit modules (M301, ..., M308, M401, ..., M408, M501) in response to the control signal supplied from a not shown control unit and connects the selected 16 circuit modules with 16 input/output units (P301, ..., P308, P401, ..., P408) in a one-to-one correspondence. The 17 circuit modules (M301, ..., M308, M401, ..., M408, M501) for switching of the circuit module selection unit 52 are the group of circuit modules which can replace each other's functions and form one circuit module block.

The circuit module selection unit 52 will be explained by replacing elements by notations as follows:

(Circuit modules)
M301, ..., M308→M1, ..., M8
M408, ..., M401→M10, ..., M17
M501→M9
(Input/Output Units)
P301, ..., P308→P1, ..., P8
P408, ..., P401→P9, ..., P16

When explaining this by using the above notations, the circuit module selection unit 52 selects one of the circuit module Mi or the circuit module M(i+1) in response to the control signal supplied from the not shown control unit and connects the selected circuit module to the input/output unit Pi. This circuit module switching operation is equivalent to that of the previously explained circuit module selection unit 51, therefore the circuit module selection unit 52 can be realized by the same configuration as that of the circuit module selection unit 51. Further, the control unit for supplying the control signal to the circuit module selection unit 52 can be realized by the same configuration as that of the control unit for supplying the control signal to the circuit module selection unit 51.

Next, the fault repair operation in the semiconductor integrated circuit according to the present embodiment having the above configuration will be explained with reference to FIG. 37 and FIG. 38.

Figure 37:
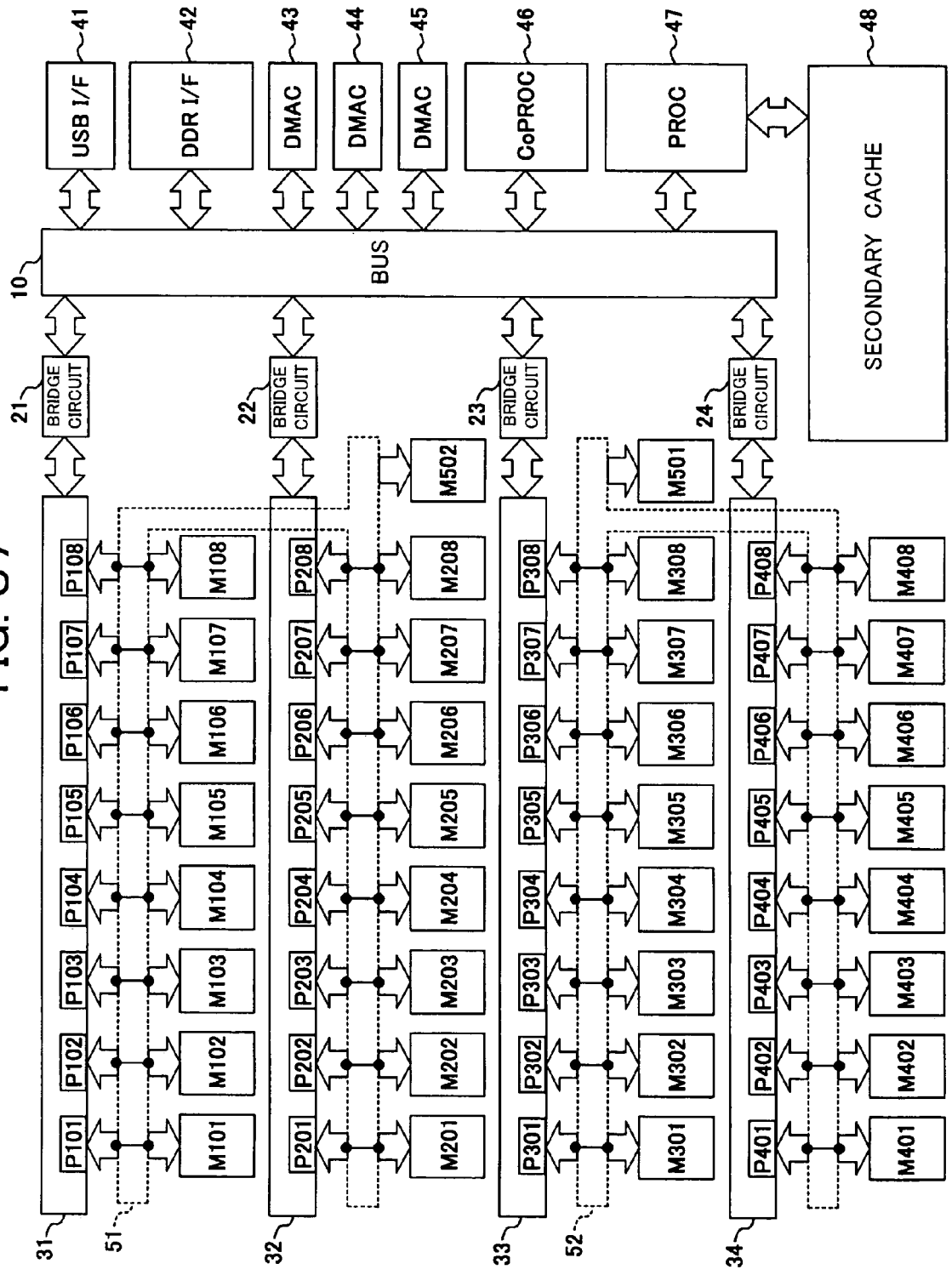
FIG. 37 is a diagram showing the default connection state of the semiconductor integrated circuit shown in FIG. 36.

FIG. 37 shows the default connection state before inspection of the faults. In the example shown in FIG. 37, the input/output units P101 to P108 and the circuit modules M101 to M108, the input/output units 201 to P208 and circuit modules M201 to M208, the input/output units P301 to P308 and circuit modules M301 to M308, and the input/output units P401 to P408 and circuit modules M401 to M408 are connected in a one-to-one correspondence. Further, the circuit modules M501 and M502 are disconnected from all input/output units.

Figure 38:
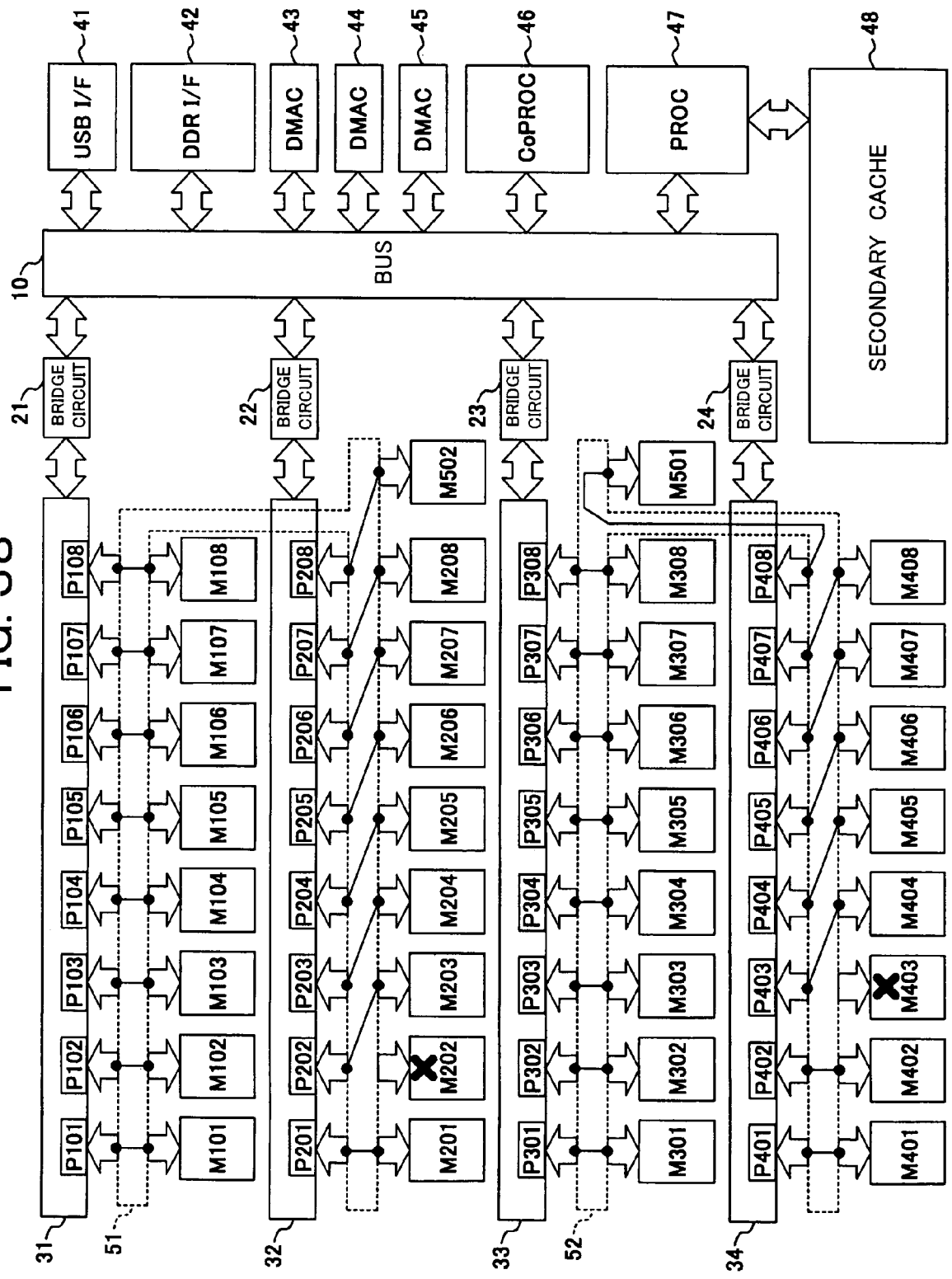
FIG. 38 is a first diagram showing the connection state in a case where fault repair is carried out in the semiconductor integrated circuit shown in FIG. 36.

FIG. 38 shows the connection state in a case where the circuit modules M202 and M403 have faults. In this case, the circuit module M202 is disconnected from all input/output units, and the destinations of connection of the input/output units P202, ..., and P208 are switched to the circuit modules M203, ..., M208, and M502. Namely, the connections between the input/output units and the circuit modules are shifted from the circuit module M202 having the fault toward the circuit module M502 unconnected at the time of the default. Further, in this case, the circuit modules M403 is disconnected from all input/output units, and the destinations of connection of the input/output units P403, ..., and P408 are switched to the circuit modules M404, ..., M408, and M501. Namely, the connections between the input/output units and the circuit modules shift from the circuit module M403 having the fault toward the circuit module M501 unconnected at the time of the default. The rest of the connections are the same as that at the time of the default shown in FIG. 37.

The semiconductor integrated circuit according to the present embodiment has two circuit module blocks each being configured by a plurality of circuit modules which can replace each other's functions. Each of these two circuit modules includes one redundant circuit module and can repair one faulty circuit module for each circuit module block. Accordingly, in the overall circuit, as shown in FIG. 38, two faulty circuit modules can be repaired, and the number of the circuit modules which can be repaired can be increased in comparison with the semiconductor integrated circuit shown in FIG. 19 having only one circuit module block.

13th Embodiment

Next, a 13th embodiment of the present invention will be explained.

In the semiconductor integrated circuit shown (in FIG. 21, it is possible to designate circuit modules to be disconnected from input/output units one by one and switch the connections thereof, but when the number of circuit modules becomes large, it is necessary to generate control signals in proportion to that number, therefore the scale of the control circuit becomes large. In the semiconductor integrated circuit according to the present embodiment, by disconnecting a plurality of circuit modules from input/output units all together and switching the connections thereof all together, the control circuit is simplified.

Figure 39:
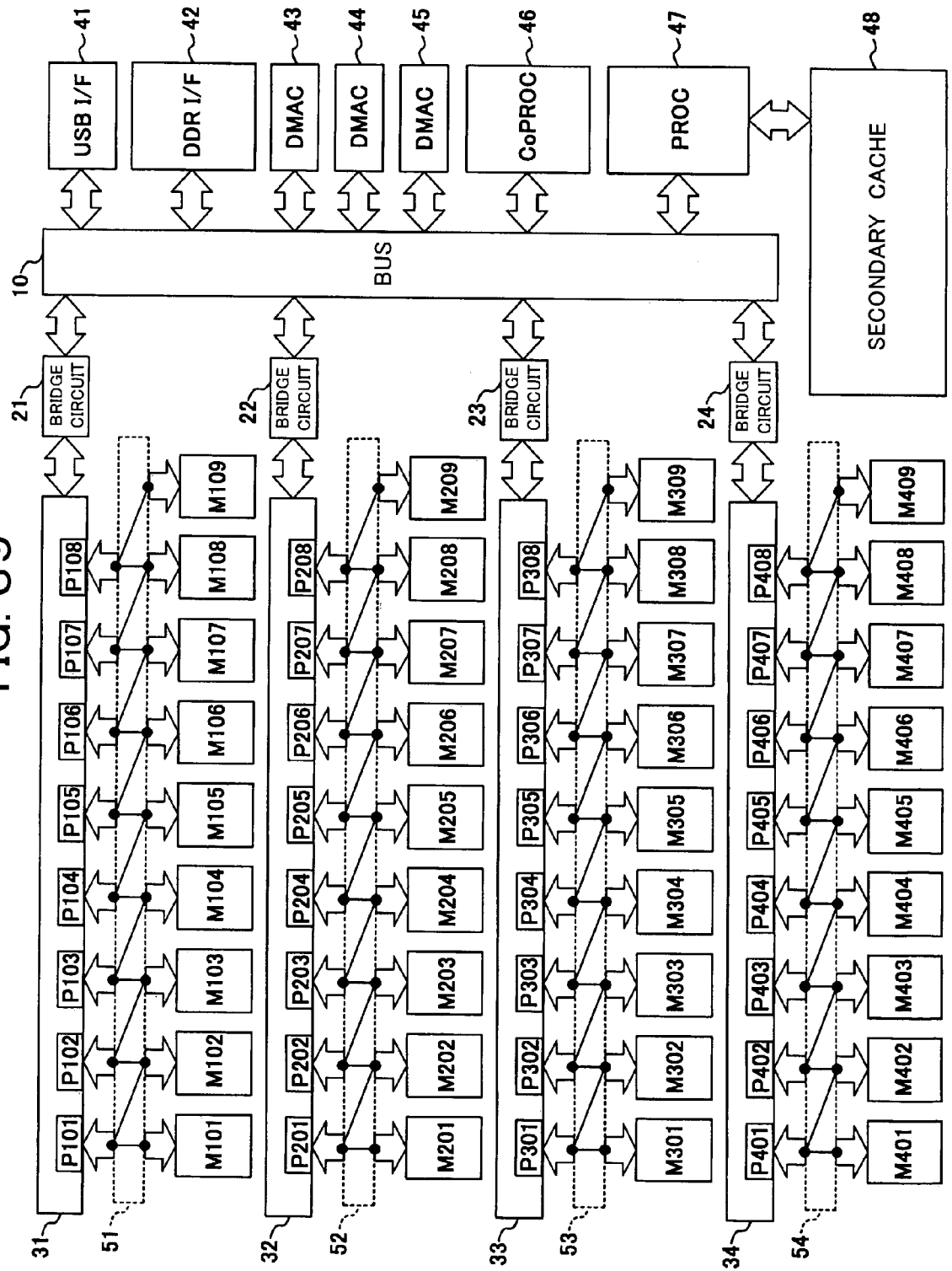
FIG. 39 is a diagram showing an example of the configuration of a semiconductor integrated circuit according to a 13th embodiment of the present invention.

FIG. 39 is a diagram showing an example of the configuration of the semiconductor integrated circuit according to a 13th embodiment of the present invention. The semiconductor integrated circuit shown in FIG. 39 is obtained by replacing the circuit module selection unit 50 in the semiconductor integrated circuit shown in FIG. 19 by circuit module selection units 51, 52, 53, and 54 and replacing the circuit module M501 by the circuit modules M109, M209, M309, and M409. The rest of the configuration is the same as that of the semiconductor integrated circuit shown in FIG. 19. The same notations in FIG. 19 and FIG. 39 show the same components.

The circuit module selection unit 51 selects eight circuit modules from among nine circuit modules (M101, . . . , M109) in response to control signals Sc1 to Sc9 supplied from the control unit 60B (FIG. 40) explained later and connects the selected eight circuit modules and eight input/output units (P101, . . . , P108) in a one-to-one correspondence. Namely, the circuit module selection unit 51 selects one of the circuit module M(100+i) or circuit module M(100+i+1) in response to the control signal Sci (i indicates an integer from 1 to 8, same true below in the present embodiment) and connects the selected circuit module to the input/output unit P(100+i).

The circuit module selection unit 52 selects eight circuit modules from among nine circuit modules (M201, . . . , M209) in response to the control signals Sc1 to Sc9 and connects the selected eight circuit modules and eight input/output units (P201, . . . , P208) in a one-to-one correspondence. Namely, the circuit module selection unit 52 selects one of the circuit module M(200+i) or circuit module M(200+i+1) in response to the control signal Sci and connects the selected circuit module to the input/output unit P(200+i).

The circuit module selection unit 53 selects eight circuit modules from among nine circuit modules (M301, . . . , M309) in response to the control signals Sc1 to Sc9 and connects the selected eight circuit modules and eight input/output units (P301, . . . , P308) in a one-to-one correspondence. Namely, the circuit module selection unit 53 selects one of the circuit module M(300+i) or circuit module M(300+i+1) in response to the control signal Sci and connects the selected circuit module to the input/output unit P(300+i).

The circuit module selection unit 54 selects eight circuit modules from among nine circuit modules (M401, . . . , M409) in response to the control signals Sc1 to Sc9 and connects the selected eight circuit modules and eight input/output units (P401, . . . , P408) in a one-to-one correspondence. Namely, the circuit module selection unit 54 selects one of the circuit module M(400+i) or circuit module M(400+i+1) in response to the control signal Sci and connects the selected circuit module to the input/output unit P(400+i).

Figure 40:
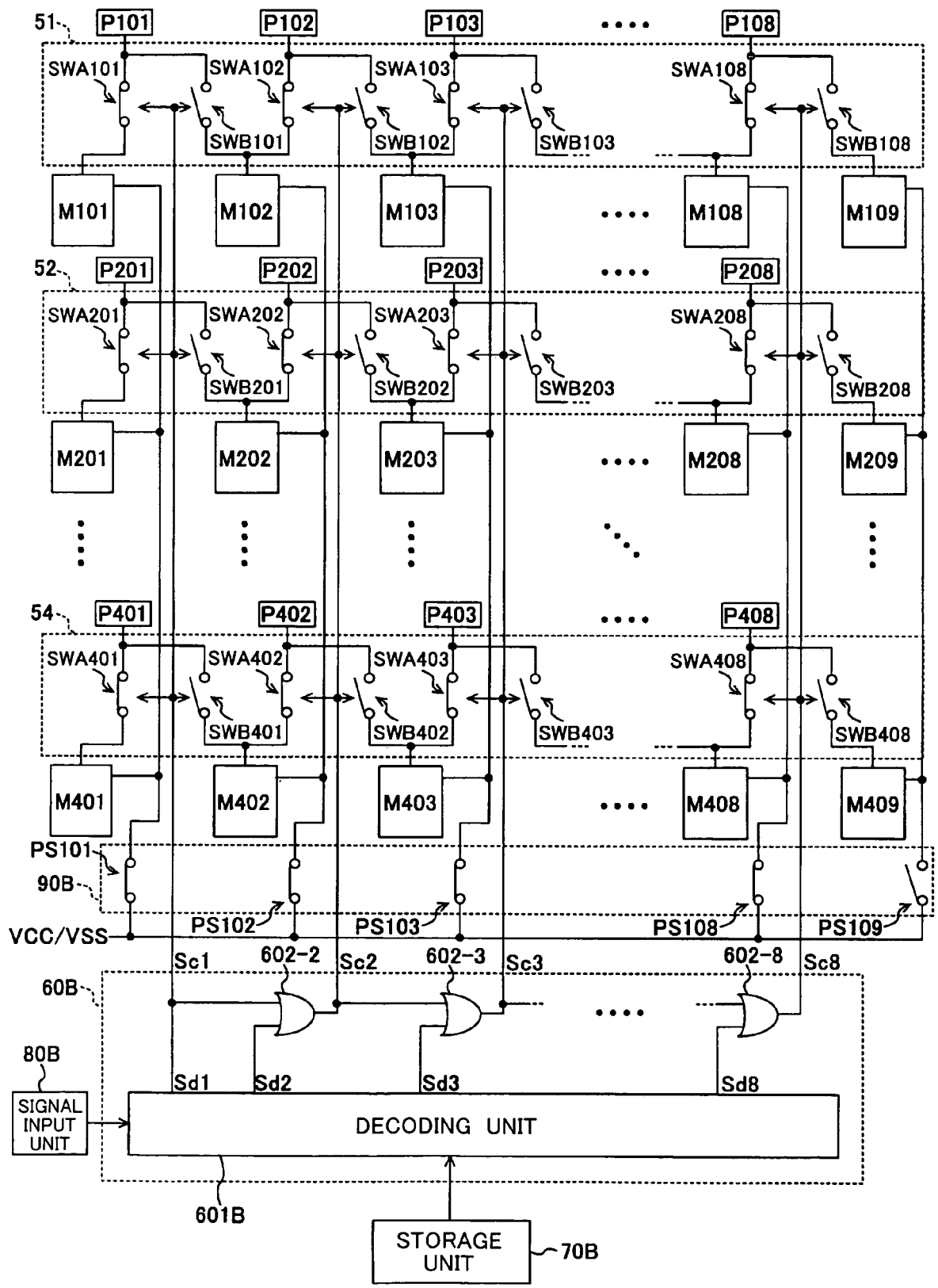
FIG. 40 is a diagram showing an example of the configuration of a principal portion of the semiconductor integrated circuit shown in FIG. 39.

FIG. 40 is a diagram showing an example of the configuration of a principal portion of the semiconductor integrated circuit shown in FIG. 39. The semiconductor integrated circuit according to the present embodiment, for example as shown in FIG. 39, has a control unit 60B, a storage unit 70B, a signal input unit 80B, and a power supply switch unit 90B. Further, in the example of configuration of FIG. 39, the circuit module selection unit 51 has switch circuits SWA101 to SWA108 and SWB101 to SWB108. The circuit module selection unit 52 has switch circuits SWA201 to SWA208 and SWB201 to SWB208. The circuit module selection unit 53 has switch circuits SWA301 to SWA308 and SWB301 to SWB308. The circuit module selection unit 54 has switch circuits SWA401 to SWA408 and SWB401 to SWB408.

The switch circuit SWA(100+i) is connected between the input/output unit P(100+i) and the circuit module M(100+i), turns on when the control signal Sci has the value "0", and turns off when it has the value "1". The switch circuit SWB(100+i) is connected between the input/output unit (100+i) and the circuit module M(100+i+1), turns off when the control signal Sci has the value "0", and turns on when it has the value "1". The switch circuit SWA(200+i) is connected between the input/output unit P(200+i) and the circuit module M(200+i), turns on when the control signal Sci has the value "0", and turns off when it has the value "1". The switch circuit SWB(200+i) is connected between the input/output unit (200+i) and the circuit module M(200+i+1), turns off when the control signal Sci has the value "0", and turns on when it has the value "1". The switch circuit SWA(300+i) is connected between the input/output unit P(300+i) and the circuit module M(300+i), turns on when the control signal Sci has the value "0", and turns off when it has the value "1". The switch circuit SWB(300+i) is connected between the input/output unit (300+i) and the circuit module M(300+i+1), turns off when the control signal Sci has the value "0", and turns on when it has the value "1". The switch circuit SWA(400+i) is connected between the input/output unit P(400+i) and the circuit module M(400+i), turns on when the control signal Sci has the value "0", and turns off when it has the value "1". The switch circuit SWB(400+i) is connected between the input/output unit (400+i) and the circuit module M(400+i+1), turns off when the control signal Sci has the value "0", and turns on when it has the value "1".

The control unit 60B generates control signals Sc1 to Sc9 for commonly controlling the circuit module selection units 51 to 54 in response to a signal stored in the storage unit 70B or a signal input from the signal input unit 80B.

A set of four circuit modules {M(100+n), M(200+n), M(300+n), M(400+n)} (n indicates an integer from 1 to 9, same true below in the present embodiment) arranged aligned in the vertical direction in FIG. 39 and FIG. 40 will be called the n-th circuit module set. When the signal stored in the storage unit 70B or the signal input from the signal input unit 80B designates to disconnect the above n-th circuit module set from all input/output units, the control unit 60B outputs the following control signals Sc1 to Sc9 in accordance with the value of the integer n.

[2≦n≦8]

In this case, the control unit 60B sets the control signals Sc1 to Sc(n−1) at the value "0" and sets the control signals Sc1 to Sc8 at the value "1". Due to this, the switch circuits SWA(100+n), SWA(200+n), SWA(300+n), and also SWA(400+n) turn off, the switch circuits SWB(100+n−1), SWB(200+n−1), SWB(300+n−1), and SWB(400+n−1) turn off, and therefore the four circuit modules belonging to the n-th circuit module set are disconnected from all input/output units. Further, when "p" is an integer from 1 to (n−1), the switch circuits SWA(100+p), SWA(200+p), SWA(300+p), and SWA(400+p) turn on, and the switch circuits SWB(100+p), SWB(200+p), SWB(300+p), and SWA(400+p) turn off. For this reason, the four circuit modules belonging to the p-th circuit module set are connected to the four input/output units P(100+p), P(200+p), P(300+p), and P(400+p). Further, when "q" is an integer from n to 8, the switch circuits SWA(100+q), SWA(200+q), SWA(300+q), and SWA(400+q) turn off, and the switch circuits SWB(100+q), SWB(200+q), SWB(300+q), and SWA(400+q) turn on. For this reason, the four circuit modules belonging to the (q+1)th circuit module set are connected to the four input/output units P(100+q), P(200+q), P(300+q), and P(400+q).

[n=1]

In this case, the control unit 60B sets all of the control signals Sc1 to Sc8 at the value "1". Due to this, all of the switch circuits SWA101, SWA201, SWA301, and SWA401 turn off, therefore the first circuit module set is disconnected from all input/output units. Further, when "i" is an integer from 1 to 8, the switch circuits SWA(100+i), SWA(200i), SWA(300+i), and SWA(400+i) turn off, and the switch circuits SWB(100+i), SWB(200+i), SWB(300+i), and SWA (400+i) turn on. For this reason, four circuit modules belonging to the (i+1)th circuit module set are connected to four input/output units P(100+i), P(200+i), P(300+i), and P(400+i).

[n=9]

In this case, the control unit 60B sets all of the control signals Sc1 to Sc8 at the value "0". Due to this, all of the switch circuits SWB108, SWB208, SWB308, and SWB408 turn off; therefore the fifth circuit module set is disconnected from all input/output units. Further, when "i" is an integer from 1 to 8, the switch circuits SWA(100+i), SWA(200i), SWA(300+i), and SWA(400+i) turn on, and the switch circuits SWB(100+i), SWB(200+i), SWB(300+i), and SWA (400+i) turn off. For this reason, four circuit modules belonging to the i-th circuit module set are connected to four input/output units P(100+i), P(200+i), P(300+i), and P(400+i).

Further, the control unit 60B generates control signals Sc1 to Sc8 in response to a signal input from the signal input unit 80B when the signal stored in the storage unit 70B has the predetermined initial value and generates the control signals Sc1 to Sc8 in response to a signal stored in the storage unit 70B when the signal stored in the storage unit 70B has a value different from the above predetermined initial value. Due to this, in for example the initial state where no signal has been written in the storage unit 70B (case where the inspection of circuit modules is carried out etc.), the control signals Sc1 to Sc8 can be generated in response to a signal input to the signal input unit 80B from the outside of the semiconductor integrated circuit, therefore the connection between input/output units and circuit modules can be freely controlled. Further, after a signal is written in the storage unit 70B, the control signals Sc1 to Sc8 can be generated in response to the written signal, therefore the connection between input/output units and circuit modules can be fixed to a desired state without receiving as input a signal from the outside.

The control unit 60B, for example as shown in FIG. 40, has a decoding unit 601B and OR circuits 602-2 to 602-8.

The decoding unit 601B decodes the signal input from the storage unit 70B or the signal input unit 80B and outputs the decoding result as designation signals Sd1 to Sd8. Namely, when it is indicated in the signal stored in the storage unit 70B or the signal input from the signal input unit 80B so as to disconnect the n-th circuit module set from all input/output units, the decoding unit 601B generates the following designation signals Sd1 to Sd8 in accordance with the value of the integer n. When "n" is an integer from 1 to 8, only the designation signal Sdn is set at the value "1", and the other designation signals are set at the value "0". When "n" is the integer 9, all of the designation signals Sd1 to Sd8 are set at the value "0".

Further, the decoding unit 601B generates designation signals Sd1 to Sd8 in response to a signal input from the signal input unit 80B when the signal stored in the storage unit 70B has the above predetermined initial value and generates designation signals Sd1 to Sd8 in response to the signal stored in the storage unit 70B when the signal stored in the storage unit 70B has a value different from the above predetermined initial value.

Note that, in the example of FIG. 40, the designation signal Sd1 output by the decoding unit 601B is the same as the control signal Sc1 supplied to the circuit module selection units 51 to 54. The OR circuits 602-2 to 602-8 are logical OR operation circuits each having two inputs and one output and cascade connected in this order. The OR circuit 602-2 receives as input the designation signal Sd1 (=control signal Sc1) at one of two inputs and receives as input the designation signal Sd2 at the other input. The output of the OR circuit 602-2 is supplied as the control signal Sc2 to the circuit module selection units 51 to 54. The OR circuit 602-k (k indicates an integer from 3 to 8, same true below in the present embodiment) receives as input the output signal of the OR circuit 602-(k−1) at one of two inputs and receives as input the designation signal Sdk at the other. The output of the OR circuit 602-k is supplied as the control signal Sck to the circuit module selection units 51 to 54.

When the designation signal Sdj (j indicates an integer from 2 to 8, same true below in the present embodiment) of the decoding unit 601B becomes the value "1", the OR circuit 602-j to which this designation signal Sdj is input outputs the control signal Scj having the value "1". When "j" is smaller than 8, control signals Sc(j+1) to Sc8 output from the OR circuits 602-(j+1) to 602-8 after the OR circuit 602-j become the value "1". When the designation signal Sd1 (=control signal Sc1) of the decoding unit 601B becomes the value "1", the OR circuit 602-2 to which this designation signal Sd1 is input outputs the control signal Sc2 having the value "1". The control signals Sc3 to Sc32 output from the OR circuits 602-3 to 602-8 after the OR circuit 602-2 become the value "1". On the other hand, when all designation signals (Sd1 to Sd8) of the decoding unit 601B become the value "0", all of input/output signals of the OR circuits 602-2 to 602-8 become the value "0", therefore control signals (Sc1 to Sc8) supplied to the circuit module selection unit 50 become the value "0".

Accordingly, in the case where the n-th circuit module set is disconnected from all input/output units, when "n" is an integer from 2 to 8, the designation signals Sd1 to Sd (n−1) are set at the value "0" and the designation signal Sdn is set at the value "1" by the decoding unit 601B, therefore the control signals Sc1 to Sc(n−1) become the value "0", and the control signals Scn to Sc8 become the value "1". When "n" is the integer 1, the designation signal Sd1 is set at the value "1" by the decoding unit 601B, therefore all of the control signals Sc1 to Sc8 become the value "1". When "n" is the integer 8, all of the designation signals Sd1 to Sd8 are set at the value "0" by the decoding unit 601B, therefore all of the control signals Sc1 to Sc8 become the value "0".

The storage unit 70B stores a signal designating one circuit module set to be disconnected from all input/output units among nine circuit module sets (the first circuit module set to the ninth circuit module set). Further, the storage unit 70B stores a signal having a predetermined initial value in the initial state where no signal is written. The storage unit 70B can be configured by for example a fuse element or nonvolatile memory.

The signal input unit 80B is a circuit for receiving as input a signal designating one circuit module set to be disconnected from all input/output units and is used for receiving as input a signal to the control unit 60B from an outside device in for example the case of inspecting a semiconductor integrated circuit.

The power supply switch unit 90B controls the supply of power to the circuit module sets (the first circuit module set to the ninth circuit module set) in response to the signal output from the control unit 60B. Namely, it turns off the power source of the circuit module set disconnected from the input/output units.

The power supply switch unit 90B, for example as shown in FIG. 40, has power supply switch circuits PS101 to PS109.

The power supply switch circuit PS(100+i) (i=1, . . . , 8) is inserted in the power supply line of the i-th circuit module set.

It turns on when the designation signal Sdi has the value "0" and turns off when it has the value "1". The power supply switch circuit PS(100+i) has a circuit configuration the same as for example the power supply switch circuit PSi shown in FIG. 35A.

The power supply switch circuit PS109 is inserted in the power supply line of the ninth circuit module set, turns on when the control signal Sc8 has the value "1", and turns off when it has the value "0". The power supply switch circuit PS109 has a circuit configuration the same as for example the power supply switch circuit PS33 shown in FIG. 35B.

A fault repair operation in a semiconductor integrated circuit according to the present embodiment having the above configuration will be explained with reference to FIG. 41 and FIG. 42.

Figure 41:
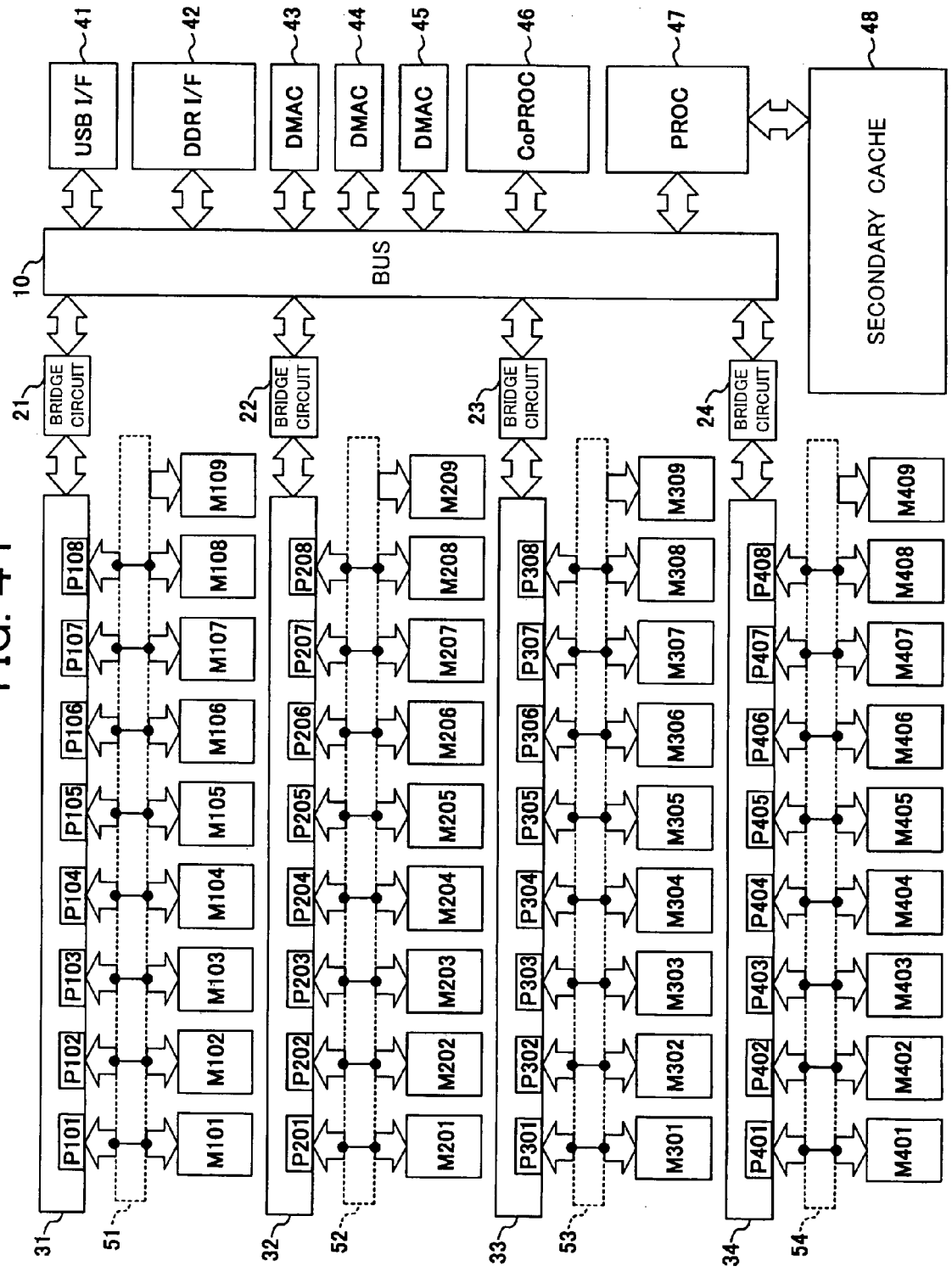
FIG. 41 is a diagram showing the default connection state of the semiconductor integrated circuit shown in FIG. 39.

FIG. 41 shows a default connection state before the inspection for faults. In the example shown in FIG. 41, the input/output units P101 to P108 and circuit modules M101 to M108, the input/output units P201 to P208 and circuit modules M201 to M208, the input/output units P301 to P308 and circuit modules M301 to M308, and the input/output units P401 to P408 and circuit modules M401 to M408 are connected in a one-to-one correspondence. Further, the circuit modules M109, M209, M309, and M409 are disconnected from all input/output units. In other words, the first circuit module set to the eight circuit module set are connected to the input/output units, and the ninth circuit module set becomes redundant.

Figure 42:
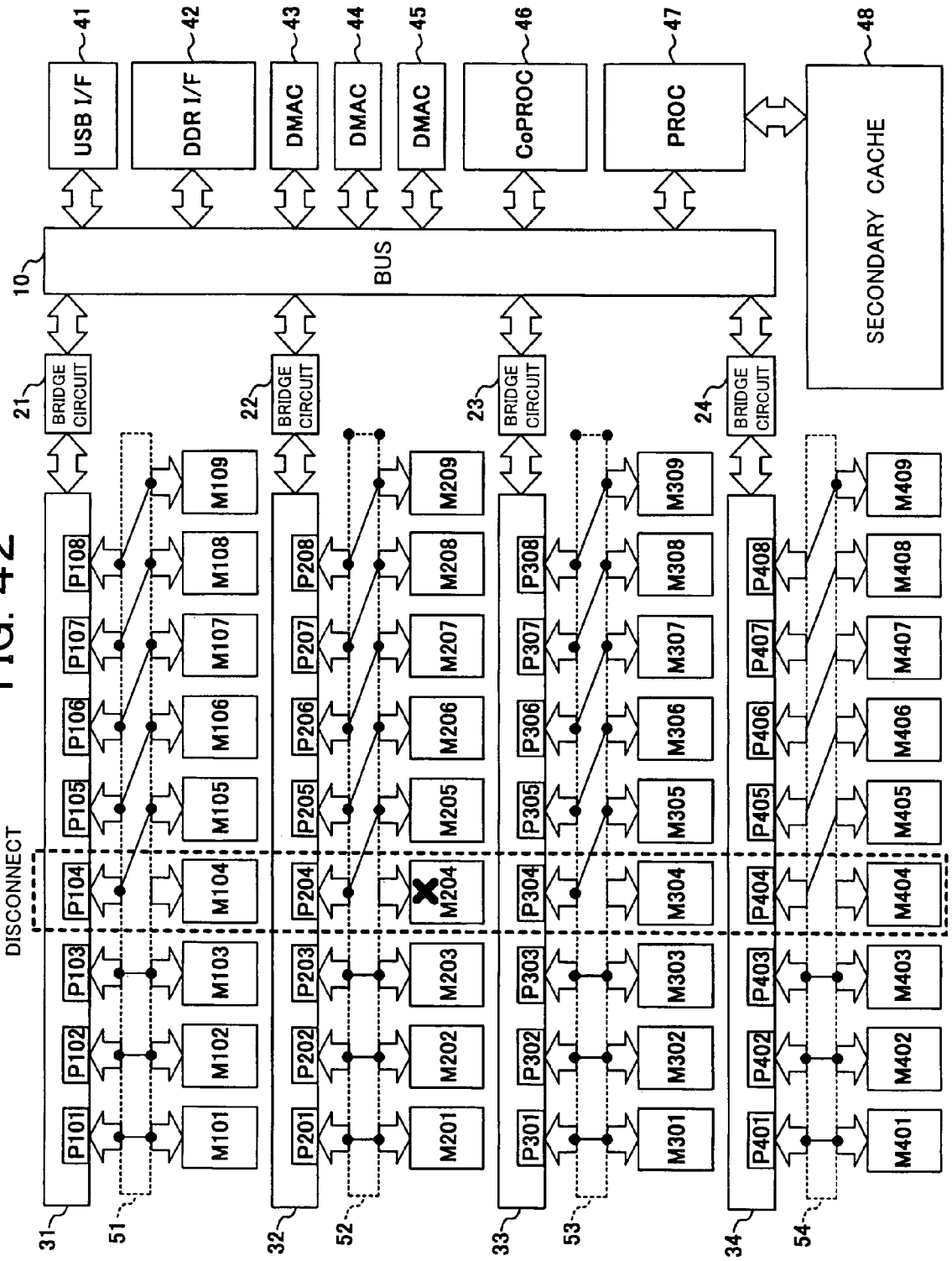
FIG. 42 is a diagram showing the connection state where fault repair is carried out in the semiconductor integrated circuit shown in FIG. 39.

FIG. 42 shows the connection state in the case where the circuit module M204 has a fault. In this case, the fourth circuit module set {M104, M204, M304, M404} including the circuit module M204 is disconnected from the input/output units. Further, the destinations of connection of the input/output units P104, . . . , and P108 are switched to the circuit modules M105, . . . , and M109, the destinations of connection of the input/output units P204, . . . , and P208 are switched to the circuit modules M205, . . . , and M209, the destinations of connection of the input/output units P304, . . . , and P308 are switched to the circuit modules M305, . . . , and M309, and the destinations of connection of the input/output units P404, . . . , and P408 are switched to the circuit modules M405, . . . , and M409. Namely, the connections between the input/output units and circuit module sets wholly shift from the fourth circuit module set including the fault toward the ninth circuit module set unconnected at the time of the default. The rest of the connections is the same as that at the time of the default shown in FIG. 41.

By the semiconductor integrated circuit according to the present embodiment, by the same control signal supplied from the control unit 60B, the connection states of all circuit modules belonging to the same circuit module set are commonly controlled. Due to this, the number of control signals can be greatly decreased in comparison with the case where the connection states with input/output units are independently controlled for individual circuit modules, therefore the circuit configuration of the control unit 60B can be simplified.

Further, the power sources of all circuit modules belonging to the same circuit module set are commonly controlled, therefore the number of the power supply switch circuits can be decreased in comparison with the case where power sources of individual circuit modules are controlled.

Further, when inspecting for faults, the presence of faults may be inspected for each circuit module set, therefore the inspection time can be shortened in comparison with the case of inspecting individual circuit modules.

Further, when information of a faulty circuit module is written into a fuse or other storage element forming the storage unit 70B, the information of the presence of faults may be written for each circuit module set, therefore the amount of information becomes smaller, and the time required for the write processing can be shortened.

14th Embodiment

Next, a 14 embodiment of the present invention will be explained. The present embodiment relates to a method of production of a semiconductor integrated circuit.

Figure 43:
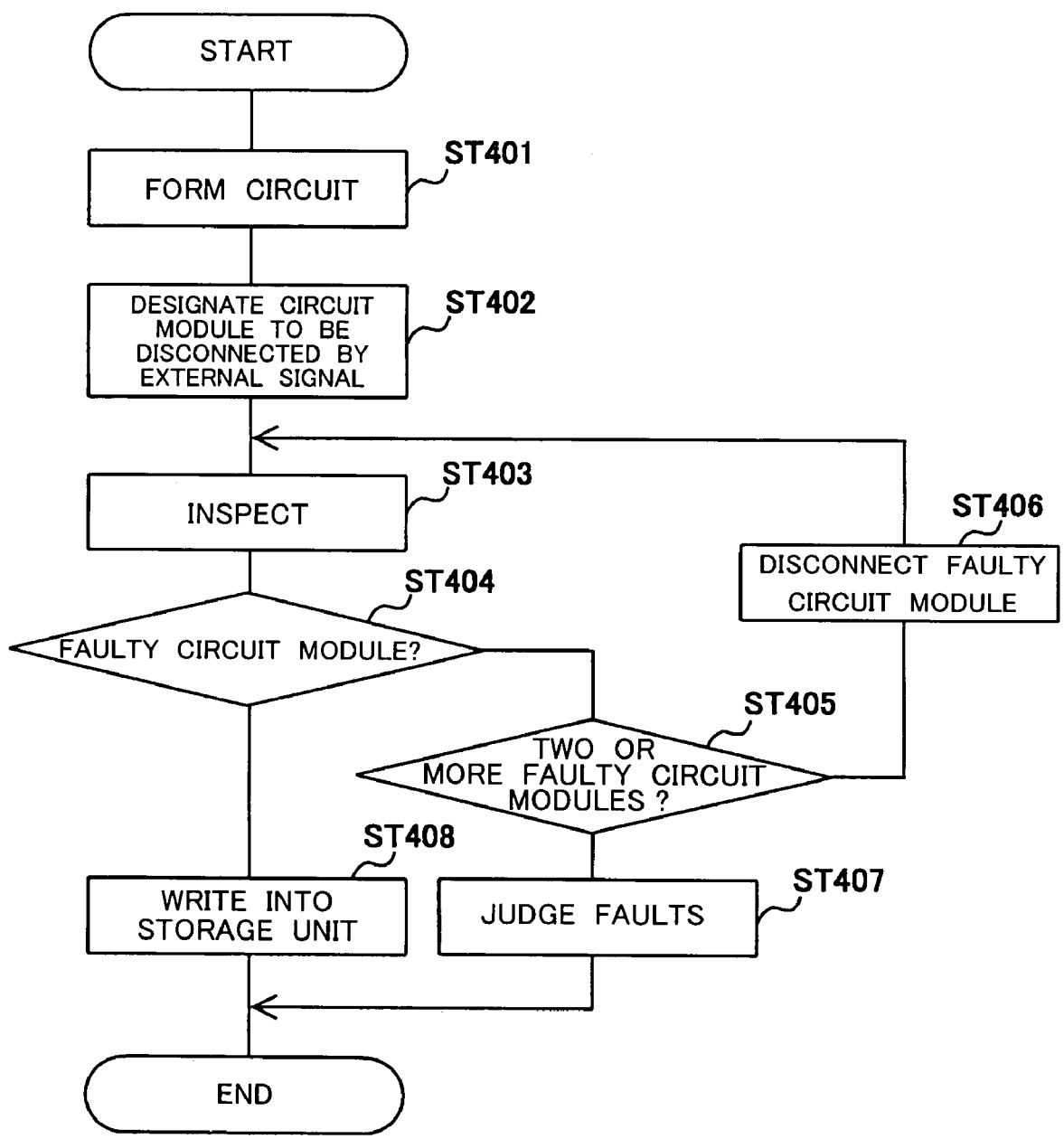
FIG. 43 is a flow chart showing an example of a method of production of the semiconductor integrated circuit shown in FIG. 21.

FIG. 43 is a flow chart showing an example of the method of production of the semiconductor integrated circuit shown in FIG. 21.

Step ST401

A circuit shown in FIG. 21 is formed on a semiconductor substrate.

Step ST402

For example, an outside inspection system generates a signal designating the circuit modules to be disconnected from all input/output units (P1 to p32) and inputs it to the signal input unit 80. The write processing has not yet been carried out for the storage unit 70 formed at step ST401 at this time, therefore a signal having a predetermined initial value is stored. Accordingly, the control unit 60 generates the control signals Sc1 to Sc32 so as to disconnect the circuit modules designated by the signal input to the signal input unit 80 from all input/output units.

Step ST403

By a scan path test or other inspection technique, the operations of the circuit modules connected to the input/output units at present are inspected.

Step ST404

It is judged whether or not the inspection of step ST403 detects a circuit module having a fault.

Steps ST405, ST406, and ST407

When it is judged at step ST404 that a circuit module having a fault is detected and then two or more faulty circuit modules in total including this faulty circuit module are detected, the semiconductor integrated circuit being inspected is judged defective and the processing ends (step ST407). On the other hand, when there is still only one detected faulty circuit module, a signal designating the detected faulty circuit module as the circuit module to be disconnected from all input/output units is supplied to the signal input unit 80 by the inspection system etc. (step ST406), and the inspection of step ST403 is carried out again.

Step ST408

When circuit module having a fault is not detected at step ST404, a signal designating any faulty circuit module to be disconnected from all input/output units is determined in response to the signal input to the signal input unit 80 at this time and written into the storage unit 70. For example, when the storage unit 70 is configured by a fuse, the processing of disconnecting the fuse is carried out. When the signal different from the initial value is written into the storage unit 70, the control unit 60 generates control signals Sc1 to Sc32 in response to the signal stored in this storage unit 70. Due to this, the circuit module judged as faulty in the inspection of step ST403 is disconnected from all input/output units.

An explanation was given above of several embodiments of the present invention, but the present invention is not limited to only the above embodiments and includes various modifications as well for example as will be explained next.

In the semiconductor integrated circuit shown in FIGS. 1A and 1B, the number of circuit modules which can be selectively connected with respect to one input/output unit was made two, but this number may be changed. For example, input/output units selecting and connecting one of two circuit modules and input/output units selecting and connecting one of three circuit modules may be mixed. The configurations of the circuit module selection units in the above embodiments are just examples. The present invention is not limited to them. For example, the number of input/output units provided in the general circuit block is set at R, and the number of circuit modules is set at N. In this case, the circuit module selection unit has at least 2×R switch circuits. Each of these switch circuits is connected between one circuit module and one input/output unit. Each of R number of input/output units is connected via (through-hole) a plurality of switch circuits to a plurality of circuit modules. At least a portion of the N number of circuit modules are connected to a plurality of input/output units via (through-hole) a plurality of switch circuits. One of the plurality of switch circuits connected to the same input/output unit turns on in response to a control signal supplied from the control unit. One of a plurality of switch circuits connected to the same circuit module turns on or turns off or all turn off in response to a control signal supplied from the control unit. By configuring the circuit module selection unit in this way, it is possible to select R number of circuit modules from among N number of circuit modules in response to the control signal and connect these with R number of input/output units in a one-to-one correspondence.

The circuit module selection unit in the present invention may connect the signal input terminal of the circuit module disconnected from all input/output units to an interconnect having a predetermined potential. In the switch elements shown in FIGS. 22, 24, and 26, the output terminals To become the high impedance state at the time of OFF. For this reason, when the circuit module is disconnected from all input/output units, the signal input terminal of that circuit module becomes the high impedance state, and the potential becomes unstable. When power is supplied to the circuit module in this state, the circuit inside the circuit module operates in accordance with the unstable potential of the signal input terminal, therefore wasted power is consumed due to a penetration current or the like. Therefore, if the signal input terminal of the circuit module disconnected from all input/output units is connected to an interconnect having ta predetermined potential as described above, the potential of the signal input terminal can be stabilized, therefore the increase of the power consumption due to the penetration current can be prevented.

Figure 44:
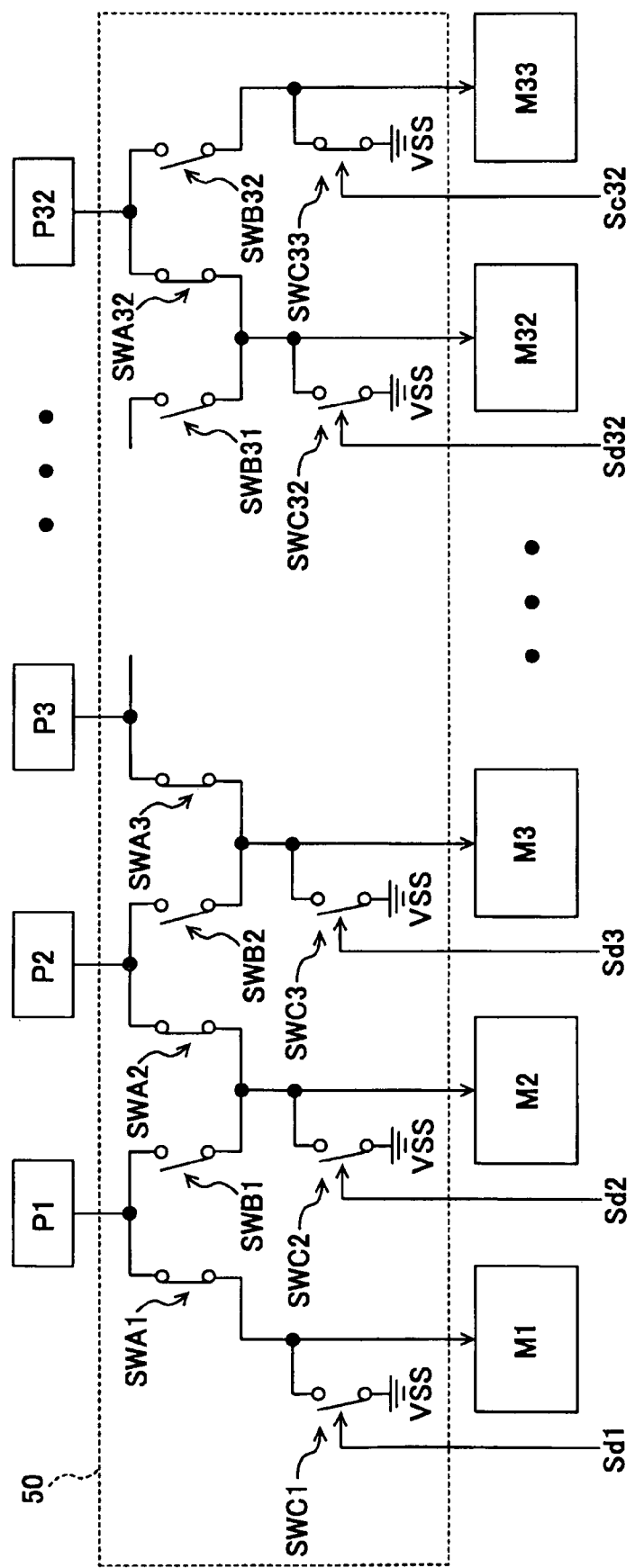
FIG. 44 is a diagram showing an example of the configuration of a circuit module selection unit provided with a switch circuit for connecting a signal input terminal to an interconnect having a predetermined potential.

FIG. 44 is a diagram showing an example of the configuration in a case where switch circuits SWC1 to SWC33 are provided in the circuit module selection unit 50 in the semiconductor integrated circuit shown in FIG. 21. The switch circuits SWC1 to SWC33 are circuits for connecting the signal input terminals of the circuit modules M1 to M33 to the interconnect having the predetermined potential. The switch circuits SWC1 to SWC33 are connected between signal input terminals of the circuit modules M1 to M33 and the ground line VSS. The switch circuit SWCi (i=1, . . . , 32) turns on when the designation signal Sdi has the value "1", that is, where the circuit module Mi is disconnected from all input/output units, and turns off in other cases. The switch circuit SWC33 turns on when the control signal Sc32 is "0", that is when the circuit module M33 is disconnected from all input/output units, and turns off in other cases.

In the semiconductor integrated circuit shown in FIG. 39, the number of circuit modules included in each of eight circuit module sets is made four, but any number made be used in the present invention. Namely, when there are a plurality of circuit module sets, the numbers of circuit modules included in each of them may be different.

All of the semiconductor integrated circuits explained above may be formed on the same semiconductor chip. For example, a system-in-package (SIP) or other technique may be used to form a plurality of semiconductor chips.

In the embodiments explained above, a CMOS type semiconductor integrated circuit was mainly explained as an example, but the present invention is not limited to this. The present invention can be applied to integrated circuits configured by various circuit elements such as bipolar transistors.

The numerical values specifically shown in the above embodiments (number of circuit modules, number of input/output units, number of circuit module blocks, etc.) are just examples and can be appropriately changed.

It is to be understood that the above description is intended to be illustrative and not restrictive. Many embodiments and applications other than the examples provided would be upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

We claim:

1. A semiconductor integrated circuit comprising;
N (N indicates an integer of N≧2) number of circuit modules which can replace each other's functions:
circuit blocks each having R (R indicates an integer of 1≦R<N) number of input/output units for outputting at least one signal to one circuit module and receiving as input at least one signal generated in that one circuit module; and
a circuit module selection unit configured to select R number of circuit modules from among the N number of circuit modules in response to a control signal, connect the selected R number of circuit modules and R number of input/output units of the circuit block in a one-to-one correspondence, and connect one circuit module selected in response to the control signal from at least two circuit modules to each of the R number of input/output units,
wherein
the R number of input/output units include R number of input/output units from a first input/output unit to an R-th input/output unit,
the N number of circuit modules include (R+1) circuit modules from a first circuit module to an (R+1)th circuit module, and
the circuit module selection unit is configured to select one of an i-th circuit module (i indicates an integer of 1≦i≦R) or an (i+1)th circuit module in response to the control signal and connect the selected circuit module to the i-th input/output unit, wherein said circuit module selection unit has
  a first switch group including R number of switch circuits from a first switch circuit to an R-th switch circuit, and
  a second switch group including R number of switch circuits from a first switch circuit to an R-th switch circuit,
  an i-th switch circuit belonging to said first switch group is connected between said i-th input/output unit and said i-th circuit module, and
  an i-th switch circuit belonging to said second switch group is connected between said i-th input/output unit and said i+1)st circuit module,
wherein, when a control signal designating to disconnect an n-th module (n indicating an integer of $1 \leq n \leq (R+1)$) from all of the input/output units is input,
when n is an integer of 2 to R, a first switch circuit to (n−1)st switch circuit belonging to said first switch group turn on and an n-th switch circuit to R-th switch circuit turn off and a first switch circuit to (n−1)st switch circuit belonging to said second switch group turn off and an n-th switch circuit to R-th switch circuit turn on,
when n is the integer 1, all switch circuits belonging to said first switch group turn off and all switch circuits belonging to said second switch group turn on, and
when n is an integer of (R+1), all switch circuits belonging to said first switch group turn on and all switch circuits belonging to said second switch group turn off,
wherein the circuit comprises a control unit for outputting R number of control signals from a first control signal to an R-th control signal,
when disconnecting said n-th circuit module from all input/output unit, said control unit:
  setting a first control signal to (n−1)st control signal to a first value and setting an n-th control signal to an R-th control signal to a second value when n is the integer 2 to R,
  setting a first control signal to R-th control signal all to said second value when n is the integer 1, and
  setting a first control signal to R-th control signal all to said first value when n is an integer of (R+1),
wherein said control unit has:
a plurality of first control lines extending in a first direction,
a plurality of second control lines extending in a second direction different from said first direction, intersecting said plurality of first control lines, and forming R number of intersecting points from a first intersection to an R-th intersection by said intersections,
a first control unit configured to select one intersecting point in response to an input signal from said R number of intersecting points, to activate a first control line and second control line forming said selected intersecting point or deactivate first control lines and second control lines forming said R number of intersecting points in response to said input signal, and
a second control unit configured to set a first control signal to (i−1)st control signal to said first value and set an i-th control signal to R-th control signal to said second value when the first control line and second control line forming said i-th intersecting point are activated and i is an integer of 2 to R and setting a first control signal to R-th control signal all to said second value when is the integer 1 and setting first control signal to R-th control signal all to said first value when the first control lines and second control lines forming said R number of intersecting points are all deactivated.

2. A semiconductor integrated circuit comprising:
  N number of circuit modules, "N" being an integer of N>2;
  R number of input/output units, "R" being an integer of 1;
  a switch element configured to provide a connection in response to a control signal, said connection being between one of the circuit modules and one of the input/output units,
  wherein said one of the circuit modules is connectable to a plurality of the input/output units, said one of the input/output units being connectable to a plurality of the circuit modules;
  wherein a totality of connections between said N number of circuit modules and said R number of input/output units is a connection set, said connection set being determined so that the sum of delays of signal paths connecting said N number of circuit modules and said R number becomes the smallest; and
  wherein said one of the circuit modules is connectable to only two of the input/output units, said one of the input/output units being connectable to only two of the circuit modules.

3. A semiconductor integrated circuit as set forth in claim 2, wherein switch element receives said control signal from a control unit.

4. A semiconductor integrated circuit as set forth in claim 2, wherein said switch element is turned on or off in response to said control signal.

5. A semiconductor integrated circuit as set forth in claim 2, wherein, in response to said control signal, a faulty one of the circuit modules is disconnected from said R number of input/output units.

6. A semiconductor integrated circuit as set forth in claim 2, wherein, in response to said control signal, said switch element selects said one of the circuit modules from among said R number of input/output units.

7. A semiconductor integrated circuit as set forth in claim 2, wherein, in response to said control signal, said switch element selects said one of the input/output units from among said N number of circuit modules.

8. A semiconductor integrated circuit as set forth in claim 2, wherein, in response to said control signal, a circuit module selection unit selects R number of circuit modules from among said N number of circuit modules.

9. A semiconductor integrated circuit as set forth in claim 8, wherein, in response to said control signal, said circuit module selection unit connects said one of the circuit modules to all of input/output units.

10. A semiconductor integrated circuit as set forth in claim 2, wherein another switch element provides another connection between another of the circuit modules and another of the input/output units.

11. A semiconductor integrated circuit as set forth in claim 10, wherein said another of the input/output units exchanges signals only between said another of the circuit modules.

12. A semiconductor integrated circuit as set forth in claim 2, wherein said one of the circuit modules is connected to said plurality of the input/output units.

13. A semiconductor integrated circuit as set forth in claim 2, wherein said one of the input/output units is connected to said plurality of the circuit modules.

14. A semiconductor integrated circuit as set forth in claim 2, wherein said one of the input/output units outputs at least one signal to said one of the circuit modules.

15. A semiconductor integrated circuit as set forth in claim 14, wherein said one of the input/output units receives at least another signal from said one of the circuit modules.

16. A semiconductor integrated circuit as set forth in claim 15, wherein said one of the input/output units simultaneously outputs said at least one signal and receives said at least another signal.

17. A semiconductor integrated circuit as set forth in claim 2, wherein said R number of input/output units transfer signals between of R number of the circuit modules.

18. A semiconductor integrated circuit as set forth in claim 2, wherein each of said R number of input/output units is connectable to a plurality of the circuit modules.

19. A semiconductor integrated circuit as set forth in claim 2, wherein each of said N number of circuit modules is connectable to a plurality of the input/output units.

20. A semiconductor integrated circuit as set forth in claim 2, wherein said N number of circuit modules include at least one of the circuit modules having a first function.

21. A semiconductor integrated circuit as set forth in claim 20, wherein said N number of circuit modules include a second one of the circuit modules having said first function.

22. A semiconductor integrated circuit as set forth in claim 20, wherein said N number of circuit modules include a different one of the circuit modules having a function other than said first function.

23. A semiconductor integrated circuit as set forth in claim 2, wherein said R number of input/output units include a first input/output unit to an R-th input/output unit.

24. A semiconductor integrated circuit as set forth in claim 2, wherein said N number of circuit modules include a first circuit module to an (R+1)th circuit module.

25. A semiconductor integrated circuit as set forth in claim 2, wherein the R number of input/output units are arranged in numerical order at equal intervals, and the i-th circuit module and the (i+1)th circuit module are arranged at positions so that the distances from the i-th input/output unit become equal.

26. A semiconductor integrated circuit as set forth in claim 2, wherein said switch element is incorporated within said one of the circuit modules.

27. A semiconductor integrated circuit as set forth in claim 2, wherein said switch element is incorporated within said one of the input/output units.

* * * * *